(12) United States Patent
Wu et al.

(10) Patent No.: US 10,593,871 B2
(45) Date of Patent: Mar. 17, 2020

(54) ATOMIC LAYER DEPOSITION OF ULTRATHIN TUNNEL BARRIERS

(71) Applicant: University of Kansas, Lawrence, KS (US)

(72) Inventors: Judy Z. Wu, Lawrence, KS (US); Jamie Wilt, Olathe, KS (US); Ryan Goul, Topeka, KS (US); Jagaran Acharya, Lawrence, KS (US)

(73) Assignee: UNIVERSITY OF KANSAS, Lawrence, KS (US)

( * ) Notice: Subject to any disclaimer, the term of this patent is extended or adjusted under 35 U.S.C. 154(b) by 0 days.

(21) Appl. No.: 15/985,979

(22) Filed: May 22, 2018

(65) Prior Publication Data

US 2019/0013463 A1    Jan. 10, 2019

Related U.S. Application Data

(60) Provisional application No. 62/530,555, filed on Jul. 10, 2017.

(51) Int. Cl.
| | |
|---|---|
| *H01L 43/12* | (2006.01) |
| *H01L 43/08* | (2006.01) |
| *H01L 39/22* | (2006.01) |
| *H01L 39/24* | (2006.01) |

(52) U.S. Cl.
CPC ............ *H01L 43/12* (2013.01); *H01L 39/223* (2013.01); *H01L 39/2493* (2013.01); *H01L 43/08* (2013.01)

(58) Field of Classification Search
CPC ... H01L 43/12; H01L 39/223; H01L 39/2493; H01L 43/08

USPC ........ 257/421; 438/767, 706, 627, 612, 167, 438/735

See application file for complete search history.

(56) References Cited

U.S. PATENT DOCUMENTS

| | | |
|---|---|---|
| 4,542,712 A | 9/1985 | Sato et al. |
| 6,183,564 B1 | 2/2001 | Reynolds et al. |
| 6,206,969 B1 | 3/2001 | Takahashi et al. |
| 6,617,173 B1 | 9/2003 | Sneh |
| 6,740,585 B2 | 5/2004 | Yoon et al. |

(Continued)

OTHER PUBLICATIONS

Elliot et al., Integrating atomic layer deposition and ultra-high vacuum physical vapor deposition for in situ fabrication of tunnel junctions, Rev. Sci. Instrum., vol. 85, No. 7, doi: 10.1063/1.4890286, Jul. 2014.

(Continued)

*Primary Examiner* — Bo Fan
(74) *Attorney, Agent, or Firm* — Bell & Manning, LLC

(57) ABSTRACT

Methods for forming tunnel barrier layers are provided, including a method comprising exposing a surface of a material, the surface free of oxygen, to an initial water pulse for a pulse time and at a pulse temperature, the pulse time and pulse temperature selected to maximize hydroxylation of the surface; and exposing the hydroxylated surface to alternating, separated pulses of precursors under conditions to induce reactions between the hydroxylated surface and the precursors to form a tunnel barrier layer on the surface of the material via atomic layer deposition (ALD), the tunnel barrier layer having an average thickness of no more than 1 nm and being formed without an intervening interfacial layer between the tunnel barrier layer and the surface of the material.

18 Claims, 34 Drawing Sheets

(56) References Cited

U.S. PATENT DOCUMENTS

| | | | |
|---|---|---|---|
| 7,618,893 | B2 | 11/2009 | Fu et al. |
| 9,994,956 | B2 | 6/2018 | Wu et al. |
| 2009/0214785 | A1 | 8/2009 | Arena et al. |
| 2011/0308453 | A1 | 12/2011 | Su et al. |
| 2012/0196030 | A1 | 8/2012 | Neal et al. |
| 2013/0196078 | A1 | 8/2013 | Yudovsky et al. |
| 2014/0053779 | A1 | 2/2014 | Martinson et al. |
| 2016/0040288 | A1* | 2/2016 | Wu .................. C23C 16/45544 427/255.28 |

OTHER PUBLICATIONS

Elliot et al., Probing the Nucleation of $Al_2O_3$ in Atomic Layer Deposition on Aluminum for Ultrathin Tunneling Barriers in Josephson Junctions, IEEE Transactions on Applied Superconductivity, vol. 23, No. 3, Feb. 14, 2013.

Lu et al., Fabrication of Nb/$Al_2O_3$/Nb Josephson Junctions Using in situ Magnetron Sputtering and Atomic Layer Deposition, IEEE Trans. Appl. Supercond., vol. 23, No. 3, doi: 10.1109/TASC.2012.2236591, arXiv:1309.4410v1, Jun. 2013.

Wu et al., Atomic Layer Deposition and in Situ Scanning Tunneling Spectroscopy of Ultrathin (0.1-1 nm) Al2O3 Tunnel Barriers for MIMTJs, Presentation, Oct. 6, 2016.

Wilt et al., Tunneling Spectroscopy of Atomically-Thin Al2O3 Films for Tunnel Junctions, Phys. Rev. Applied 7, 064022, Jan. 27, 2017.

Wilt et al., Atomically Thin Al2O3 Films for Tunnel Junctions, Phys. Rev. Applied 7, 064022, Jun. 16, 2017.

Acharya et al., Probing the Dielectric Properties of Ultrathin Al/Al2O3/Al Trilayers Fabricated Using in Situ Sputtering and Atomic Layer Deposition, ACS Appl. Mater. Interfaces, 10, Jan. 2, 2018, pp. 3112-3120.

Wilt et al., Effect of an Interfacial Layer on Electron Tunneling through Atomically Thin Al2O3 Tunnel Barriers, ACS Appl. Mater. Interfaces 9, Oct. 9, 2017, pp. 37468-37475.

\* cited by examiner

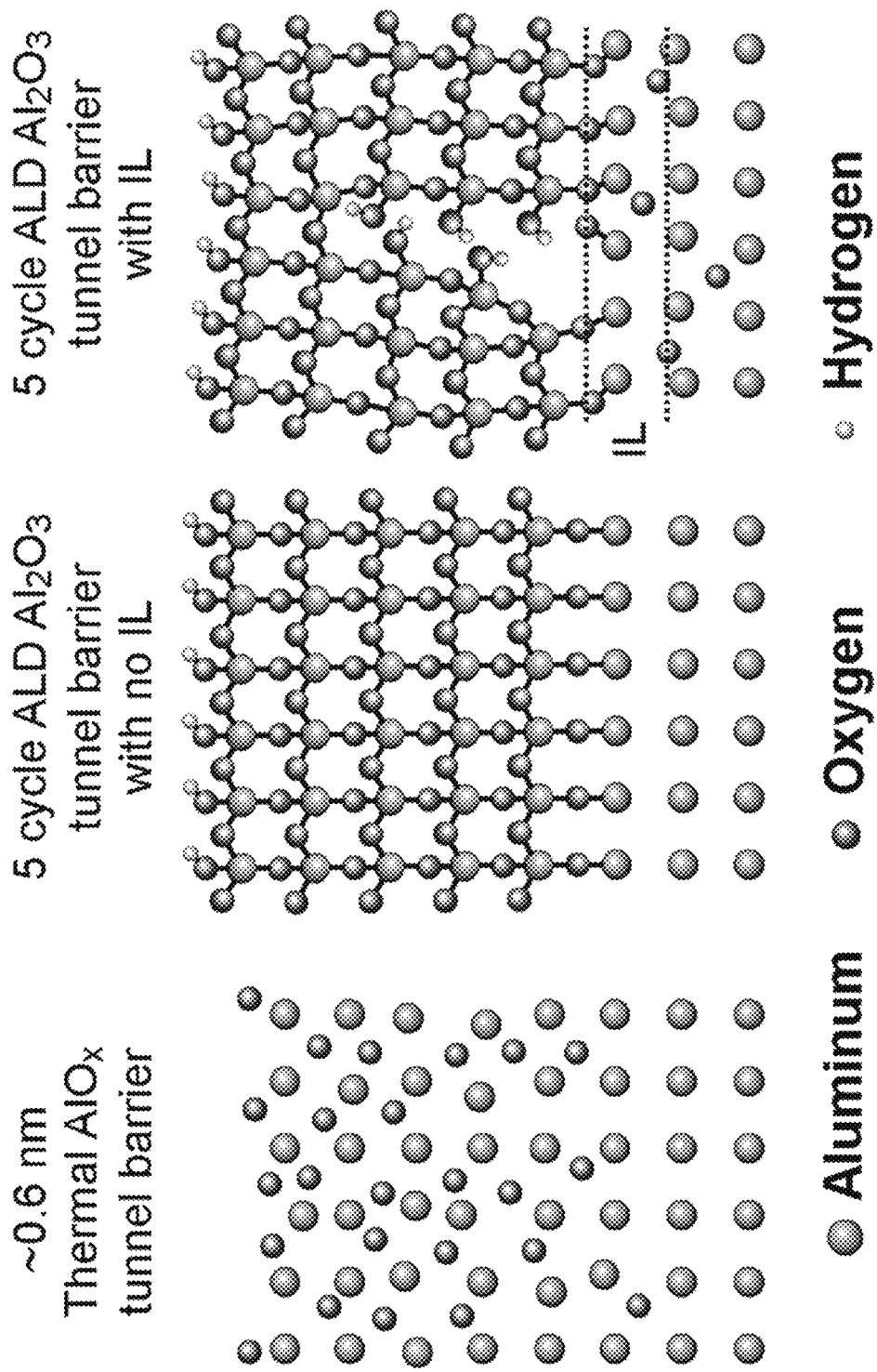

ATOMIC LAYER DEPOSITION OF ULTRATHIN TUNNEL BARRIERS

CROSS-REFERENCE TO RELATED APPLICATIONS

The present application claims priority to U.S. Provisional Patent Application No. 62/530,555 that was filed Jul. 10, 2017, the entire contents of which are hereby incorporated by reference.

REFERENCE TO GOVERNMENT RIGHTS

This invention was made with government support under DMR1337737 and DMR1508494 awarded by the National Science Foundation and under W911NF-16-1-0029 awarded by the Army Research Office. The government has certain rights in the invention.

BACKGROUND

Metal-insulator-metal tunnel junctions (MIMTJs) are fundamental building blocks for microelectronics including magnetic tunnel junctions (MTJs) for spintronics and fast access nonvolatile magnetic memory, and Josephson tunnel junctions (JJs) for particle detectors, magnetic field sensors, and qubits for quantum computation. The performance of MIMTJs depends critically on the quality of the insulating tunnel barrier. (L. A. Abelson et al., *Proceedings of the IEEE*, vol. 92, pp. 1517-1533, 2004.) Considering native oxides can naturally form on the surface of most metals, producing an atomically-thin, uniform, and pinhole-free tunnel barrier represents a major challenge in the research of MIMTJs. In Nb/Al/AlO$_x$/Nb JJs, for example, an ultrathin tunnel barrier is the key to preserve phase coherence across the superconducting Nb electrodes, since the critical current ($I_c$) through the JJ exponentially decays with the barrier thickness. (A. W. Kleinsasser et al., *Applied Superconductivity, IEEE Transactions on*, vol. 5, pp. 26-30, 1995.) Thermal oxidation has been the industry standard to produce AlO$_x$ tunnel barriers for JJs through in situ oxygen diffusion into an Al wetting layer, however this diffusion mediated process has difficulty achieving a uniform tunnel barrier with a well-defined thickness. (B. Seeber, *Handbook of applied superconductivity* vol. 2: CRC press, 1998.) Despite successful commercial applications of these JJs in devices such as superconducting quantum interference devices (SQUIDs) and voltage standards, two-level defects (TLDs) in the AlO$_x$ tunnel barrier are one of the major sources of decoherence in superconducting qubits. (R. McDermott, *Applied Superconductivity, IEEE Transactions on*, vol. 19, pp. 2-13, 2009.)

SUMMARY

Provided are methods for forming tunnel barrier layers as well as multilayer structures comprising the tunnel barrier layers.

In one aspect, methods for forming tunnel barrier layers are provided, including a method comprising exposing a surface of a material, the surface free of oxygen, to an initial water pulse for a pulse time and at a pulse temperature, the pulse time and pulse temperature selected to maximize hydroxylation of the surface; and exposing the hydroxylated surface to alternating, separated pulses of precursors under conditions to induce reactions between the hydroxylated surface and the precursors to form a tunnel barrier layer on the surface of the material via atomic layer deposition (ALD), the tunnel barrier layer having an average thickness of no more than 1 nm and being formed without an intervening interfacial layer between the tunnel barrier layer and the surface of the material.

In another aspect, multilayer structures are provided, including a multilayer structure comprising a tunnel barrier layer formed directly on a surface of a material without an intervening interfacial layer between the tunnel barrier layer and the surface of the material, the tunnel barrier layer composed of an amorphous metal oxide, wherein the tunnel barrier layer has an average thickness of no more than 1 nm.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2B is an illustrative diagram which shows the STM sample mounting scheme. FIG. 2C shows the percentage of the Al surface which had a barrier height consistent with ALD Al$_2$O$_3$ after one ALD Al$_2$O$_3$ cycle (i.e., "ALD coverage %") as a function of the H$_2$O pulse time.

FIG. 3A shows an exemplary constant height dI/dV spectra taken on 1.3 nm thermal AlO$_x$ tunnel barrier (top) and a 10 cycle (1.2 nm) ALD Al$_2$O$_3$ tunnel barrier with 15 min heating (bottom). The arrows depict the tunnel barrier height calculated as the intersection of the fit lines. FIG. 3B shows the average tunnel barrier height (dashed lines) for thermal AlO$_x$ (bottom) and the ALD Al$_2$O$_3$ tunnel barriers (top-15 min and middle-75 min heating) plotted as function of tunnel barrier thickness (top axis) and ALD cycle number (bottom axis).

FIG. 4A shows the I-V characteristics of a 5 ALD cycle 10 μm×10 μm Josephson Junction at T=4.2 K which displays a very low leakage current. The bias current waveform is triangular at 5 Hz and is ramped up linearly from zero to 0.6 mA, then from 0.6 mA to −0.6 mA, and finally from −0.6 mA to zero. The insert depicts the SIS trilayer structure of the JJ with cooper pairs tunneling through the tunnel barrier. FIG. 4B is a plot of the critical current density, $J_c$, as a function of ALD cycle, or equivalently thickness, which follows the expected exponential dependence (the solid line). The insert shows a chip with 12 JJs with areas ranging from 25 µm² to 100 µm² fabricated using photolithography and e-beam lithography. FIG. 4C shows the magnetic field dependence of the average switching current for a similar five-cycle JJ processed from the same batch. The magnetic field and switching current have been normalized to the field at the first minimum (12 Oe) and the switching current at the central maximum (76 µA). FIG. 4D shows the measured switching current distributions (SCD) of a 10-cycle junction at T=0.76 K and 1.17 K. The lines are calculated SCDs based on thermal activation theory.

FIGS. 5A-5F show illustrative diagrams of the internal structures of a thermal $AlO_x$ tunnel barrier which is a few A thick (FIG. 5A), a 1 cycle ALD $Al_2O_3$ tunnel barrier without an interfacial layer (IL) (FIG. 5B), a 1 cycle ALD $Al_2O_3$ tunnel barrier with an IL (FIG. 5C), a thermal $AlO_x$ tunnel barrier which is ~0.6 nm thick (FIG. 5D), a 5 cycle ALD $Al_2O_3$ tunnel barrier which does not have an IL (FIG. 5E), and a 5 cycle ALD $Al_2O_3$ tunnel barrier which does have an IL (FIG. 5F).

FIG. 6A shows the proposed interfacial layer formation mechanisms for ALD $Al_2O_3$ on Al. Thermally adsorbed oxygen ions are shown in (I) at temperature of 80K for after 1.5 ps and adsorbed water molecules are shown in (II) at a temperature of 600K for 1 ps. Both proposed IL formation mechanisms show the inward diffusion of O ions into the Al wetting layer. Also examined was the ideal case of a well-hydroxylated Al surface. FIG. 6B shows how a trimethylaluminum (TMA) molecule, initially setup in (I), will interact with an OH⁻ group on the surface (II), and form an Al—O bond by the release of a H⁺ from the OH⁻ (III).

FIG. 7A shows the measured sample temperature as a function of exposure time in an ALD reaction chamber which has been preheated for 2 hours at the given wattages. The solid lines are fits to the data. FIG. 7B shows a representative dI/dV spectrum and corresponding IV spectrum (insert) for a 1 cycle ALD $Al_2O_3$ film. The barrier height, denoted by the position of the arrow, was determined by the intersection of two linear fits for the band gap and conduction band respectively. FIG. 7C shows the ALD coverage, defined as the fraction of the Al surface with 1 cycle of ALD $Al_2O_3$ which shows tunneling consistent with ALD $Al_2O_3$, as a function of the sample temperature during the pre-ALD hydroxylation pulse just prior to the initiation of ALD. The greyed-out area in FIG. 7C and FIG. 7A shows the ideal temperature window required to have high ALD surface coverage on the Al after only 1 cycle. FIG. 7D shows the measured barrier heights for both 1 cycle and 5 cycle ALD samples as function of heating time. All samples were within the ideal temperature window from FIG. 7C.

FIG. 8D shows the frequency of dielectric breakdown events for each type of breakdown: soft BD, hard BD, and the total number of breakdown events for each tunnel barrier.

FIG. 9B shows the barrier height, calculated from the dI/dV spectra, for these locations. FIG. 9C shows a contour plot generated from the $E_b$ image in order to better visualize the spatial uniformity of $E_b$. FIG. 9D shows a histogram for these $E_b$ values to illustrate the uniformity.

DETAILED DESCRIPTION

Figures 1A, 1B:
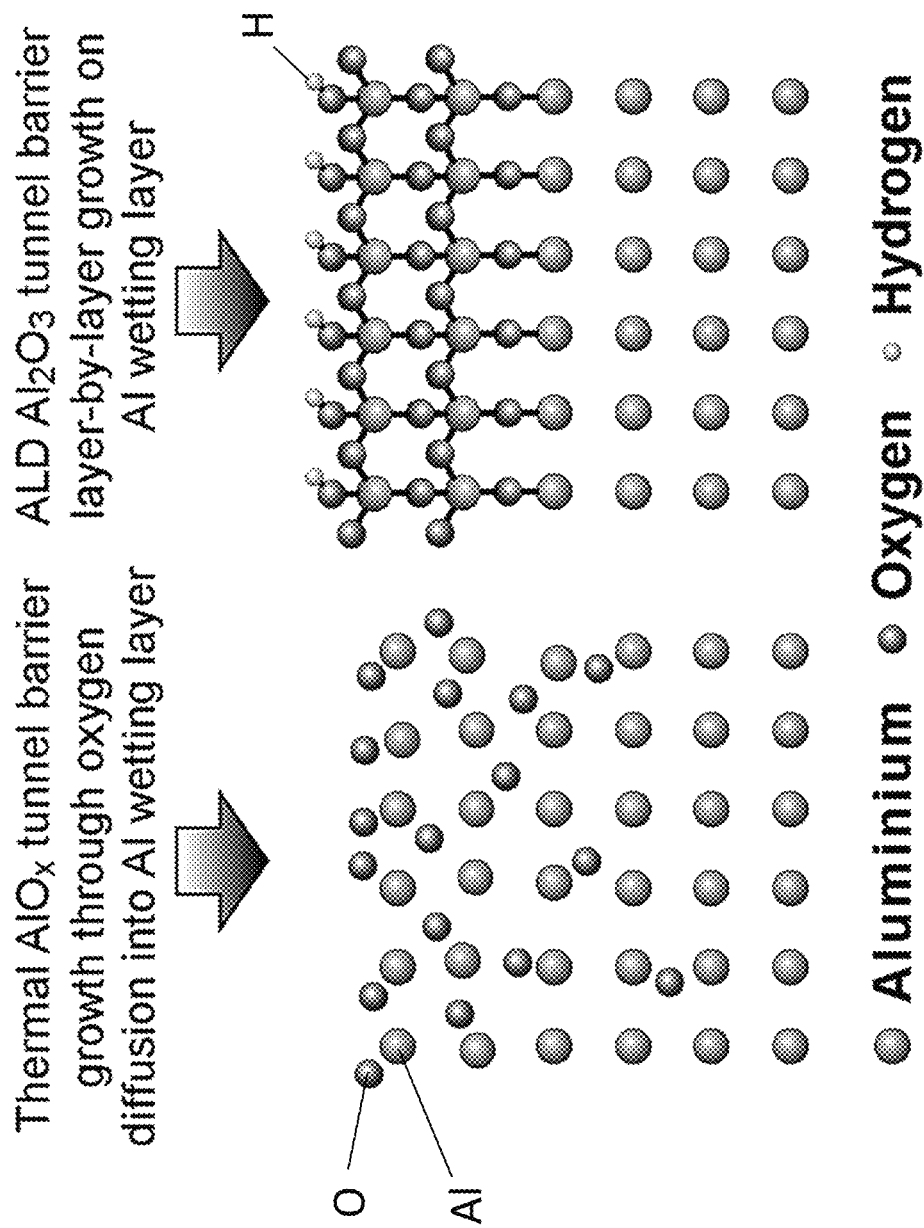
FIGS. 1A-1B are schematic illustrations showing the structural differences seen in a thermal AlO$_x$ tunnel barrier (FIG. 1A), formed through oxygen diffusion into the Al wetting layer, and the atomic layer deposition (ALD) Al$_2$O$_3$ tunnel barrier, formed through layer-by-layer ALD of Al$_2$O$_3$ (FIG. 1B).

Provided are methods for forming tunnel barrier layers as well as multilayer structures comprising the tunnel barrier layers. The methods are based, at least in part, on the inventors' findings regarding how to achieve hydroxylation of a material surface followed by tunnel barrier layer deposition via atomic layer deposition (ALD) while minimizing or preventing formation of an interfacial layer between the tunnel barrier layer and the material surface. The phrase "interfacial layer" refers to the incorporation of oxygen (O) into the material from the surface of that material (i.e., surface-to-bulk incorporation of oxygen). The resulting oxygen-containing surface region of the material is referred to as an interfacial layer (IL). An interfacial layer on aluminum may be referred to herein as an $AlO_x$ interfacial layer and an interfacial layer on iron may be referred to herein as an $FeO_x$ interfacial layer. Neither the thickness nor the stoichiometry of an interfacial layer is well defined. (See FIGS. 1A and 5A.) However, the presence or absence of an interfacial layer may be determined by measuring certain properties of the tunnel barrier layer as described in the Examples, below. These include ALD coverage, $E_b$ and stability of $E_b$ as a function of the thickness of the tunnel barrier layer. At least some embodiments of the methods provide tunnel barrier layers which exhibit superior properties (e.g., tunnel barrier height $E_b$) as compared to those grown via thermal oxidation or those grown via ALD but which are in contact with an underlying an interfacial layer. (Compare FIG. 2A-I with FIG. 2A-III.)

The methods may be carried out on an apparatus based on that described in U.S. Pat. Pub. No. 20160040288, which is hereby incorporated by reference in its entirety. Such an apparatus includes a chamber for ultrahigh vacuum physical vapor deposition (UHV PVD) or high/ultrahigh vacuum chemical vapor phase deposition (HV/UHV CVD) at a base pressure of $10^{-8}$ Torr or lower (e.g., $10^{-8}$ to $10^{-10}$ Torr) and a HV chamber for in situ ALD at a base pressure of $5 \times 10^{-6}$ Torr or lower (e.g., $5 \times 10^{-6}$ to $5 \times 10^{-7}$ Torr). Such an apparatus includes an additional chamber for in situ sample transfer between the two deposition chambers at a base pressure of $10^{-4}$-$10^{-6}$ Torr or lower (e.g., $10^{-6}$ to $10^{-7}$ Torr). The in situ transfer process may be fast, e.g., less than about 2 minutes, less than about 1.5 minutes, or in the range of from about 30 seconds to 1.5 minutes. The ALD chamber in the apparatus may be blackbody heated to a desired temperature (i.e., the chamber walls are heated such that the chamber walls themselves emit sufficient energy to heat the interior of the chamber, and thus, components within the interior, including a substrate upon which the tunnel barrier layer is formed). Blackbody heating may be accomplished via resistive heat tape wrapped around the outer surface of the ALD chamber.

Methods for forming the tunnel barrier layers are provided. In embodiments, the method comprises activating a surface of a material onto which the tunnel barrier layer is to be formed by functionalizing the surface with hydroxyl groups. The material (and its surface) are initially characterized as being free of oxygen (i.e., prior to activation). The oxygen may originate from $O_2$ or other compounds such as $H_2O$. By "free" it is meant that there is no oxygen or the amount of oxygen is so small so as to not to materially affect the properties of the tunnel barrier layer formed on the surface of the material. Prior to activation, scanning tunneling spectroscopy (STS) may be used (in situ) to confirm that the surface of the material is bare, i.e., is free of oxygen (e.g., from dI/dV spectra). (See FIG. 2A-II, insert.)

Next, the method comprises exposing the activated surface (i.e., hydroxylated surface) to alternating, separated pulses of precursors (e.g., an organometallic precursor pulse followed by a water precursor pulse) under conditions sufficient to induce reactions between the hydroxylated surface and precursors, thereby providing the tunnel barrier layer via ALD on the surface of the material. The activation and the tunnel barrier layer deposition steps may be carried out in the ALD chamber of the apparatus described above.

In embodiments, the material which is to be hydroxylated and on which the tunnel barrier layer is to be formed is a wetting layer. Various materials may be used for the wetting layer, depending upon the application. In embodiments, the wetting layer is composed of a metal (or a metal alloy), e.g., aluminum (Al), magnesium (Mg), hafnium (Hf), iron (Fe). The wetting layer may be characterized by its thickness, i.e., an average value measured at a representative number of locations across the surface. In embodiments, the average thickness is at least 5 nm, at least 6 nm, or at least 7 nm. In embodiments, the average thickness is in a range of from 0.5 nm to 7 nm. Because embodiments of the present methods are actually able to minimize or prevent the formation of interfacial layers, thicker wetting layers may be used as compared to some conventional approaches in which the thickness of the wetting layer had been minimized (although not eliminated) in order to reduce the effect of an interfacial layer. The wetting layer may be formed in the UV PVD or UV CVD chamber in the apparatus described above. The wetting layer may be formed on a variety of other material layers, depending upon the application and desired multilayered structure (e.g., desired metal-insulator-metal structure). Other material layers include other metals and their alloys, e.g., niobium (Nb), iridium (Ir), cobalt (Co). A specific illustrative alloy is FeCo. Semiconductors, e.g., Si, may also be used.

In embodiments, no wetting layer is used and the material which is to be hydroxylated and on which the tunnel barrier layer is to be formed is determined by the desired multilayer structure (e.g., to form a metal insulator metal tunnel junction (MIMTJ), a magnetic tunnel junction (MTJ), etc.). By way of illustration, if the desired multilayer structure is a MTJ, the material may be a ferromagnetic material, e.g., iron (Fe), cobalt (Co), nickel (Ni), or an alloy thereof. These embodiments are related to the unexpected finding that the present methods can achieve extremely thin tunnel barrier layers having high $E_b$ even without the use of a wetting layer (see Example 3).

In the present methods, activation of the surface of the material (e.g., wetting layer or ferromagnetic material) is activated using a water pulse to functionalize the surface with hydroxyl groups. It has been found that certain conditions under which the surface of the material is exposed to the water pulse affect the extent of, and uniformity of, the hydroxylation on the surface. That is, it is not enough to simply make use of an initial water pulse. Instead, the water pulse conditions are desirably selected to provide an optimal amount (e.g., surface density) of adsorbed water on the surface in order to achieve optimal hydroxylation, e.g., to maximize the number of hydroxyl groups to completely cover the surface, including with a monolayer of the hydroxyl groups. Complete coverage is useful to achieve a pinhole free, atomically thin tunnel barrier. The amount of adsorbed water is desirably sufficiently high to achieve proton transfer between pairs of adsorbed water molecules in order to dissociate the water into $OH^-$ and $H^+$ groups. However, the amount of adsorbed water is desirably not so high (e.g., greater than a monolayer of water) to lead to the formation of water clusters. The water pulse conditions include the pulse time (the length of time the surface is exposed to the water pulse). In embodiments, the pulse time is less than 3 seconds, in the range of 1 to 3 seconds, or about 2 seconds.

The water pulse conditions also include the pulse temperature (the temperature of the surface during exposure to the water pulse), which is also selected to achieve optimal hydroxylation, e.g., to maximize the number of hydroxyl groups on the surface. The temperature is desirably sufficiently high to facilitate water dissociation, but not so high as to lead to the dissociation of $OH^-$ groups to $O^-$ and $H^+$ groups. Hydroxyl group dissociation can result in diffusion of oxygen into the material, effectively creating an interfacial layer which degrades the properties of the tunnel barrier layer. In embodiments, the pulse temperature is in the range of from about 150° C. to about 190° C. In embodiments, the pulse temperature is in the range of from about 125° C. to about 215° C., from about 120° C. to about 210° C. or from about 130° C. to about 220° C.

Confirmation of optimal water pulse conditions which achieve the desired result may be carried out using STS as described in the Examples below, including by achieving a maximum $E_b$ for the tunnel barrier layer. More specifically, optimal water pulse conditions may be those which provide a desired ALD coverage defined as the percent of STS spectra showing a tunnel barrier layer having a $E_b > 1$ eV (barrier heights <1 eV are associated with thermal $AlO_x$, which generally has a $E_b$ of about 0.6 eV to 1 eV). The percent of STS spectra refers to the percentage of a total number of collected STS spectra (e.g., 100) taken from random locations across the surface of the tunnel barrier layer. (See Examples, below.) In embodiments, the optimal water pulse conditions are those which provide an ALD coverage of at least 85%, at least 90%, at least 92%, or at least 94%. (See FIG. 2C.) The ALD coverage may be determined after a predetermined number of ALD cycles, e.g., 1 cycle.

As noted above, in the second, tunnel barrier layer deposition step, the activated (hydroxylated) surface is exposed to alternating, separated pulses of precursors to induce reactions between the hydroxylated surface and the precursors, thereby forming the tunnel barrier layer via atomic layer deposition (ALD) on the activated surface. The choice of precursors determines the composition of the tunnel barrier layer. However, the tunnel barrier layer is composed of a dielectric material. Suitable dielectric materials include metal oxides such as $Al_2O_3$, MgO, and $HfO_2$. In this step, precursors (e.g., $H_2O$ and trimethylaluminum for $Al_2O_3$ deposition) and conditions (pulse time, pulse temperature, use of purge pulses, etc.) may be adjusted as known in the art. The number of pulse pairs, or ALD cycles, may be adjusted to provide a desired thickness for the tunnel barrier layer. In embodiments, the average thickness of the tunnel barrier layer is no more than 1.5 nm, no more than 1.3 nm, no more than 1.2 nm, no more than 0.7 nm, no more than 0.4 nm, or no more than 0.2 nm. The term "average" here as the same meaning as described above with respect to the thickness of the wetting layer. This includes embodiments in which the average thickness of the tunnel barrier layer is in the range of from 0.1 nm to 1.5 nm or from 0.2 nm to 1.2 nm. The thickness of the tunnel barrier layer may be reported as the thickness provided by the selected number of ALD cycles, e.g., 1 ALD cycle, 5 ALD cycles, etc.

It has been further found that other certain conditions of the method further enable the formation of high quality tunnel barrier layers on the surface of the material without leading to the formation of an intervening interfacial layer. One such condition involves the use of a preheated ALD chamber. In particular, the ALD chamber used to carry out the activation and tunnel barrier layer deposition steps may be preheated prior to introducing the material into the ALD chamber. The preheated temperature depends upon the dielectric material to be used to form the tunnel barrier layer. The preheated temperature is generally greater than the selected pulse temperature (described above). In embodiments the preheated temperature is at least about 250° C., at least about 260° C., or at least about 265° C.

Another such condition involves the use of dynamic heating of the material surface prior to activation and tunnel barrier layer deposition. By "dynamic heating" it is meant that the temperature of the material surface is changing (i.e., increasing) rather than constant during the step in which dynamic heating is used. In particular, after introducing the material to the preheated ALD chamber, the material may be heated at a selected heating rate for a selected time to the selected pulse temperature (described above) prior to initiating activation and tunnel barrier layer deposition. As described above, the selected pulse temperature may be in the range of from about 150° C. to about 190° C. The selected time is generally quite fast, in order to minimize or prevent incorporation of oxygen into the material. In embodiments, the selected time is about 30 minutes or less, about 20 minutes or less, about 15 minutes or less, or in the range of from about 10 to about 30 minutes. The selected heating rate depends upon the initial temperature of the material as well as the selected chamber vacuum, the selected pulse temperature and the selected time. Confirmation of optimal dynamic heating conditions may be achieved as described above with respect to the optimal water pulse conditions. (See FIGS. 7A, 7C, and 7D.) The Examples below, illustrate the significant effect of dynamic heating on the properties (e.g., $E_b$) of the resulting tunnel barrier layer.

After dynamic heating to the selected pulse temperature, activation and tunnel barrier layer deposition are carried out as described above. Dynamic heating may be used during activation and tunnel barrier layer deposition as well. However, although the heating rate is generally quite fast, hydroxylation and the rate of formation of the tunnel barrier layer via ALD are much faster, e.g., 10 times as fast.

After tunnel barrier layer deposition, the method may include additional steps, e.g., formation of another material layer on the tunnel barrier layer, depending upon the application. For example, a layer of metal may be formed to provide a metal-insulator-metal multilayer structure or a layer of semiconductor (e.g., Si) may be formed to provide a semiconductor-insulation-semiconductor multilayer structure.

The resulting tunnel barrier layer may be characterized by certain properties, including any of the properties described in the Examples below. By way of illustration, the tunnel barrier layer may be characterized by its tunnel barrier height, $E_b$. The tunnel barrier height may be measured using STS and determined from dI/dV spectra as described in the Examples below. In embodiments, the tunnel barrier layer is an $Al_2O_3$ tunnel barrier layer having an $E_b$ of at least 1.2 eV, a least 1.3 eV, at least 1.4 eV, at least 1.5 eV, or at least 1.6 eV. This $E_b$ may be an average $E_b$ as determined from a representative number of locations across the tunnel barrier layer. (See FIG. 9D.) In embodiments, the tunnel barrier layer is characterized as having an $E_b$ which is the same over an average thickness range, e.g., 0.12 to 1.2 nm. (See FIG. 3B.) By "same," it is meant that the $E_b$ values are within ±15%, ±10%, ±5%, ±1%, or less, of each other, for tunnel barrier layers having average thicknesses which may be different but are within the average thickness range.

The tunnel barrier layer may be characterized by its band gap, which may be measured using STS as described in the Example below. In embodiments, the tunnel barrier layer has a band gap which is the same as the bulk band gap. By "bulk band gap" is meant the band gap value for the material of the tunnel barrier layer in its bulk, single-crystalline form. By "same," it is meant that the values are within ±15%, ±10%, ±5%, ±1%, or less, of each other. In embodiments, the tunnel barrier layer is an $Al_2O_3$ tunnel barrier layer having a band gap of about 2.5 eV.

The tunnel barrier layer may be characterized by its lack of crystalline structure, i.e., by being amorphous. This is by contrast to epitaxial layers, having a well-defined crystal structure and crystal orientation relative to the surface on which it is grown.

Devices comprising the tunnel barrier layer and the multilayer structures are also provided. An illustrative device is a Josephson Junction device. (See, e.g., FIG. 4B.) Another illustrative device is a magnetic tunnel junction device.

EXAMPLES

Example 1

Introduction

This Example uses Atomic Layer Deposition (ALD) for the synthesis of atomically-thin tunnel barriers for high performance MIMTJs. ALD is a chemical vapor process that utilizes self-limited surface reactions to grow films one atomic layer at a time [6, 7]. The ALD $Al_2O_3$ process is illustrated in FIG. 1B. Specifically, ALD $Al_2O_3$ consists of a series of alternating precursor pulses of $H_2O$ and trimethylaluminum (TMA) which react at the sample's surface. As explained in this Example, an ALD-based method has been developed which results in a fully oxidized, uniform and pinhole-free $Al_2O_3$ film with atomic-scale thickness control. In addition, its reduced bulk loss tangent shows that JJs with ALD $Al_2O_3$ tunnel barriers have a significantly reduced TLD density [8]. The conventional industry standard, in which an $AlO_x$ tunnel barrier is formed through oxygen diffusion into an Al wetting layer is shown in FIG. 1A. As shown from the schematic, the aluminum is not fully oxidized as oxygen diffuses into the metal from its surface. This means the thickness of the thermal $AlO_x$ tunnel barrier and its interface with the electrode are not well defined. Furthermore, the oxygen concentration in the $AlO_x$ tunnel barrier (and thus, stoichiometry) is not uniform across the barrier thickness, resulting in variable defect (such as oxygen vacancies) concentration and thickness-dependent tunnel barrier height $E_b$ of reduced values.

Precise ALD growth and nucleation on metals is challenging, e.g., due to the issue of native oxide growth. For example, ALD nucleation on inert metal surfaces, such as Pt and Au, can be completely frustrated for the first 30-50 cycles of alternating precursor pulses whereas for reactive metals, such as Al, even in situ deposited films can acquire an interfacial layer (IL) of $AlO_x$ up to ~2 nm thick [9-11]. In a previous work, Lu et al fabricated Nb/Al/$Al_2O_3$/Nb JJs using in situ ALD of $Al_2O_3$. It has been determined that the presence of an IL>0.5 nm in thickness could be at least partially attributed to the vacuum pressure (~500 mTorr) during sample transfer and pre-ALD heating [11-13]. This IL prevented the realization of truly atomically-thin tunnel barriers and led to poor quality JJs. By contrast, in this Example, these challenges are addressed in part by performing the transfer and pre-ALD heating under high-vacuum (HV). This Example reports the successful fabrication of atomically-thin ALD $Al_2O_3$ tunnel barriers. In situ scanning tunneling spectroscopy (STS) was employed to probe the growth mechanisms and physical properties of the ALD $Al_2O_3$ tunnel barriers and JJs were fabricated to illustrate the viability of ALD $Al_2O_3$ tunnel barriers for MIMTJs.

Experimental

For samples which underwent in situ STS characterization, a bilayer of Nb (20 nm)/Al (7 nm) was magnetron sputtered onto a Si/Au (50 nm) substrate which was mechanically clamped to a sample stage to serve as the ground contact for the Scanning Tunneling Microscope (RHK). The Au was thermally evaporated onto an updoped Si wafer with a native oxide. An ex situ Atomic force microscope measured its surface roughness to be ~1.2 nm. Immediately following the Al sputtering, an aluminum oxide tunnel barrier was formed by either thermal oxidation or ALD. For the thermal oxidation samples, UHP $O_2$ (99.993%) was introduced to the sputtering chamber for an oxygen exposure of 1150, 1020, and 42 torr-seconds, respectively. The samples with ALD tunnel barriers were transferred to a preheated ALD chamber and then heated for 15 min or 75 min to a temperature of 200° C.-220° C. Following sample heating, reagents $H_2O$ and trimethylaluminium (TMA) were pulsed into the ALD chamber for 1-3 s with a purge step (35 s of $N_2$) between pulses to deposit the ALD $Al_2O_3$ tunnel barriers.

After tunnel barrier fabrication, the samples were transferred under high vacuum (HV), in situ, to the STM chamber which had a pressure of ~$2 \times 10^{-10}$ Torr. A single mechanically-cleaved Pt—Ir STM tip was used for all STM studies. Constant height IV and dI/dV spectroscopy were taken simultaneously using the lock-in amplifier method with a voltage modulation of 100 mV at 1 kHz. The tunnel barrier height was determined by the intersection of two bisquare-method linear fits to ln(dI/dV). (See M. M. Ugeda, et al., Giant bandgap renormalization and excitonic effects in a monolayer transition metal dichalcogenide semiconductor, Nat. Mater. 13, 1091 (2014).) The endpoints for this linear fit were determined by eye. One line fit the band gap regime, and the other the conduction band. This ln(dI/dV) linear-fit method is chosen over I-V or (dI/dV)/(IN) fit methods for its insensitivity to high noise in STS spectra. (See R. M. Feenstra, et al., Low-temperature tunneling spectroscopy of Ge (111)c (2×8) surfaces, Phys. Rev. B 71, 125316 (2005) and L. Dorneles, et al., The use of Simmons' equation to quantify the insulating barrier parameters in Al=AlOx=Al tunnel junctions, Appl. Phys. 500 Lett. 82, 2832 (2003).) Approximately 40-80 dI/dV spectra are taken on each sample >100 nm apart from one another in order to get reasonable statistics on the sample's surface.

The ab initio molecular dynamics simulations for the initial water activation pulse used a 2×2 supercell of FCC Al (111) surface under constant equilibrium volume and temperature and adopted Bohn-Oppenheimer molecular dynamics as implemented in VASP [14-16]. The canonical ensemble simulations employed the London dispersion correction using the van der Waals density functional of Langreth and Lundqvist [17] with a high plane wave energy cut-off of 450 eV to ensure high precision. The electronic and ionic convergence criteria used were $10^{-4}$ eV and $10^{-3}$ eV respectively. Energy barrier and reaction pathways are investigated using the climbing-image-nudge elastic-band method (D. Sheppard, et al., Optimization methods for finding minimum energy paths, J. Chem. Phys. 128, 134106 (2008)) as implemented in the QUANTUM ESPRESSO code (G. Paolo, et al., QUANTUM ESPRESSO: A modular and open-source software project for quantum simulations of materials, J. Phys. Condens. Matter 21, 395502 (2009)).

Nb—Al/ALD-$Al_2O_3$/Nb trilayers were fabricated in a homemade deposition system, which integrated UHV sputtering and ALD in situ [12, 18]. For comparison, traditional thermally oxidized Nb—Al/AlOx/Nb trilayers were also fabricated. The Nb films were sputtered at 1.7 nm/s to minimize the formation of $NbO_x$ from trace oxygen. The sputtering chamber had a base pressure of ~$10^{-7}$ Torr or better and the sample stage was chilled-water cooled to approximately 10° C. The bottom Nb was 150 nm, and the top Nb was 50 nm. Samples with ALD tunnel barriers were transferred in situ to the preheated ALD chamber and heated for 75 min under HV. The wafer design used to investigate the quality of tunnel barriers contains 12 square junctions of four different sizes ranging from 4 μm×4 μm to 10 μm×10 μm and was fabricated using the self-aligned niobium trilayer process described in W. Chen, et al., Fabrication of high-quality Josephson junctions for quantum computation using a self-aligned process, Microelectron. Eng. 73, 767 (2004). The JJ dc current-voltage characteristics (IVC) were measured at 4.2K in a liquid helium storage dewar.

Results and Discussion

In Situ Scanning Tunneling Spectroscopy and Molecular Dynamics Simulations

ALD is a low-vacuum process that is incompatible with UHV required for both physical vapor deposition of functional electrodes and in situ characterization using STM. To address this issue, an integrated Sputtering-ALD-STM system was used to allow for UHV deposition of metals, UHV STM characterization of surfaces and interfaces, and HV ($10^{-6}$-$10^{-7}$ Torr) in situ sample transportation between the chambers [18]. This HV transport reduces the metal electrode's exposure to trace gases and hence IL formation. This Example further avoids IL formation by addressing the temperature difference between sputtering at 10-14° C. and ALD at 200° C.-220° C. In particular, the samples were inserted into a preheated ALD chamber for different times and dynamically heated to 200° C.-220° C. under HV. Two dynamic heating times of 75 min and 15 min are described here to illustrate the importance of controlling this procedure in order to achieve a clean interface between the Al and ALD $Al_2O_3$ tunnel barrier.

Figure 2A:
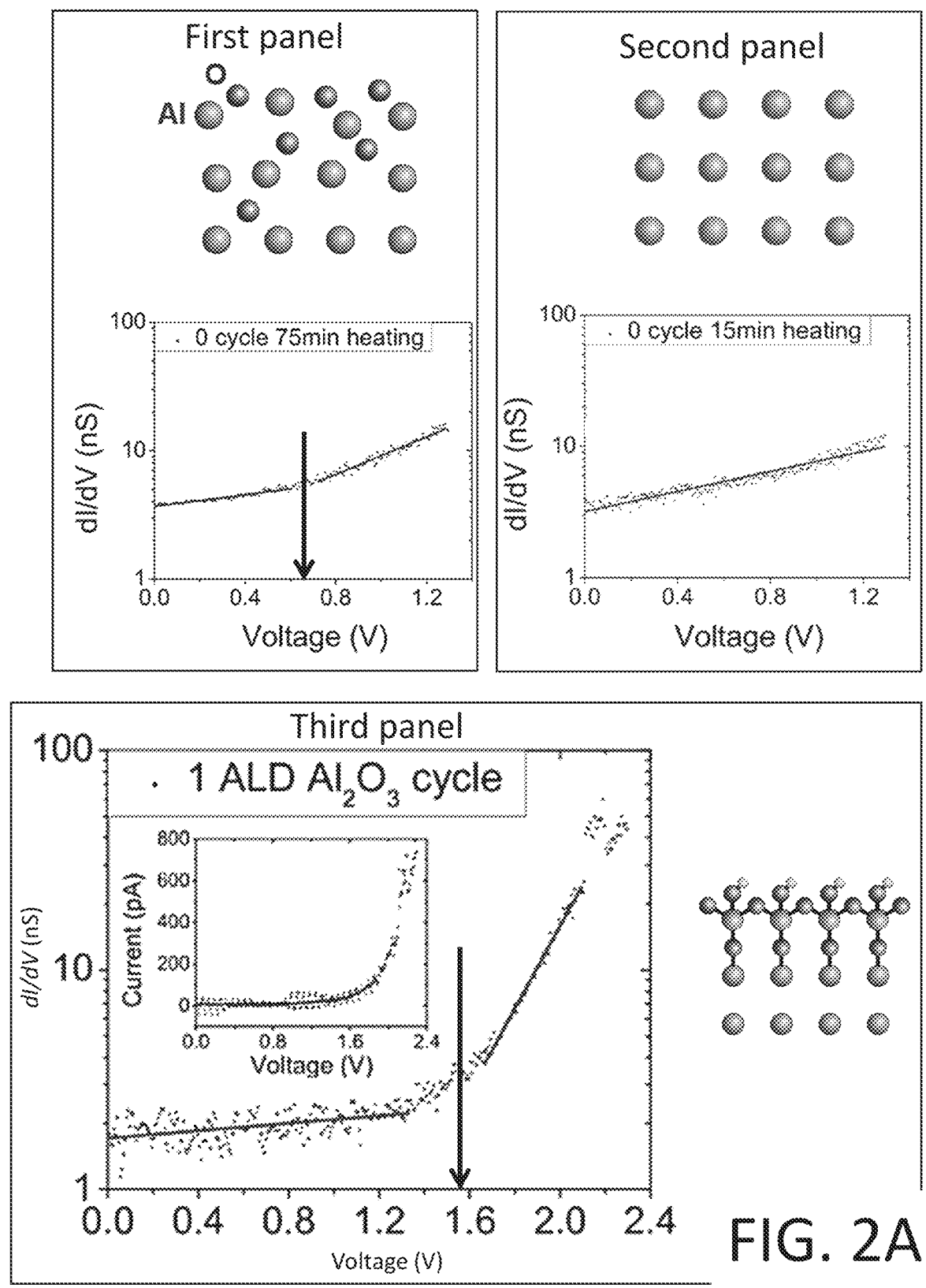
FIGS. 2A-2C show the results of the scanning tunneling spectroscopy (STS) study of the ALD Al$_2$O$_3$ growth on an Al wetting layer from the pre-ALD sample heating to the 1$^{st}$ ALD Al$_2$O$_3$ cycle (0.12 nm/cycle). The first panel of FIG. 2A shows a dI/dV spectrum for an Al sample after 75 min heating in the ALD chamber; the second panel of FIG. 2A shows a dI/dV spectrum after 15 min of heating; and the third panel of FIG. 2A shows a dI/dV spectrum after one ALD Al$_2$O$_3$ cycle. The arrow depicts the tunnel barrier height, calculated as the intersection of the fit lines. The diagrams at the top of each panel illustrate the surface as seen by the STM tip. A dI/dV spectrum (not shown) of a sample directly transferred to the SPM chamber after Al sputtering was similar to the spectrum of the second panel of FIG. 2A.
Figure 2B:
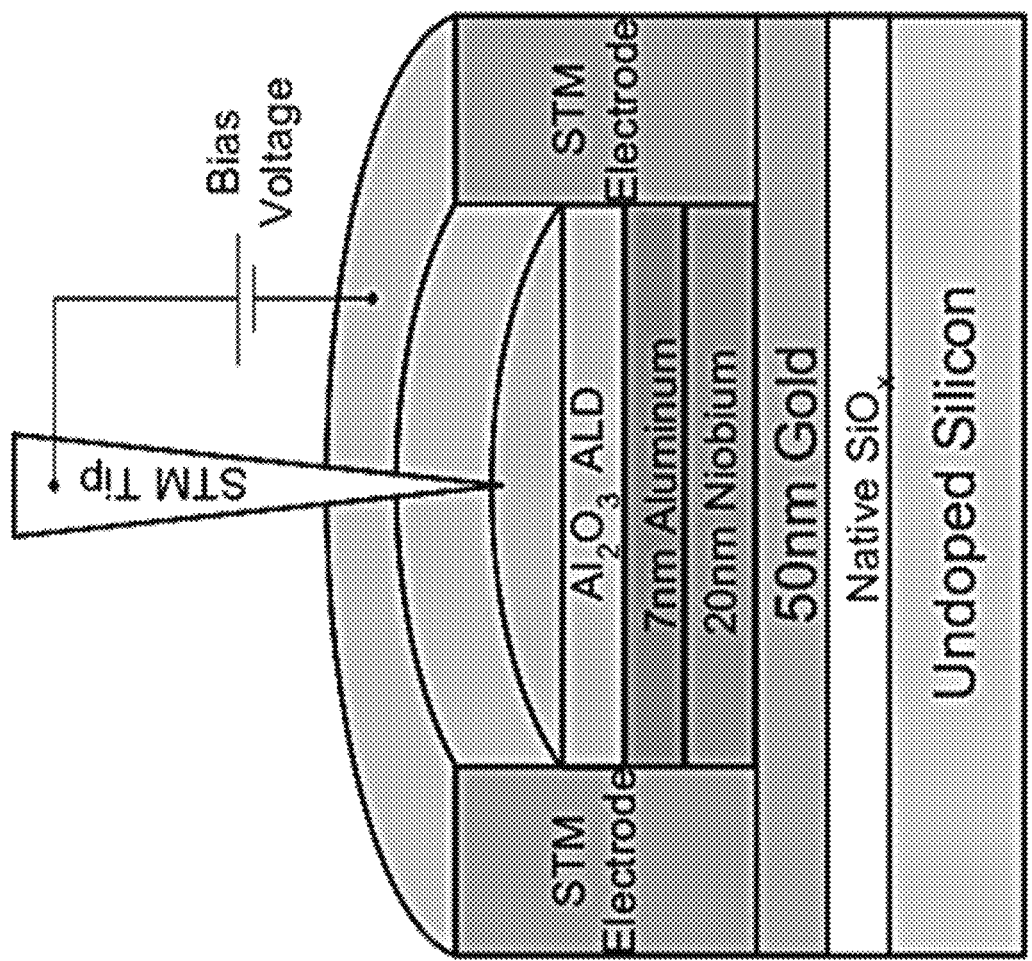
Figure 3A:
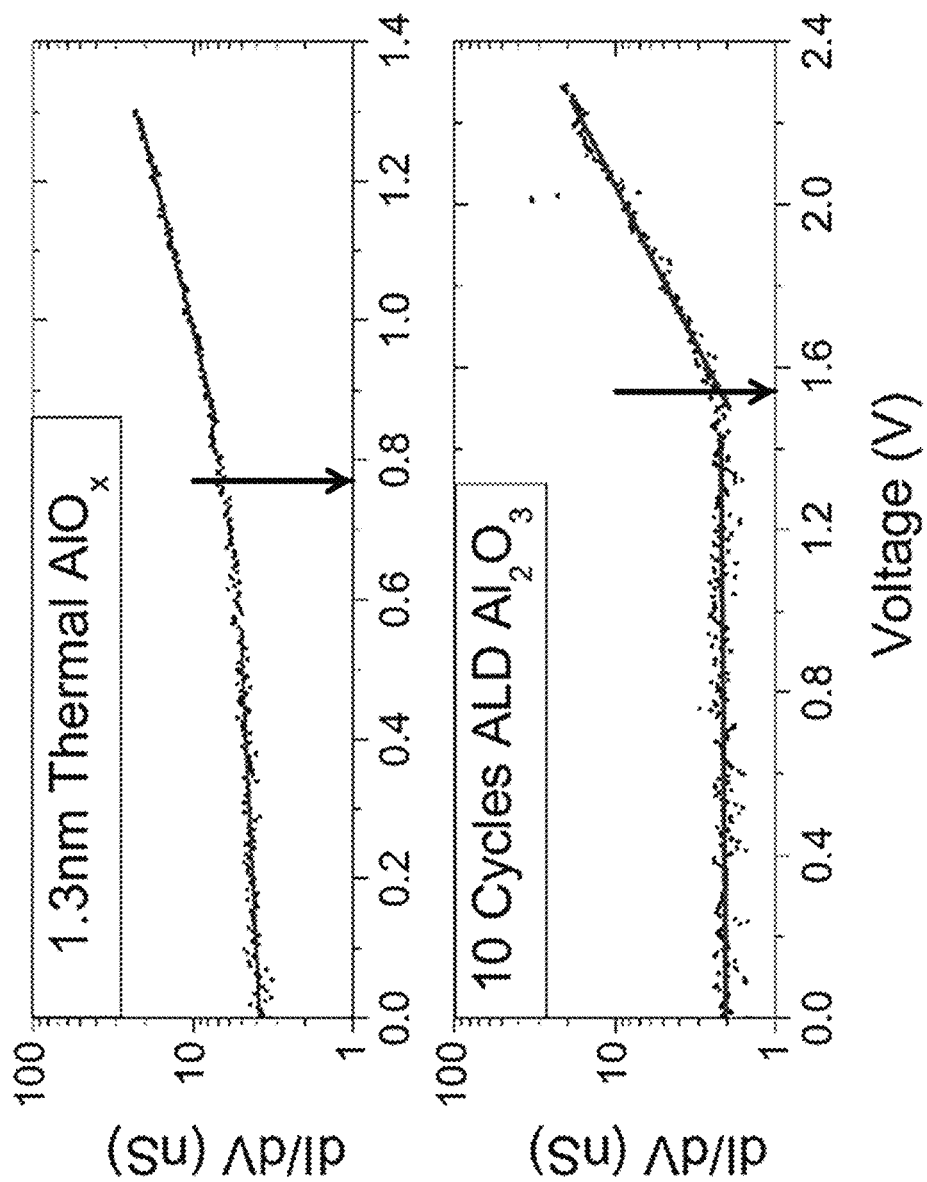
FIGS. 3A-3B show the results of the comparative STS study of ALD Al$_2$O$_3$ vs. thermal AlO$_x$ tunnel barriers.

In FIG. 2A, STS dI/dV spectra were taken in situ on Al/Nb bilayer structures (shown schematically in FIG. 2B) which were exposed to these two dynamic heating times. The spectrum for the 75 min heated sample (FIG. 2A, first panel) resembles that of a highly defective tunnel barrier. In fact, it has characteristics similar to the thermal $AlO_x$ tunnel barrier (discussed later in FIGS. 3A-3B) [19, 20]. In contrast, the spectrum for the 15 min heated sample (FIG. 2A, second panel) closely matches the conductive spectrum measured from a calibration sample that was directly transferred to the STM chamber after Al sputtering without going through any heating (not shown). These spectra show that the HV and short exposure between PVD and ALD both minimize IL formation.

To initiate the ALD $Al_2O_3$, the Al wetting layer was exposed to a $H_2O$ pulse to hydroxylate its surface. In order to understand the kinetics of this hydroxylation process, the behavior of $H_2O$ on the Al surface was investigated using Ab-initio molecular dynamics (AIMD) and Climbing-Image-Nudge Elastic Band (CI-NEB) simulations. When only one $H_2O$ molecule (i.e. without $H_2O$ molecules in proximity) is present on the Al surface, $H_2O$ dissociation into $OH^-$ is thermodynamically unfavorable. In contrast, when multiple $H_2O$ molecules are present on the Al (111) surface, dissociation occurs after just a few ps. A proton transfer between nearby $H_2O$ molecules creates $OH^-$ and $H_3O^+$, followed by $H_3O^+$ dissociation into $H_2O_{ad}$ and $H^+_{ad}$. The reaction pathway of this dehydrogenation process has an overall net exothermic reaction with a ~0.5 eV energy barrier. The remaining transition states were verified with additional NEB simulations to have very small or negligible energy barriers. This shows that the $H_2O$ areal density from the $H_2O$ pulse can be used to ensure an efficient hydroxylation reaction and a uniform monolayer of $OH^-$ on the Al surface. The stability of these $OH^-$ groups is also a consideration as dissociation into O and Wads could lead to oxygen diffusion into the Al wetting layer and IL formation. However, it was determined that these $OH^-$ groups do not readily dissociate at a temperature of ~200° C. Nevertheless, this dissociation may become a concern at significantly higher temperatures.

In order to experimentally probe this hydroxylation process, one cycle of ALD $Al_2O_3$ was performed on an Al wetting layer with an initial $H_2O$ pulse of variable duration. FIG. 2A, third panel depicts a representative dI/dV spectrum for a one-cycle ALD $Al_2O_3$ tunnel barrier with an initial $H_2O$ pulse of 2 s in duration. The inset of FIG. 2A, third panel shows the corresponding I-V curve. This dI-dV spectrum displays a well-defined tunnel barrier with a barrier height, $E_b$, of ~1.56 eV and indicates that an atomically-thin tunnel barrier can be obtained using this UHV PVD-ALD approach on a clean Al wetting layer through careful control of the ALD growth in order to minimize IL formation.

Figure 2C:
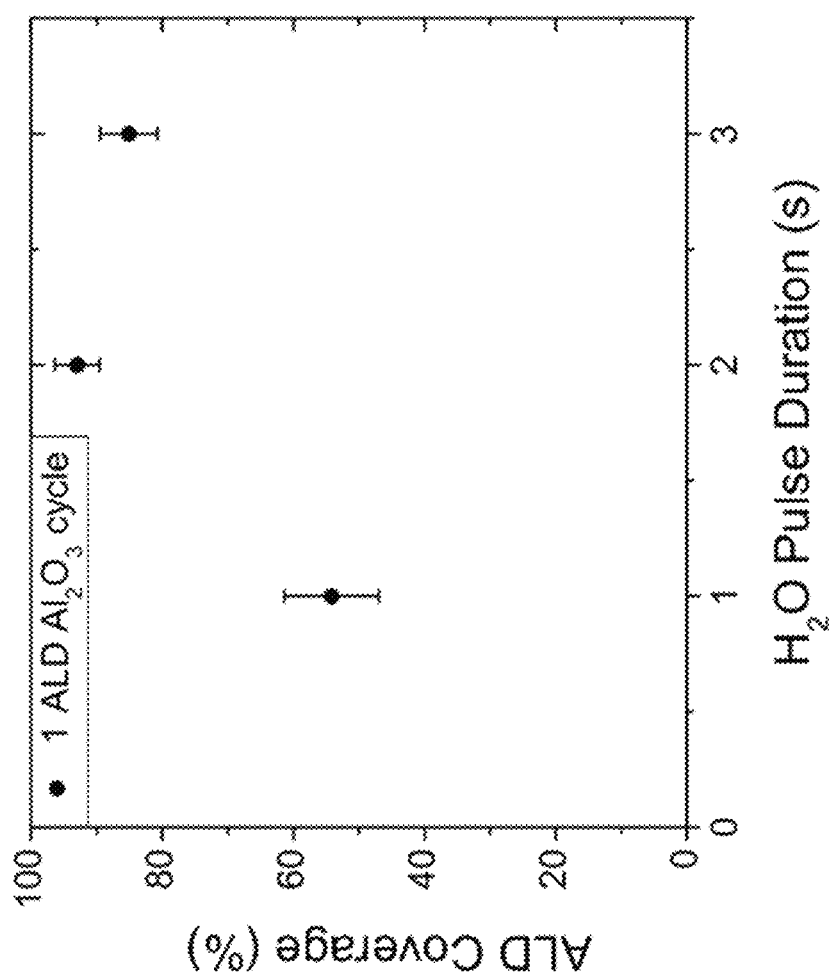

FIG. 2C reveals the one-cycle ALD $Al_2O_3$ coverage on the Al wetting layer as the initial $H_2O$ pulse duration was varied from 1-3 s. The ALD $Al_2O_3$ coverage was defined as the percentage of STS spectra, taken from random locations on the sample, which showed a sharp conduction band onset and an $E_b$ consistent with ALD samples of higher cycle number (see FIGS. 3A-3B). The ALD $Al_2O_3$ surface coverage increased from ~54% at 1 s pulse duration to ~93% at 2 s duration. These experimentally observed time frames showed that long initial $H_2O$ pulses, on the order of seconds, are required for $H_2O$ molecules, adsorbed to the Al surface, to reach a high enough areal molecular density for an efficient dissociation into $OH^-$ to occur. However, longer $H_2O$ pulses were found to be detrimental in terms of ALD $Al_2O_3$ surface coverage. The remaining, non-ALD, spectra on the Al surface were either conductive or had very high noise and were unstable under the STM electric field. Without wishing to be bound to any particular theory, it is speculated that very long $H_2O$ pulses may lead to $H_2O$ clusters instead of monolayer formation on the Al surface. These clusters may slow down or prohibit uniform surface hydroxylation.

In addition to its paramount role in nucleation, the hydroxylation of the Al wetting layer prevents oxygen from diffusing into the Al to form an IL during the ALD process. This argument is supported by the dI/dV characteristics and $E_b$ observed for the thermal $AlO_x$ and the ALD $Al_2O_3$ tunnel barriers. The dI/dV spectra for a thermal $AlO_x$ tunnel barrier of ~1.3 nm, in estimated thickness [13], is shown alongside a ten-cycle ALD $Al_2O_3$ tunnel barrier with a comparable thickness of 1.2 nm in FIG. 3A. The ALD $Al_2O_3$ spectrum has a significantly sharper conduction band onset than the thermal $AlO_x$ spectrum, evidence that the ALD $Al_2O_3$ tunnel barrier has a much more ordered and less-defective internal structure[19, 21, 22]. This improved internal structure is corroborated by the higher ALD $Al_2O_3$ $E_b$ shown in FIG. 3B. In general, larger barrier heights correspond to a denser and less defective tunnel barrier, less susceptible to pinholes. Specifically, $E_b$ values of ~1.00 eV and ~1.42 eV were observed for the ALD $Al_2O_3$ tunnel barriers with 75 min heating and 15 min heating respectively whereas the thermal $AlO_x$ counterpart was just ~0.67 eV. Other groups have reported similar thermal $AlO_x$ $E_b$ values[13, 23]. In addition, the ALD $Al_2O_3$ samples with 15 min of heating had a band gap of ~2.5 eV. This high band gap is remarkable because it is comparable to the ultrathin (~1.3 nm) epitaxial $Al_2O_3$ band gap[24]. The ALD $Al_2O_3$ tunnel barrier also displayed a hard-breakdown type behavior under the STM electric field which is typical for epitaxial $Al_2O_3$ thin films[25]. In great contrast, the thermal $AlO_x$ tunnel barriers broke-down in a soft-breakdown manner due to defect migration within the barrier [19, 20, 25-28]. It is noted that the 75 min heated samples displayed both types of breakdown, which is consistent with the thin IL found in FIG. 2A. However, the absence of soft-breakdown in the ALD $Al_2O_3$ tunnel barrier with 15 min heating can be taken as a further indicator that no significant IL is present on its M-I interface.

Figure 3B:
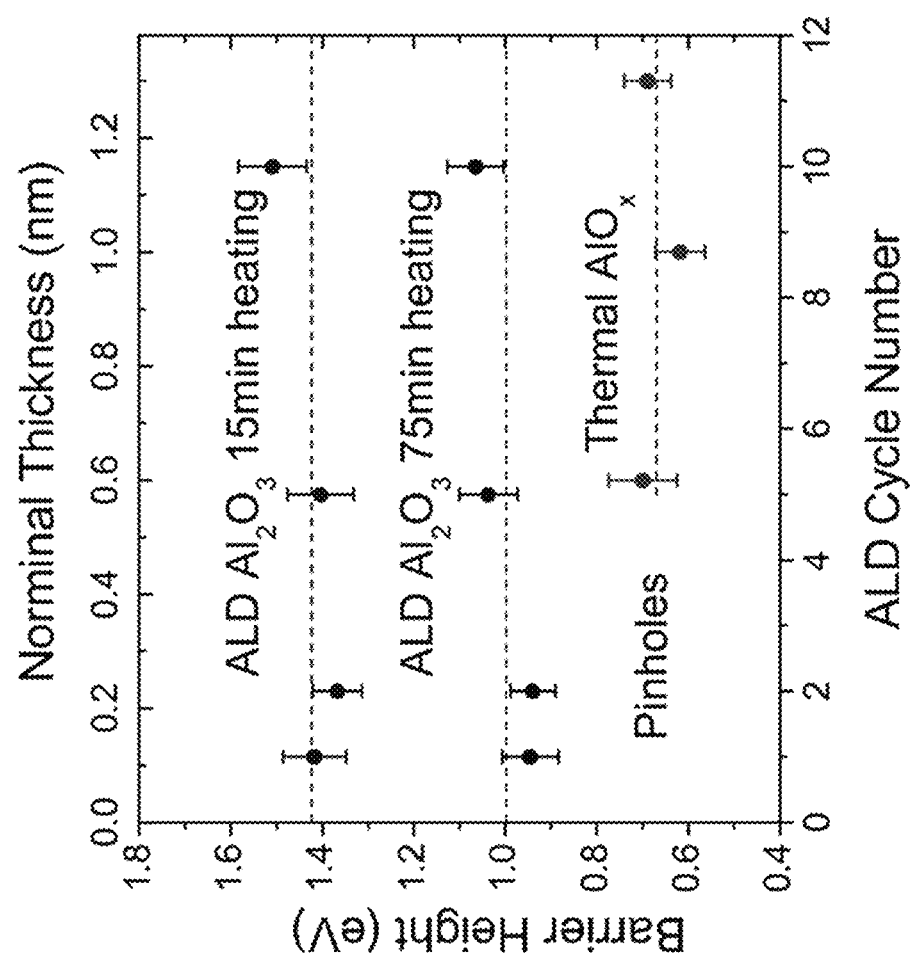

It is particularly interesting that the ALD $Al_2O_3$ $E_b$ value was maintained as the number of ALD cycles, N, varied from 1 to 10 (FIG. 3B). This trend is particularly demonstrated in the ALD $Al_2O_3$ samples with 15 min heating (top) and further indicates that a significant M-I IL is not present—as an IL would have disproportionately affected the samples with smaller N's by lowering their $E_b$ values. For the ALD $Al_2O_3$ samples with 75 min heating (middle), an IL was confirmed by the slight $E_b$ reduction of 0.11 eV as N was reduced to 1 and 2 from larger values. An additional effect of this IL is demonstrated by the $E_b$ improvement as the sample heating time was reduced from 75 min (middle) to 15 min (top). Nevertheless, this overall ALD $Al_2O_3$ $E_b$ consistency with thickness is remarkable because it illustrates that the ALD process can produce high quality $Al_2O_3$ down to the atomically-thin limit. In contrast, the thermal $AlO_x$ $E_b$ has a significant thickness dependence in the lower nominal thickness range, although a value of 0.67 eV is maintained at 0.6-1.3 nm thickness. This $E_b$ thickness dependence is reflected by the dramatic increase in critical current density, $J_c$, observed in JJs with thermal $AlO_x$ tunnel barriers as the oxygen exposure drops below $\sim 10^3$ Pa-s, or $\sim 0.4$ nm in thickness[2, 13]. Furthermore, a complete tunnel barrier is not even formed in this regime as the tunneling current is dominated by pinholes.

Josephson Junction Characterization

Figure 4A:
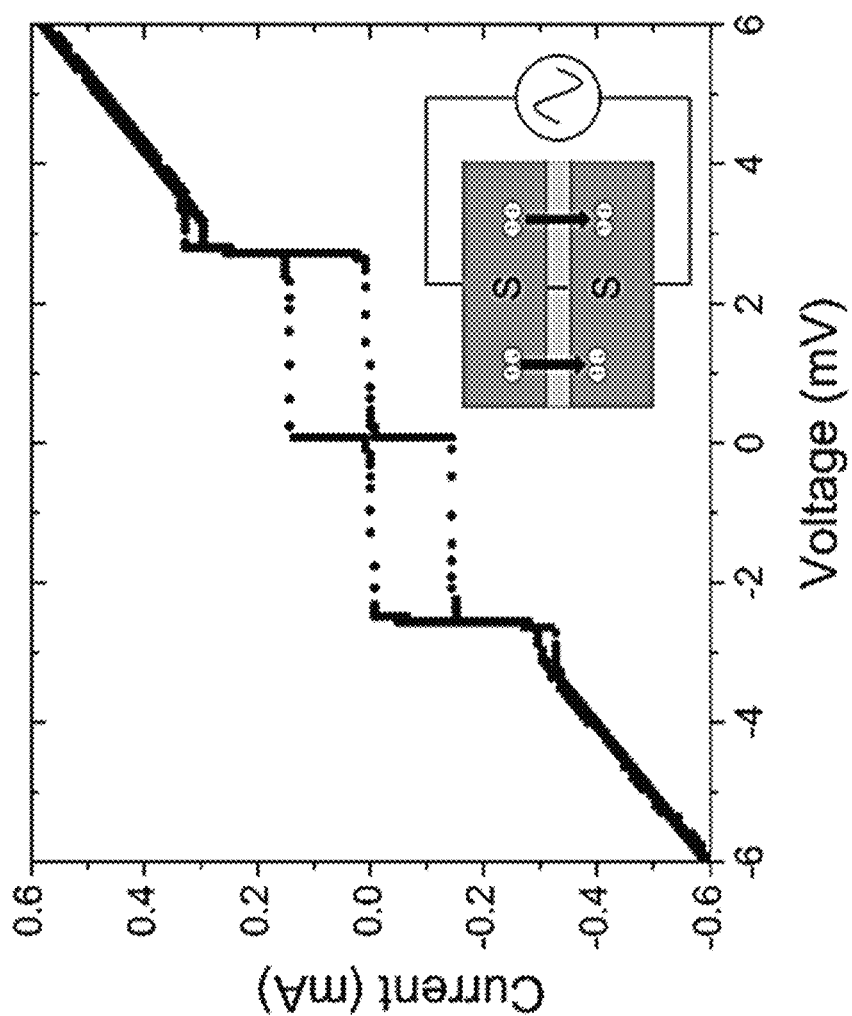
FIGS. 4A-4D show results for Nb/Al/Al$_2$O$_3$/Nb Josephson Junctions with an ALD Al$_2$O$_3$ tunnel barrier.
Figure 4B:
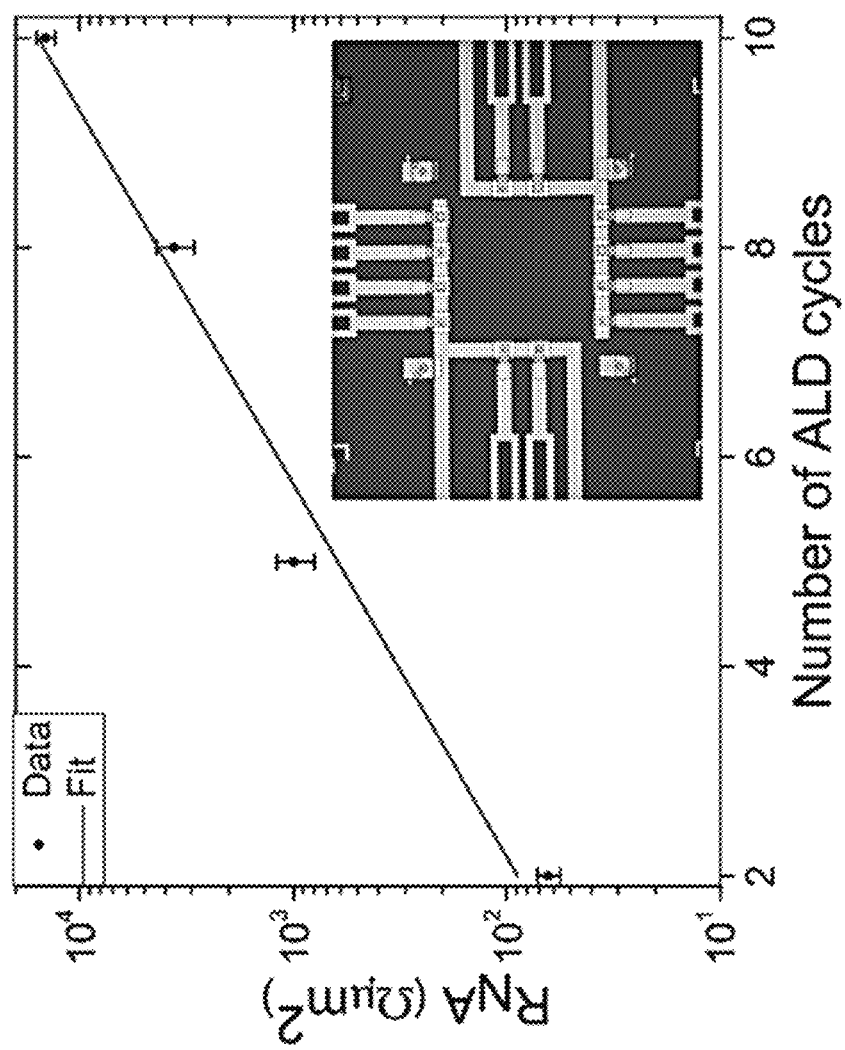

To demonstrate how this ALD $Al_2O_3$ tunnel barrier performs in a demanding MIMTJ application, JJs were fabricated and their dc current-voltage characteristics (IVCs) measured at 4.2 K. The IVC of a 5-cycle junction with a designed area of 100 $\mu m^2$ is shown in FIG. 4A. This IVC has a low subgap leakage current and is highly nonlinear—as expected for superconductor-insulator-superconductor (SIS) tunnel junctions. The small current step at $V=\Delta/e$ of the IVC is most likely caused by Andreev reflection at the interface between the bottom Nb electrode and the 7-nm Al wetting layer of the Nb—Al—$Al_2O_3$—Nb structure (V. Shaternik, et al., Tunneling characteristics of superconducting junctions with inhomogeneous tunnel barriers, Materialwiss. Werkstofftech. 44, 205 (2013)), and not due to transport through pinholes, as discussed in T. Klapwijk, et al., Explanation of subharmonic energy gap structure in superconducting contacts, Physica (Amsterdam) 109B+C, 1657 (1982). The superconducting gap voltage was $V_g \equiv 2\Delta/e \equiv 2.6$ mV and did not depend on N In addition, the $IR_n$ versus voltage V, where $R_n$ is taken to be the dynamic resistance at 5 mV, is nearly identical for JJs with different N, indicating good reproducibility in the junction fabrication process. These JJs are of considerably higher quality than ALD $Al_2O_3$ JJs fabricated in previous work which had a dramatic $I_c$ suppression due to charge scatter sites in the M-I IL[12].

Recently, by measuring the dependence of JJ's critical current density on oxygen exposure, a proxy for tunnel barrier thickness d, Kang et al determined the thermal $AlO_x$ tunnel barrier $E_b$ to be $\sim 0.64$ eV [13]. (There was a factor of 2 error in the exponential of Eq (1). Once corrected, their reported thermal $AlO_x$ $E_b$ was 0.64 eV.) Notice that it is very difficult to calibrate the relationship between d and oxygen exposure. In contrast, due to the self-limited, layer-by-layer growth nature of ALD, the growth rate of the ALD $Al_2O_3$ tunnel barrier has been precisely calibrated as $d_{ALD}=0.115\pm0.005$ nm/cycle [11]. To determine the ALD JJ $E_b$, the measured critical current density, $G_n=(R_nA)^{-1}\partial J_c$, was plotted against $d_{ALD}$ in FIG. 4B. Because thermal and magnetic field fluctuations have a strong effect on the switching current but have essentially no effect on $R_n$, especially for JJs with small critical currents, it is much more reliable to extract $E_b$ by fitting the exponential dependence of $G_n$ versus $d_{ALD}$.

$$G_n = G_0 \exp\left(-\frac{\sqrt{2m_e E_b}}{\hbar} d_{ALD}\right), \quad (1)$$

where $m_e$ is the electron mass, $\hbar$ is the Planck constant, and $G_0$ is the specific conductance for $d_{ALD}=0$. The tunnel barrier height determined from the best fit was $E_b=1.10\pm0.06$ eV. This $E_b$ value agrees well with the STS measurements.

Figure 4C:
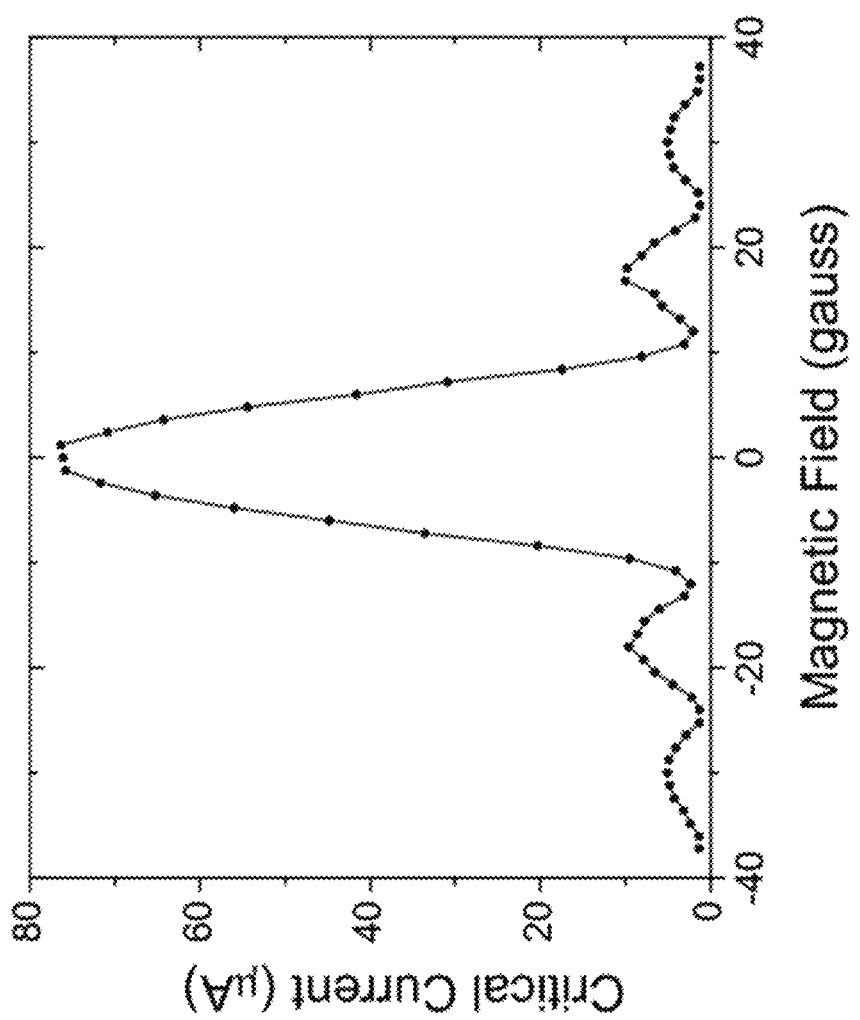

Ideal tunnel junctions require a uniform tunnel barrier with no microscopic pinholes. Pinholes lead to subgap leakage current and a distorted magnetic field dependence on critical current, $I_c$. The magnetic field dependence of the critical current, $I_c(H)$, for a 5-cycle junction is shown in FIG. 4C. Complete $I_c$ suppression at the first minimum and a symmetric shape was observed. This behavior is consistent with a uniform insulating tunnel barrier with negligible leakage current and pinholes.

Figure 4D:
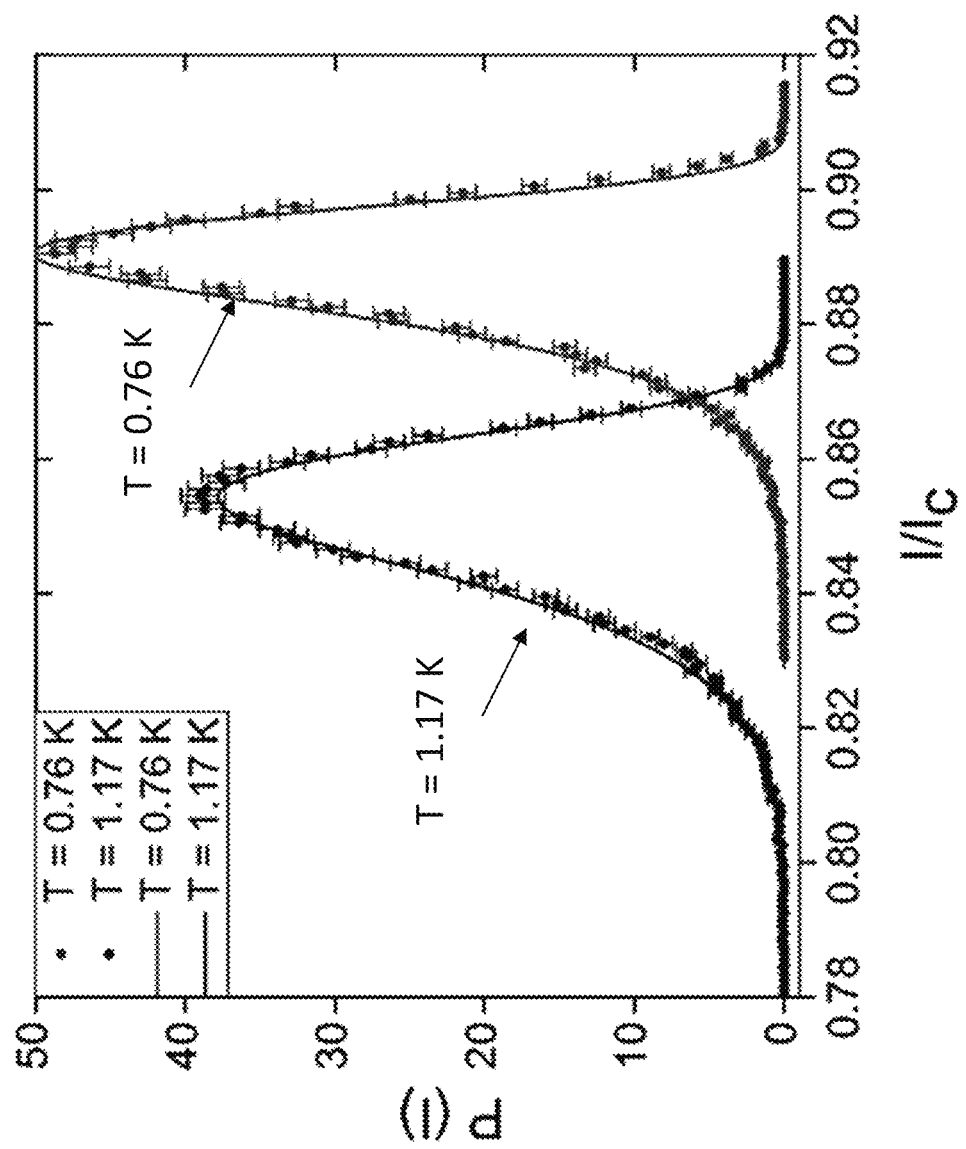

A denser tunnel barrier should have fewer atomic-scale two-level defects (TLDs). TLDs have been identified as one of the major sources of decoherence for superconducting qubits, which are considered one of the strongest candidates for the implementation of scalable quantum computing [29]. It has been observed that TLDs embedded inside the oxide tunnel barrier and/or at the superconductor/oxide interface can couple strongly to Josephson qubits. These TLDs lead to splitting in the transition energy spectrum of the qubit, large fluctuations in $I_c$, and distortions in junctions' switching current distribution $P_{sw}(I)$ [30-32]. Therefore, $P_{sw}(I)$ can be used as a diagnostic tool for the detection of TLDs in tunnel barriers which couple strongly to the junction. FIG. 4D shows the experimental $P_{sw}(I)$ which is obtained using the conventional time-of-flight technique (J. M. Martinis, et al., Experimental tests for the quantum behavior of a macroscopic degree of freedom: The phase difference across a Josephson junction, Phys. Rev. B 35, 4682 (1987); S.-X. Li, et al., Quantitative Study of Macroscopic Quantum Tunneling in a dc SQUID: A System with Two Degrees of Freedom, Phys. Rev. Lett. 89, 098301 (2002); S.-X. Li, et al., Observation of Macroscopic Quantum Tunneling in a Single $Bi_2Sr_2CaCu_2O_{8+\delta}$ Surface Intrinsic Josephson Junction, Phys. Rev. Lett. 99, 037002 (2007)) with a constant current sweeping rate of 5 mA/s in a very well-filtered and shielded cryostat suitable for coherent quantum dynamics of Josephson qubits (S.-X. Li, et al., Observation of Macroscopic Quantum Tunneling in a Single $Bi_2Sr_2CaCu_2O_{8+\delta}$ Surface Intrinsic Josephson Junction, Phys. Rev. Lett. 99, 037002 (2007); Y. Tian, et al., A cryogen-free dilution refrigerator based Josephson qubit measurement system, Rev. Sci. Instrum. 83, 033907 (2012).) In order to reduce the effect of self-heating, a 50 $\mu m^2$, 10-ALD cycle junction with a very low critical current density of $J_c=9.4$ A/cm$^2$ was selected for $P_{sw}(I)$ measurements. The critical current of the junction, $I_c=4.757\pm0.003$ $\mu A$, was determined by fitting the measured $P_{sw}(I)$ to the prediction from thermal activation theory with the critical current as the adjustable parameter. (J. M. Martinis, et al., Experimental tests for the quantum behavior of a macroscopic degree of freedom: The phase difference across a Josephson junction, Phys. Rev. B 35, 4682 (1987); S.-X. Li, et al., Quantitative Study of Macroscopic Quantum Tunneling in a dc SQUID: A System with Two Degrees of Freedom, Phys. Rev. Lett. 89, 098301 (2002); S.-X. Li, et al., Observation of Macroscopic Quantum Tunneling in a Single $Bi_2Sr_2CaCu_2O_{8+\delta}$ Surface Intrinsic Josephson Junction, Phys. Rev. Lett. 99, 037002 (2007)). The junction's shut capacitance was estimated to be C≈2.2 pF from the 45 $fF/\mu m^2$ specific capacitance of low-Jc Nb JJs and the junction's nominal area. Typical $P_{sw}(I)$ curves obtained at T=0.76 K and 1.17 K are shown in FIG. 4D. Using these junction parameters and a constant current sweeping rate 5 mA/s, the measured distributions agree very well with those calculated from thermal activation theory. The absence of anomalies in the measured $P_{sw}(I)$ distributions is consistent with a lack of TLDs which couple strongly to the junction in the tunnel barrier and/or at the superconductor-insulator interface. (R. Rouse, et al., Observation of Resonant Tunneling between Macroscopically Distinct Quantum Levels, Phys. Rev. Lett. 75, 1614 (1995).)

SUMMARY AND CONCLUSIONS

In summary, an in situ STS study has been carried out to understand the nucleation mechanisms of ALD $Al_2O_3$ on an Al wetting layer. It has been found that a well-controlled hydroxylation of the Al wetting layer, through a carefully controlled first $H_2O$ pulse, enables the creation of an atomically-thin ALD $Al_2O_3$ tunnel barrier which is of significantly higher quality than the industrial standard thermal $AlO_x$ tunnel barrier. Specifically, the ALD $Al_2O_3$ tunnel barrier has a high $E_b$ of 1.42 eV which is maintained as the barrier thickness is varied in the range of 0.12-1.2 nm. Furthermore, this ALD $Al_2O_3$ tunnel barrier has a band gap of 2.5 eV and exhibits hard electrical breakdowns similar to high-quality epitaxial $Al_2O_3$ thin films. In contrast, the thermal $AlO_x$ tunnel barrier has a low $E_b$ of ~0.67 eV only in the barrier thickness range exceeding 0.6 nm. At smaller thicknesses, enhanced soft electrical breakdown occurs and the $E_b$ decreases. Finally, it was found that minimizing the pre-ALD exposure of the Al surface in the ALD chamber, even in high vacuum, prevented $AlO_x$ IL formation which otherwise leads to a reduced $E_b$, especially at smaller barrier thicknesses. This result demonstrates for the first time the viability of the ALD process to create an atomically-thin $Al_2O_3$ tunnel barrier which has a significantly denser, less defective internal structure than thermal $AlO_x$—as demanded for the next generation of high performance MIMTJs.

Example 2

Introduction

Figures 5A, 5B, 5C:
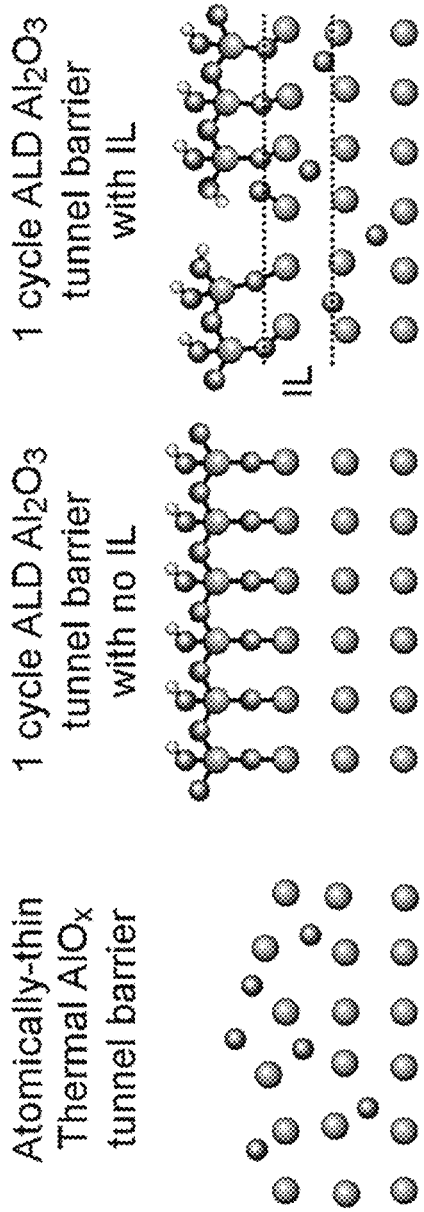

As described above, the present industry standard tunnel barrier for MIMTJ devices is thermal $AlO_x$ which is created through a controlled oxygen diffusion into an Al wetting layer [5] shown schematically in FIGS. 5A and 5D respectively for atomically-thin and ultrathin regimes. In the former, the oxygen diffusion process does not create a well-defined tunnel barrier due to the fundamental obstacles in controlling such oxidation at the atomic scale. First, the metal-insulator interface is not well defined and can be highly non-uniform both laterally, depending on the surface microstructure of the Al wetting layer, and longitudinally across the $AlO_x$ thickness due to the diffusion mediated process. Aside from these non-uniformity issues, pinholes are ubiquitously present and prevent tunneling in MIMTJ devices through the formation of shorts [5]. At larger thicknesses around ~0.4 nm, controlled through larger oxygen exposure (product of oxygen pressure-exposure time), pinholes become less prevalent, and the overall quality of the tunnel barrier increases (FIG. 5D) [5, 6]. However, even when the thickness is above this transition, disorder within the tunnel barrier caused by oxygen vacancies impairs the dielectric performance. In Josephson Junctions (JJs), these oxygen vacancies create two-level states within the tunnel barrier which are a major source of decoherence for superconducting qubits [7-9]. Like Example 1, Example 2 also makes use of an alternative to thermal oxidation in order to create high quality dielectric tunnel barriers down to the atomically-thin limit.

In particular, Example 2 makes use of ALD of $Al_2O_3$. As described above, ALD is a chemical vapor process (CVD) which grows $Al_2O_3$ one atomic layer each time through a series of $H_2O$ and Trimethylaluminium (TMA) reactant pulses. Purge steps between pulses prevent CVD reactions to enable self-limited, conformal growth on the sample surface. This serial process enables atomic-scale control of the $Al_2O_3$ thickness as each ALD reaction cycle deposits a single layer of $Al_2O_3$ 0.11-0.12 nm thick [10, 11]. Ideal 1-cycle and 5-cycle ALD $Al_2O_3$ tunnel barriers are depicted schematically in FIGS. 5B and 5E, respectively.

However, achieving such an ideal ALD $Al_2O_3$ tunnel barrier is by no means trivial since ALD $Al_2O_3$ growth cannot begin unless a hydroxylated surface is available [12, 13]. Unfortunately, such a surface is not readily available on metals. While hydroxylation of a metal surface is possible through a so-called in situ incubation process by sacrificing the first tens of ALD cycles [13], the treated metal surface typically contains a defective interfacial layer (IL) that is several nm in thickness. Such a thick IL is unacceptable for MIMTJs. Even with a thin IL, depicted schematically in FIGS. 5C and 5F, the defective structure in IL may be transposed to the ALD $Al_2O_3$ layer grown on top, preventing the formation of high-quality atomically thin ALD tunnel barriers. Example 1 above has shown that a controlled pre-ALD $H_2O$ pulse can adequately hydroxylate the Al wetting layer for ALD to grow in the $1^{st}$ cycle. However, even in situ ALD deposition of $Al_2O_3$, or in general other oxides, on reactive metal substrates, such as Al, can acquire an IL of sub-nm or thicker [14-16]. Should an IL form, it may disrupt the ALD growth during the first few cycle, impair the overall tunnel barrier quality, and degrade the electron tunneling properties of MIMTJs. As described in Example 1, control of the Al wetting layer's exposure (pressure and time) to trace gasses, especially at elevated temperatures, facilitates high quality ALD $Al_2O_3$ tunneling barriers for MIMTJ devices. Example 2 further evaluates the mechanism of IL formation, including in the HV environment in order to further control the in situ ALD process to enable a single atomic layer hydroxylation of a metal surface for the growth of an atomically thin ALD tunnel barrier.

In Example 2, molecular dynamics simulations and in situ Scanning Tunneling Spectroscopy (STS) were employed to investigate the possible mechanisms of IL formation and its influence on the growth and dielectric properties of atomically-thin and ultrathin ALD $Al_2O_3$ tunnel barriers. It is speculated that thermal oxidation of the Al wetting layer occurs during a prolonged pre-ALD heating time from exposure to trace $O_2$ or $H_2O$. This IL reduced the $Al_2O_3$ barrier height, especially in the atomically-thin regime. Minimizing the Al wetting layer's pre-ALD exposure led to an increased barrier height which was constant with thickness. A transition from predominantly soft dielectric breakdown in the presence of an IL to hard breakdown when the IL becomes negligible was also observed. Considering the soft breakdown is characteristic to the thermal $AlO_x$ tunnel barriers while the hard breakdown resembles that of crystalline $Al_2O_3$, eliminating IL indeed is shown to be critical for high-quality ALD $Al_2O_3$ tunnel barriers for MIMTJs.

Experimental

Computational Simulations on the IL growth mechanisms and its effect on ALD growth were carried out using Density Functional Theory (DFT) calculations using the Nudged-elastic band (NEB) method [17] and ab-initio molecular dynamics (AIMD) simulations under constant temperature and volume (NVT) with 1 fs for each trajectory step as implemented in VASP[18] and Quantum Espresso [19] codes. Detailed procedures to model the Al surface reactions have been provided elsewhere [20-22].

To create the metal-insulator structure for in situ Scanning Tunneling Spectroscopy (STS), a bilayer of Nb (20 nm)/Al (7 nm) was DC magnetron sputtered onto a Si/Au (50 nm) substrate. The Nb and Al layers were sputtered at 1.7 nm/s and 0.5 nm/s respectively and the Au was evaporated onto an undoped Si wafer with a native oxide to serve as a ground contact for the SPM system (RHK). In order to reduce oxidation following magnetron sputtering, the samples were transferred to the ALD chamber in a unique, home-built vacuum chamber which is capable of in situ sample transport under HV between the sputtering, ALD, and SPM chambers. [23] To reach a suitable temperature for ALD, the samples had to bridge the temperature difference of ~12° C., for sputtering, to 100-350° C. for ALD [24]. After the in situ transport to the preheated ALD chamber, the samples were dynamically heated under HV in preparation for ALD. Following heating, 1-5 cycles of ALD $Al_2O_3$ were deposited with a 5 sccm $N_2$ carrier gas to create the dielectric tunnel barrier. The first reactant pulse was $H_2O$ in order to hydroxylate the Al surface to allow for ALD nucleation in the first ALD cycle. This first $H_2O$ pulse has been described in detail in Example 1. To compare the characteristics of ALD $Al_2O_3$ tunnel barriers to traditional thermal $AlO_x$ tunnel barriers, a ~0.3 nm and ~0.6 nm thermal $AlO_x$ tunnel barriers were also fabricated using a 3.81 Torr-sec and a 42 Torr-sec UHP $O_2$ exposure in the sputtering chamber [6].

To examine the $Al_2O_3$ tunnel barriers in situ, the samples were transferred, under HV, to the SPM chamber for measurement immediately following tunnel barrier fabrication. The SPM chamber had a pressure of $\sim 2 \times 10^{-10}$ Torr. A single mechanically-cleaved Pt—Ir Scanning Tunneling Microscopy (STM) tip was used for all SPM studies. Constant height IV and dI/dV spectroscopy were taken simultaneously using the lock-in amplifier method with a voltage modulation of 100 mV at 1 kHz or 30 mV at 5 kHz. The STM tip was held fixed at each scanned location and the bias was sequentially ramped up and down 20 times to examine the dielectric breakdown of the $Al_2O_3$ tunnel barrier.

Numerical Simulations on the Effect of IL Formation

Figure 6A:
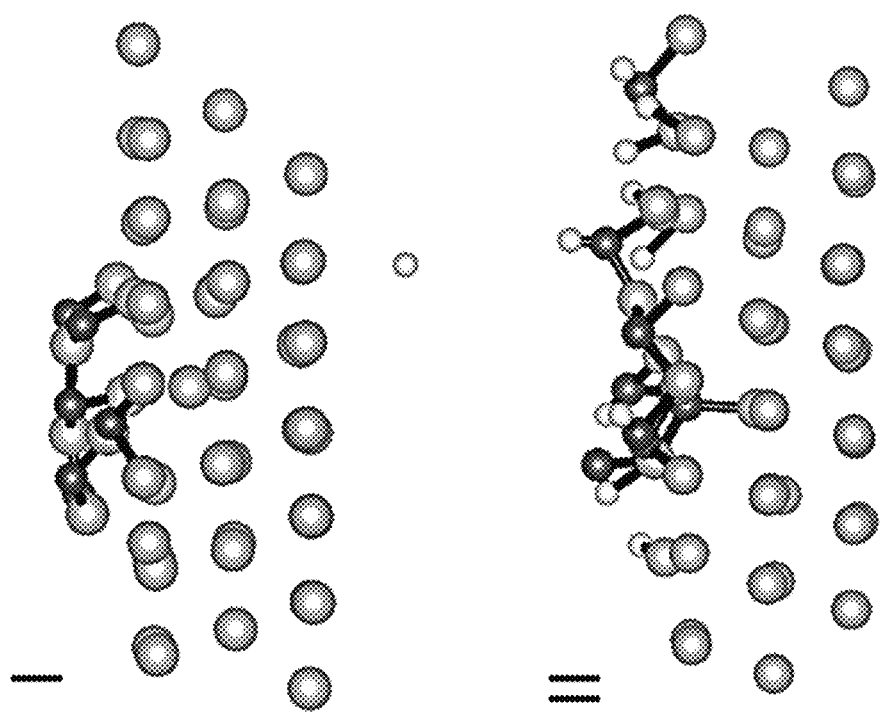
FIGS. 6A-6B show snapshots from ab initio molecular dynamic (AIMD) simulations.

Should an IL form at the Al—$Al_2O_3$ interface, it most likely forms during the pre-ALD sample heating step of the tunnel barrier fabrication. To reach a suitable temperature for ALD, the samples had to bridge the temperature difference of ~12° C., for sputtering, to 100-350° C. for ALD [24]. Trace $O_2$ or $H_2O$ originating from the ALD reactor during this heating step may form an IL via the thermal oxidation process. To shed light on the microscopic mechanisms of this IL formation, a number of ab-initio molecular dynamics (AIMD) simulations were run. FIG. 6A (I) shows the atomic trajectory of adsorbed oxygen on an Al substrate at temperature of 80K. After just 1.5 ps, trace oxygen ions have already distorted the topology of the Al surface lattice. The Al atoms are spontaneously "extracted" from their original surface positions, creating a rough topology. A very similar observation has been observed by a previous theoretical study [25] based of a ground state (OK) DFT calculations. This Al extraction during the early stage of Al oxidation has been attributed to the strong propensity to form $AlO_x$ clusters on the Al surface spontaneously whereby the Al ion readily move to the center of each cluster. The AIMD simulations demonstrate that such processes occur at temperatures as low as 80K and thus it is conceivable any oxygen impurities in the ALD chamber during the pre-ALD sample heating, even under HV, may initiate thermal Oxidation and form an IL.

Aside from oxygen, a thermal $AlO_x$ IL may form indirectly upon exposure to $H_2O$. The $H_2O$ source may originate from either the initial hydroxylating $H_2O$ pulse or from exposure to trace $H_2O$ from the ALD reactor which has a vacuum pressure on the order of $10^{-4}$ to $10^{-5}$ Torr during pre-ALD sample heating. The second simulation shown in FIG. 6A (II) depicts the trajectory of adsorbed water on an Al substrate at 600K after 1 ps. A higher temperature was used to expedite the water dissociation into $OH^-$ and $H^+$ and a subsequent $OH^-$ dissociation into adsorbed oxygen ions (see Example 1). This dissociation may occur at lower temperatures as well at a reduced rate. Nevertheless, once oxygen ions are formed, they will easily diffuse into the Al substrate via the thermal oxidation process and an IL will result.

Figure 6B:
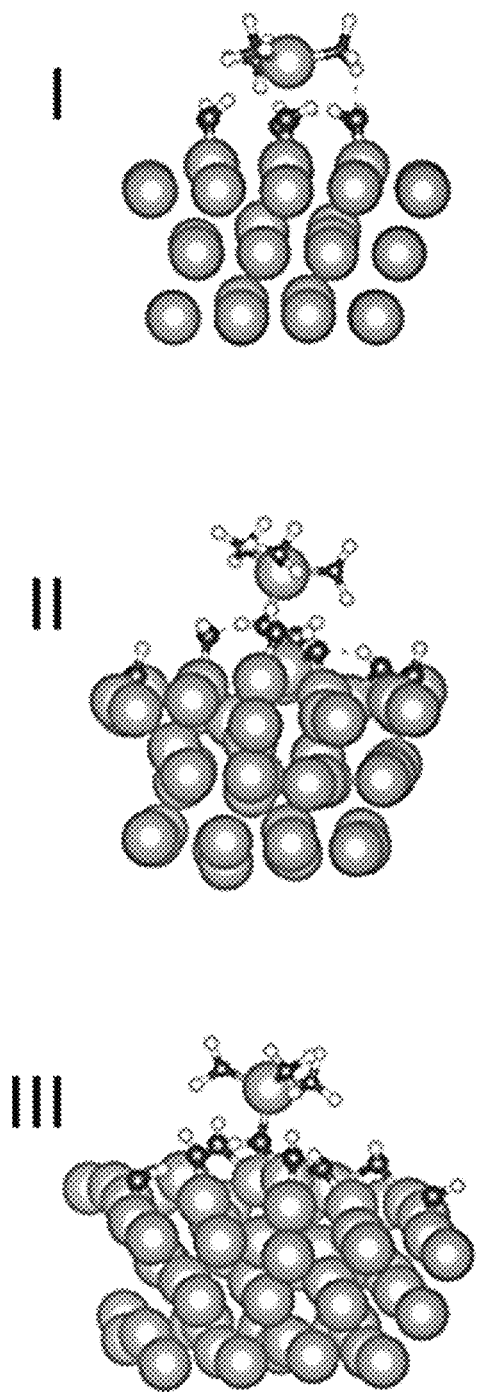

To understand how the presence of an IL may impact the ALD $Al_2O_3$ film growth, the ideal case of ALD growth on hydroxylated Aluminum surface without an IL is evaluated (FIGS. 5B, 5E)). In FIG. 6B, the interaction of TMA with a hydroxylated Al(111) surface was evaluated. This simulation was set up by placing a horizontally aligned TMA molecule on top of a pool of seven OH— ligands that were adsorbed on the Al(111) surface (FIG. 6B (I)). The $1^{st}$ step of this TMA-$OH^-$ interaction is the adsorption of the TMA's Al cation onto $OH^-$. This adsorption partially elevates the hydroxylated Al surface and slightly distorts the TMA molecule with a slight change in the bond angle between the Al and the three methyl ligands. This interaction can be seen in FIG. 6B (II, III). Evidentially there is a strong preference for an Al—O bond. This finding is consistent with the results from a previous DFT study (at 0 K) on the interaction between TMA and a hydroxylated surface [26] which found that the Al—O adsorption process is a highly energetically favorable exothermic reaction (dH=−1.13 eV).

Throughout the AIMD simulations, intermolecular hydrogen bonds present amongst the adsorbed $OH^-$ molecules were observed, as evidenced by the frequent alignments of the hydrogen atoms. The $OH^-$ intermolecular bond length laterally is quite short, in the range of 1.4 Å to 2.0 Å. A hydrogen bond results and horizontally-aligns the $OH^-$ adsorbates. This horizontal alignment can only be achieved by a high $OH^-$ surface packing density on the Al (111) substrate. As a consequence of this horizontal alignment, the O ion in the $OH^-$ is exposed towards the Al cation from the TMA. A vertical $OH^-$ produces significant steric hindrance for the TMA adsorption on the $OH^-$. The horizontal $OH^-$ alignment, which forms from a high $OH^-$ surface density on the Al(111), enables an efficient TMA adsorption on the hydroxylated Aluminum wetting layer.

While it has been well-established that the ALD reactions, particularly with respect to TMA are self-terminating, that is not the case for the hydroxylation of the Al(111) surface. Rougher Al surface topology, created by the ingress of oxygen from a thermal $AlO_x$ IL, may lead to a reduced $OH^-$ surface density. The additional steric hindrance from now vertically aligned OH⁻ will likely lead to a reduced TMA density in the first ALD cycle; as shown schematically in FIG. 5C. This reduced TMA density will lower the $Al_2O_3$ density and the overall quality of the tunneling barrier.

Further AIMD simulations were conducted to evaluate the energy barrier for the release of $CH_4$ from the TMA molecule on the hydroxylated Al surface following the reaction in equation (1).

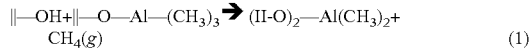

$$\|{-}OH + \|{-}O{-}Al{-}(CH_3)_3 \rightarrow (II{-}O)_2{-}Al(CH_3)_2 + CH_4(g) \quad (1)$$

Figure 6C:
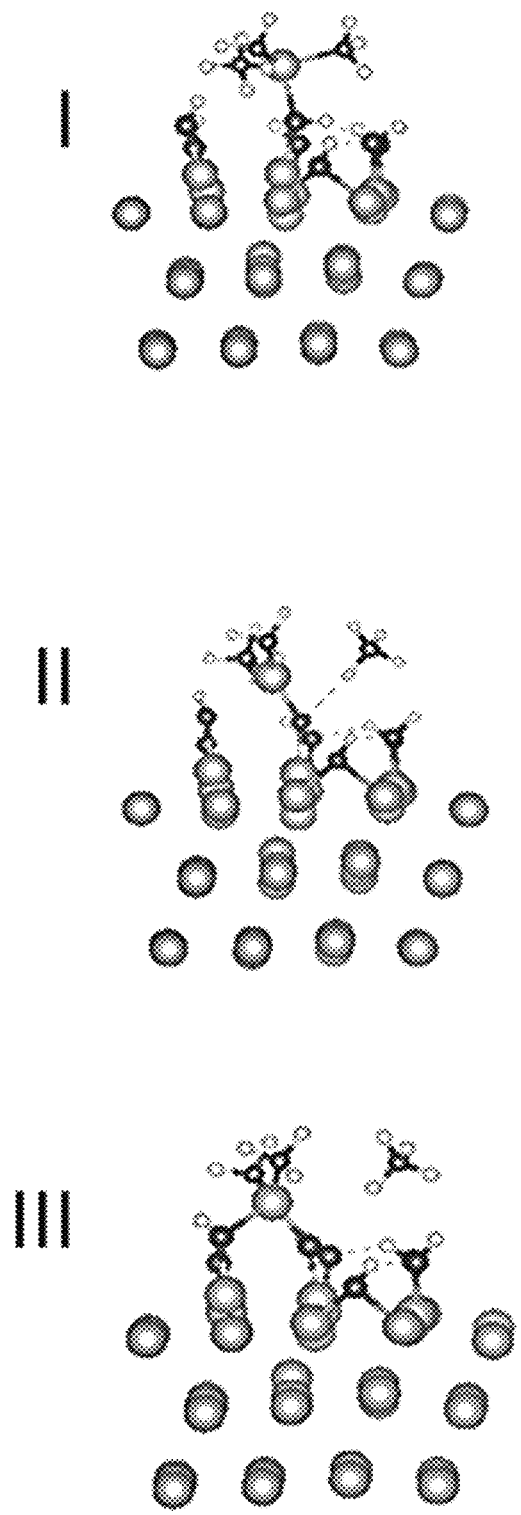
FIG. 6C Shows AIMD simulations for how this, now attached, TMA molecule will interact with OH⁻ molecules on the surface. The initial setup is shown in (I), the proton exchange between OH⁻ and the $CH_3$ group of the TMA is shown in (II), and the final release of the $CH_4$ molecule is shown in (III).

AIMD snapshots for the simulation of the reaction are shown in FIG. 6C. As previous theoretical work has shown, the first $CH_4$ dissociation process is characterized by an energy activation in the range of 0.35-0.9 eV. This activation energy depends on the degree of steric hindrance for the protonation onto the methyl ligands [26]. The minimum energy path for this dissociation process suggests that a protonation reaction which results in the release of $CH_4$ occurs between the TMA and the OH⁻ ligand that the TMA is adsorbed to. This dissociation mechanism is very similar to that observed in/modeled for an ALD reaction onto a Si(100) template[27, 28]. It was found that the reaction has an energy barrier of ~0.5 eV and is exothermic with a dissociation energy of −1.9 eV. The energy barrier for the dissociation is very similar to that of α-$Al_2O_3$, however the enthalpy change is ~2× that of α-$Al_2O_3$ [26]. This analysis however, is predicated upon the assumption that there are always going to be hydrogen atoms situated in nearby hydroxylated Al surfaces to remove the $CH_3$ ligand. It is reasoned that the presence of an IL will make the reaction (1) more difficult due a distorted Al lattice and low OH⁻ density on the surface. Eventually, once the initial alumina layer is established, the ALD process will proceed normally as shown schematically shown in FIG. 5F.

In Situ Scanning Tunneling Spectroscopy

From the simulations in FIGS. 6A-6C and Example 1, it becomes clear that (1) the $H_2O$ hydroxylation pulse conditions (i.e. temperature and areal density on the Al surface) and (2) the aluminum surface exposure to oxygen ions (i.e. IL growth and reduced OH⁻ density on the Al surface) are important parameters for achieving high quality ALD growth and nucleation during the first few ALD cycles. The pre-ALD heating conditions such as the sample temperature during the hydroxylation $H_2O$ pulse and the heating time in the ALD chamber required to reach that temperature are parameters to be optimized in the pursuit of a high-quality, monolayer ALD $Al_2O_3$ tunnel barriers which are suitable for MIMTJ.

Figure 7A:
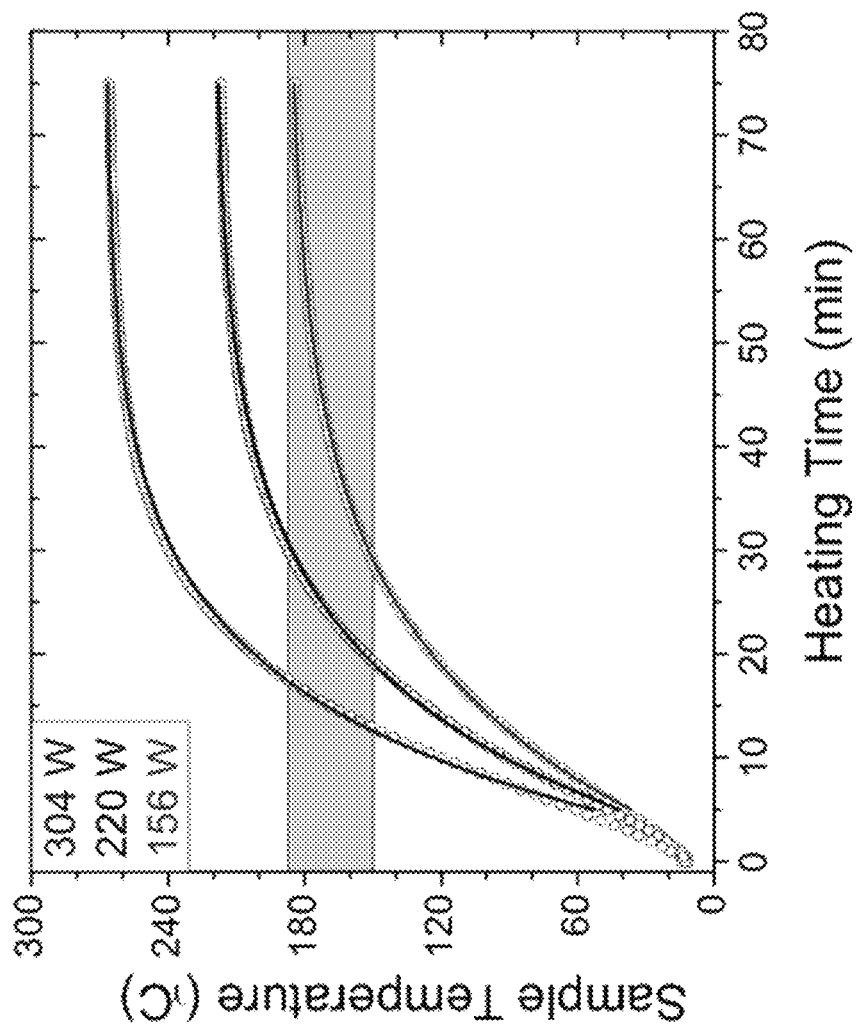
FIGS. 7A-7D show experimental dI/dV STS spectroscopy on the optimization of the heating conditions for the ALD $Al_2O_3$ process in order to minimize the formation of an IL.

To achieve this, a short-term dynamic pre-ALD heating strategy was developed and both the effect of sample temperature and sample heating time in the ALD chamber were probed. FIG. 7A shows the sample's temperature as a function of exposure time in a preheated ALD reaction chamber as measured with an in situ thermocouple in HV. Three different blackbody heater wattages for the ALD chamber were explored: 156 W, 220 W, and 304 W. As the ALD reactor is cylindrically shaped, a little under half this wattage was directed inwards towards the sample. Fits to the data of the form given in Eq. (2) found the sample's maximum temperature as t→∞ to be 187° C., 220° C., and 267° C. and the time constant, τ, was 17.2 min, 15.0 min, and 12.6 min for the three wattages respectively.

$$T(t) = T_i + (T_f - T_i)(1 - e^{-t/\tau}) \quad (2)$$

$T_i$ is the sample temperature prior to heating, $T_f$ is the steady-state temperature, and τ is the time constant of the fit.

As expected, increasing the blackbody heater wattage led to a significantly reduced time constant and an increase of the maximum sample temperature. This dynamic heating strategy has the advantage of bringing the sample's temperature to ALD-suitable temperatures very quickly at the expense of a non-constant temperature during ALD. Depending on the heater wattage and time position on FIG. 7A, the sample temperature can change at a rate as high as 10° C./min. Thus, this pre-heating strategy is best suited for ALD films which are only a few cycles thick.

Figure 7B:
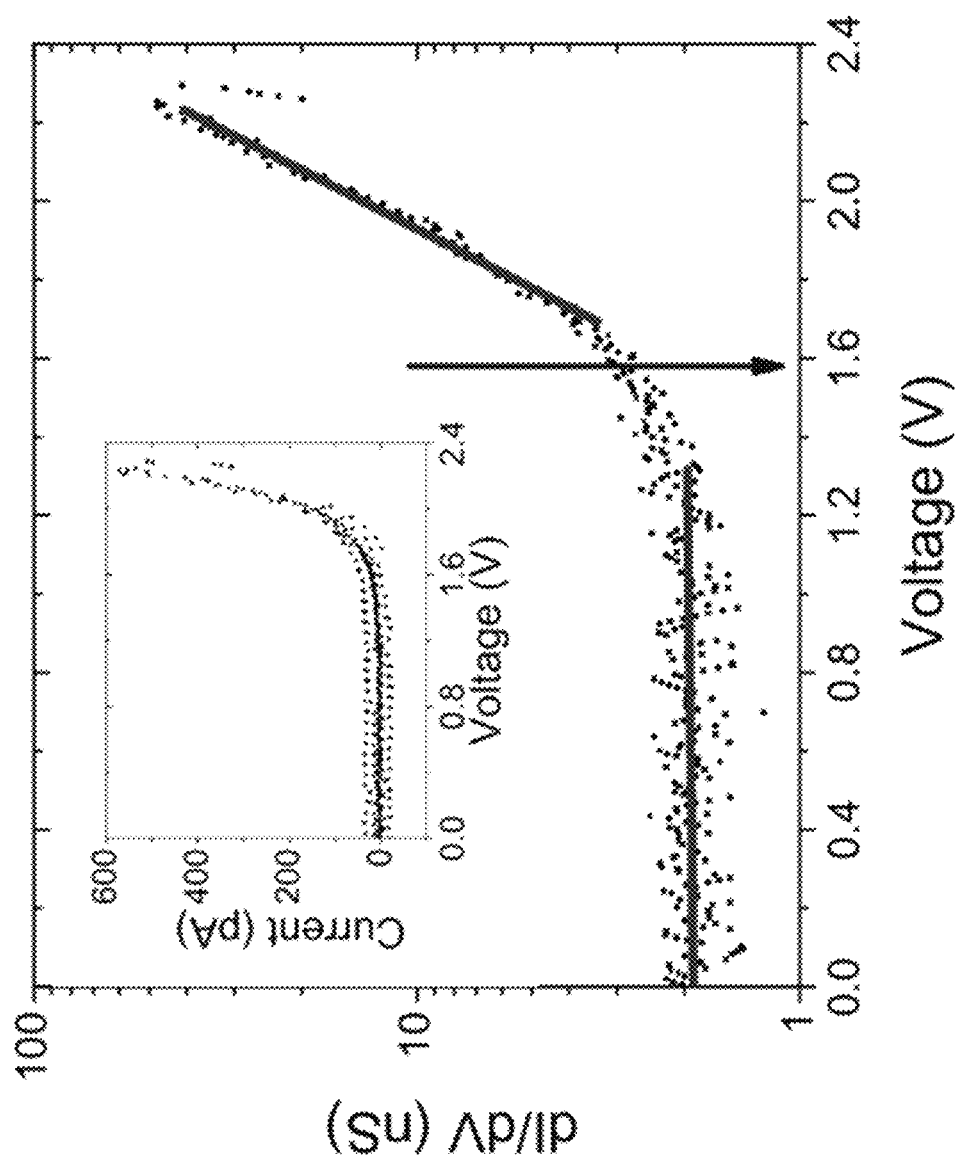

To experimentally examine the temperature dependence of the hydroxylating $H_2O$ pulse, in situ Scanning Tunneling Spectroscopy (STS) was utilized to probe the Local Density of States of the 1 cycle ALD $Al_2O_3$ samples with different temperatures during the $1^{st}$ $H_2O$ pulse. The bias voltage in STS dI/dV spectra corresponds to the electron energy, in eV, above the Fermi level. On the Log dI/dV scale, the band gap regime should be flat, and the conduction band should be roughly linear [29]. The barrier height, ($E_b$), defined as the onset of the conduction band, is reflective of the quality and density of $Al_2O_3$ within the tunnel barrier [9, 30]. Representative dI/dV and IV STS spectra are shown in FIG. 7B for a 1 cycle ALD $Al_2O_3$ tunnel barrier. As discussed in Example 1, ALD $Al_2O_3$ tunnel barriers have $E_b$ values which are significantly higher than the industry standard thermal $AlO_x$ tunnel barrier.

Figure 7C:
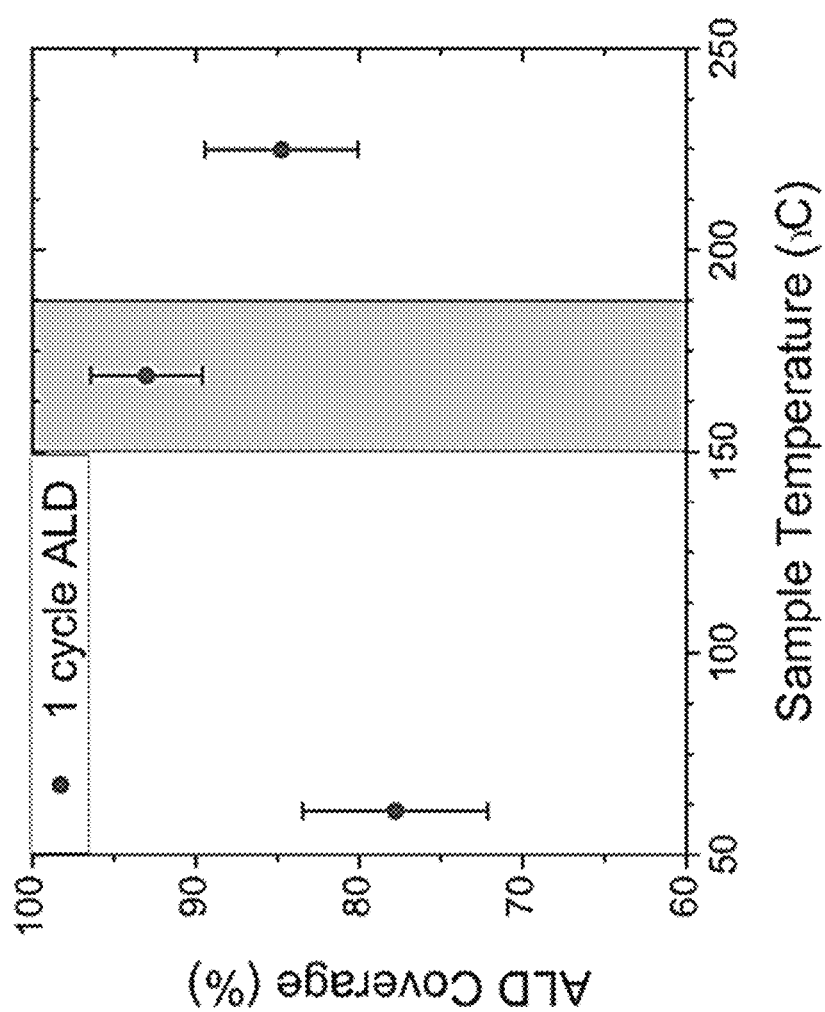

FIG. 7C shows the ALD $Al_2O_3$ coverage on the Al surface as a function of sample temperature during the start of ALD. The samples were all 1 ALD cycle and the ALD coverage was defined as the percent of STS spectra which showed evidence of a tunneling barrier with an $E_b$>1 eV. Barrier heights <1 eV were considered to be thermal $AlO_x$ which typically has an $E_b$ of ~0.6-1 eV [6, 31]. It is noted that in this atomically-thick regime, any IL can significantly lower $E_b$ into the thermal $AlO_x$ regime. Interestingly, the $E_b$ was constant for these 3 samples with a value of ~1.5 eV. What is clear from FIG. 7C is that a maximum in ALD coverage at ~93% occurs between 150° C. and 190° C. This maximum coverage corresponds to the ideal temperature range for the $H_2O$ hydroxylation pulse. This range is marked with a grey box in FIGS. 7C and 7A. In the low temperature regime, (<150° C.), the ALD coverage drops down to ~78%. It is postulated that some of the $H_2O$ from the $H_2O$ pulse did not dissociate into OH⁻ and H⁺. This follows what has been observed in AIMD simulations in Example 1. It is postulated that the TMA was not able to nucleate on those locations on the Al surface which had a $H_2O$ molecule. As a result of poor or no TMA nucleation, $Al_2O_3$ did not grow. However when the TMA does find an OH⁻ on an Al surface, it does nucleate and the tunnel barrier is still of high quality (high $E_b$). In the higher temperature regime (>190° C.) the ALD coverage was ~85%. At these higher temperatures it is likely that some OH⁻ groups have dissociated into O⁻ and H⁺. The now free oxygen ions will diffuse into the Al to form a thermal $AlO_x$ IL. This analysis is supported by FIG. 6A (II) and Example 1. This thermal $AlO_x$ IL, as already discussed in FIG. 6A (II), will provide steric hindrance for the TMA-OH⁻ reaction in eq. (1), thus accounting for the drop in the observed ALD coverage. However, this OH⁻ dissociation must not be too severe as $E_b$ would have decreased if a significant thermal AlOx IL formed.

Figure 7D:
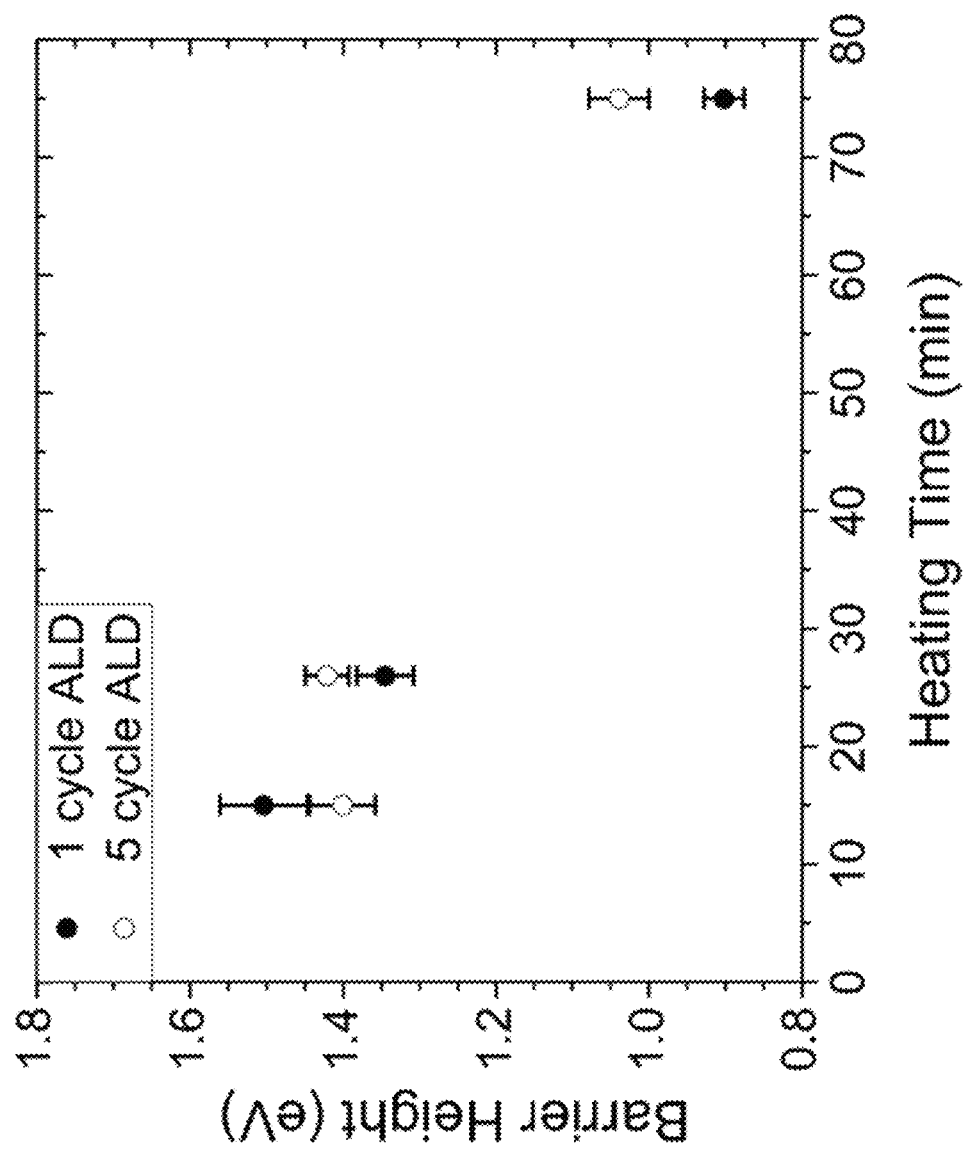

The possibility still remains that an IL may form from exposure to trace oxygen and $H_2O$ in the ALD chamber during the time it takes to heat the sample to this temperature window of 150° C. to 190° C. FIG. 7D shows the measured $E_b$ for both 1 cycle ALD $Al_2O_3$ and 5 cycle ALD $Al_2O_3$ tunnel barriers as a function of heating time. The sample temperature at the start of ALD was all within the temperature window defined in FIG. 7C. It is worth noting that the ALD coverage was constant with sample heating time with values >90%. In other words, each sample in FIG. 7D had a $H_2O$ hydroxylation pulse which efficiently coated the Al surface with $OH^-$. Due to the tunnel barrier thicknesses relative to any IL, the 1 cycle ALD $Al_2O_3$ samples probed the IL. From the 1 cycle ALD sample, one can see a roughly linear drop in $E_b$ from a value of 1.5 eV to 0.9 eV over the course of one hour of extra heating (15 min to 75 min). The rate that $E_b$ drops is very roughly ~10 eV/min of heating. From FIG. 7D it can be seen that an IL is indeed forming when the sample is in the ALD chamber prior to ALD. Also, it is evident that some IL still remains when the sample is heated for just 15 min. Shortening the heating time may lead to further $E_b$ improvement. However, heating wafers for MIMTJs through a temperature differential of ~150° C. for times significantly less than 15 min is unlikely to provide an $E_b$ improvement which warrants such engineering efforts.

When these tunnel barriers are grown thicker, the contribution of the interface to tunneling reduces. Therefore at 5 cycles ALD (~0.6 nm) in thickness, the STS dI/dV spectra are primarily probing the $Al_2O_3$ density rather than the disorder at the Al interface. As can be seen in FIG. 7D the 5 cycle ALD $E_b$ did not change significantly between 15 min and 26 min in the ALD chamber. However, a clear difference in the 5 cycle ALD $E_b$ was observed when the heating time was increased to 75 min. Evidently, there must have been some fairly significant IL that formed, during this long heating time, i.e., significant enough to impact the overall ALD $Al_2O_3$ growth similar to the schematic in FIG. 5F. However, when the sample was heated for only 15 min, the 1 cycle ALD $E_b$ was actually greater than the 5 cycle ALD $E_b$. This trend was reversed for 26 min heating. Evidently, some transition took place during those extra 11 min of heating (from 15 min to 26 min). As the tunnel barrier is grown thicker, the internal structure should begin to resemble bulk $Al_2O_3$ which has a band gap of ~8.8 eV. As the ALD $Al_2O_3$ thickness is reduced, $E_b$ is expected to decrease due the IL's contribution to tunneling. To explain this observed increase in $E_b$ from 5-cycle to 1 cycle, there must be some increase in the $Al_2O_3$ density of the 1 cycle ALD tunnel barrier. It is therefore conceivable that the defect-density and $Al_2O_3$ density limitations of the ALD $Al_2O_3$ process were reached. In the 1 or few ALD cycle range, the method may be approaching $\alpha$-$Al_2O_3$-like densities.

Figure 9A:
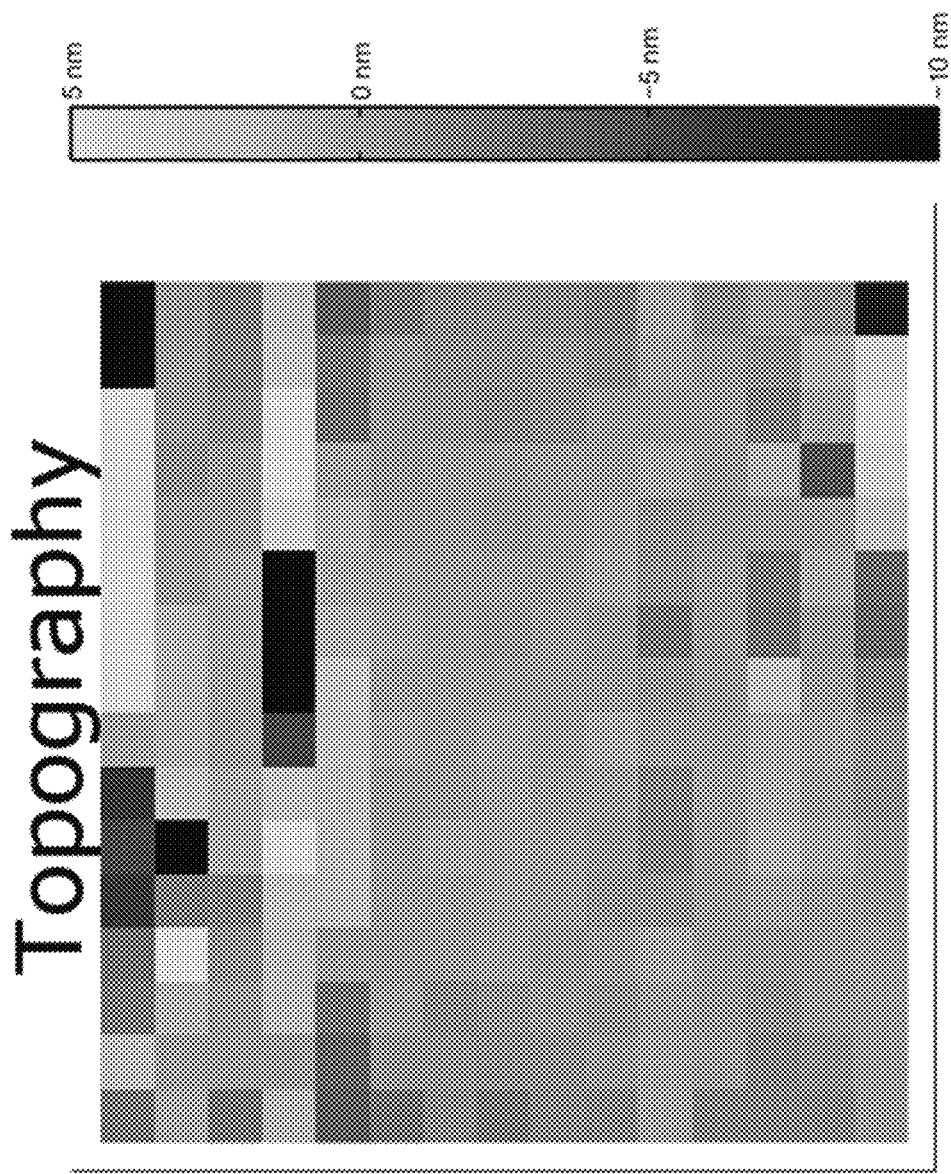
FIGS. 9A-9D show STS imaging of a 32 nm×32 nm area for a 1-cycle ALD $Al_2O_3$ tunnel barrier. At each pixel (2 nm in size), the STM records the topography (FIG. 9A) and then ramps the bias voltage up-down to generate dI/dV spectra.
Figure 9B:
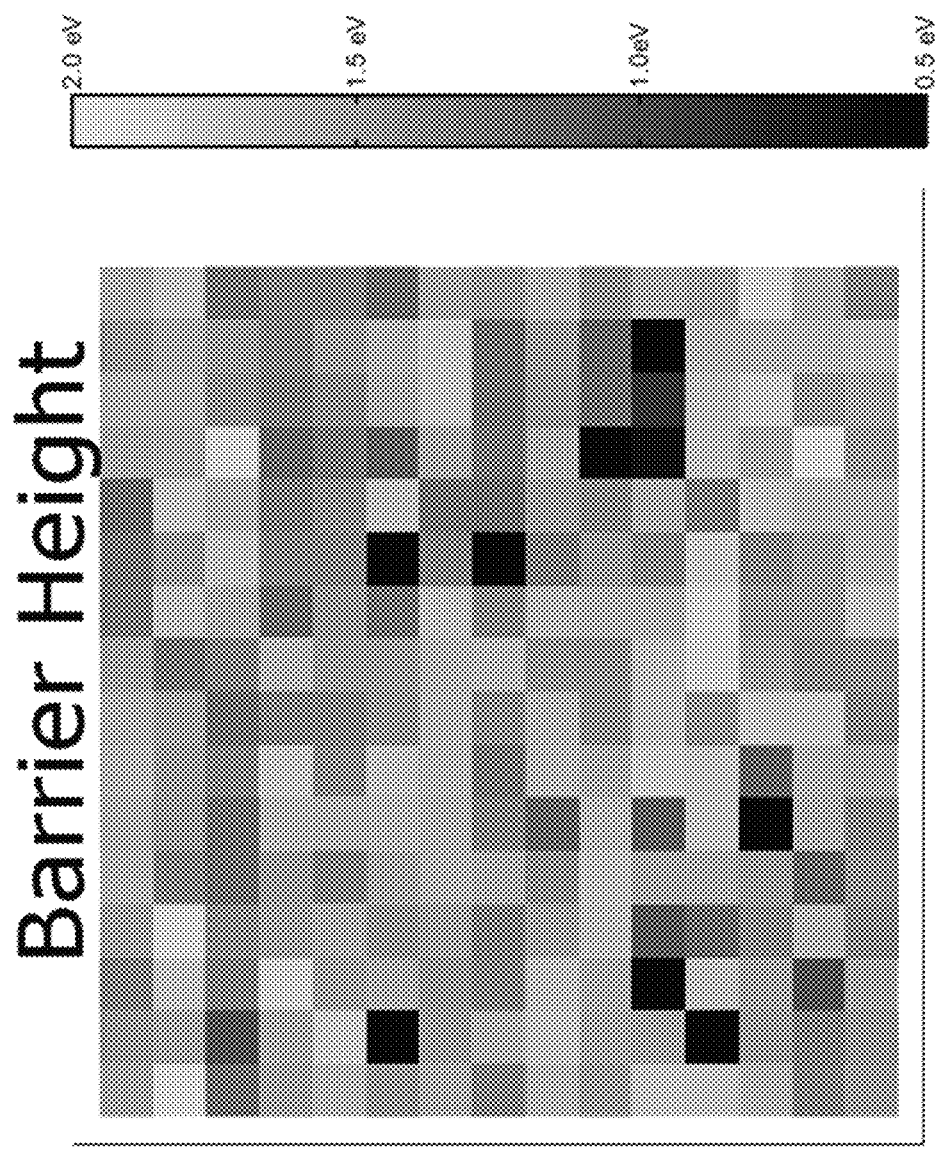
Figure 9C:
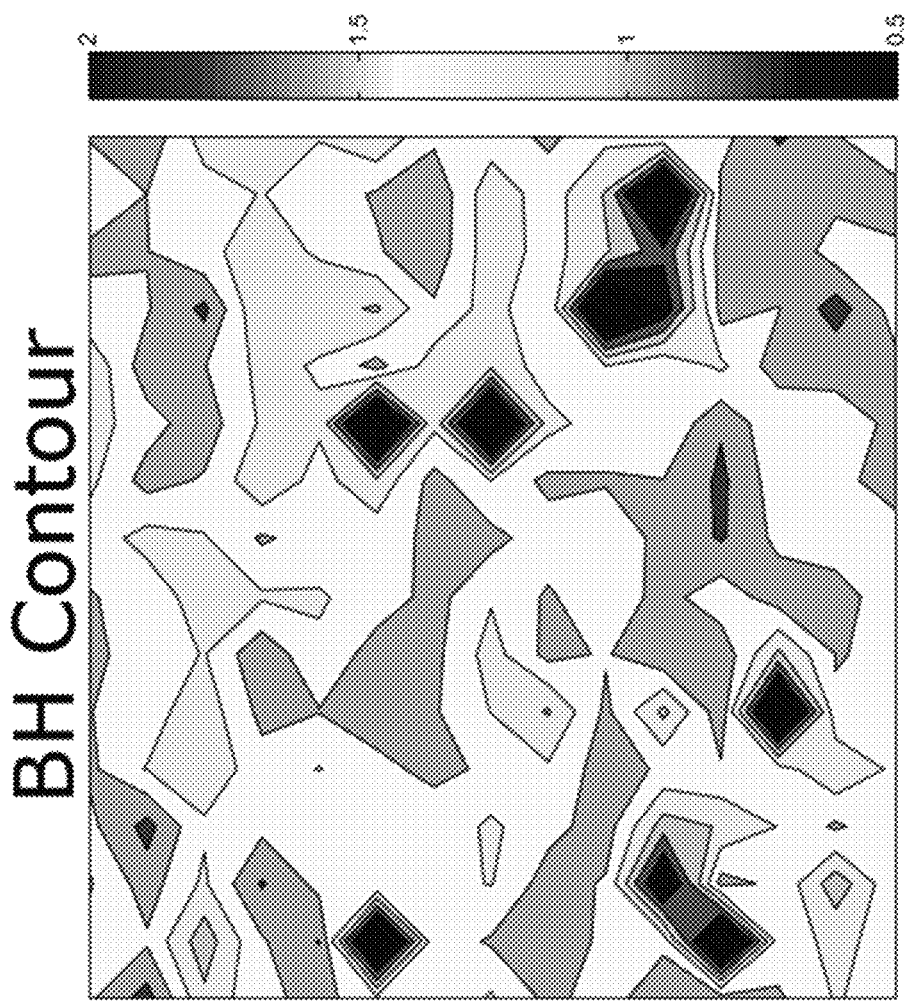
Figure 9D:
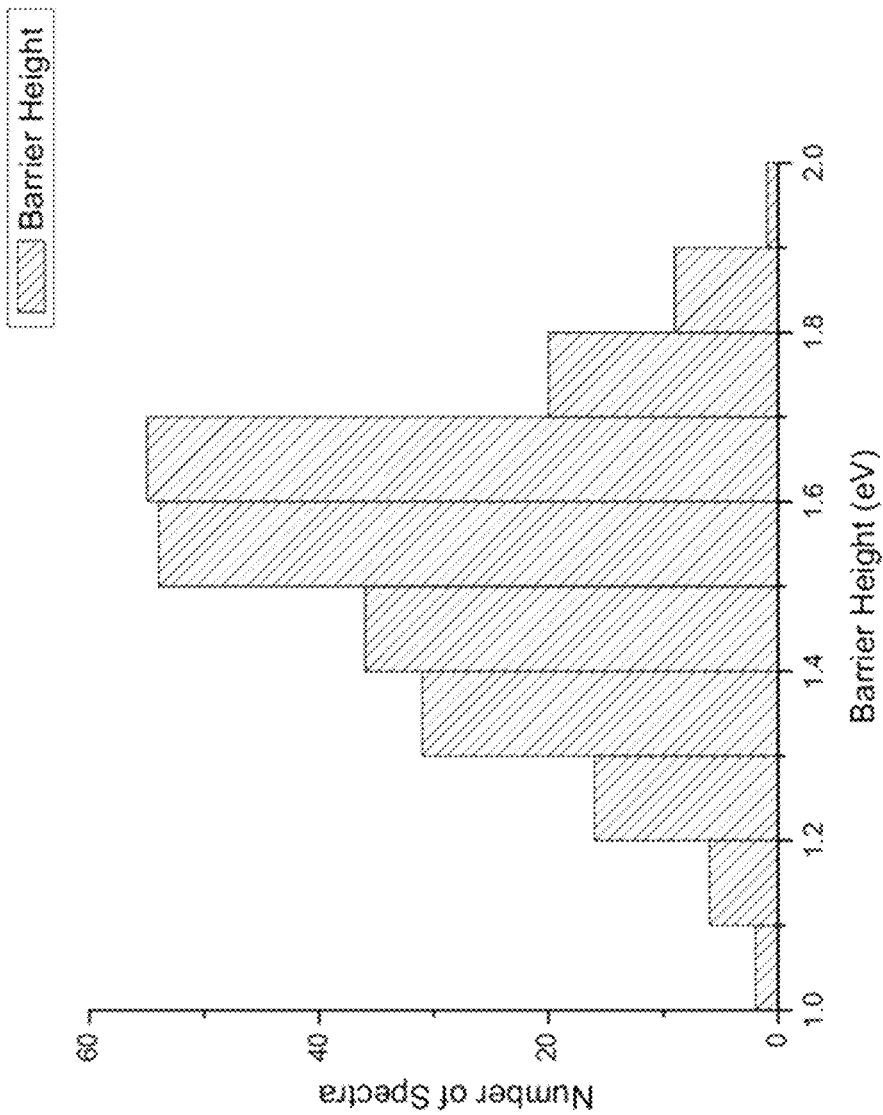

However, aside from $E_b$ there are additional requirements that a tunneling barrier must fulfill to serve as a useful insulating layer for MIMTJs. That is, that the insulator the ALD $Al_2O_3$ film must be spatially uniform across the junction area and must be pinhole-free through the barrier thickness. The conformal nature of ALD gives ALD $Al_2O_3$ tunnel barriers a unique advantage in special uniformity over PVD-deposited or thermally oxidized tunnel barrier such as $AlO_x$. However, the pinhole-free nature of ALD $Al_2O_3$ is still in question. Also of interest is the spatial uniformity of the quality of the tunneling barrier, namely $E_b$. To examine these properties in the ALD $Al_2O_3$ tunnel barriers, the STM was scanned over a small area of just 32 nm in FIGS. 9A-9D. At each pixel in FIGS. 9A and 9B, the STM recorded the topography, paused briefly, and then ramped the bias voltage up-down several times to produce I-V and dI/dV spectroscopy images. FIG. 9A shows the topography and FIG. 9B shows the calculated tunnel barrier height.

Figure 8A:
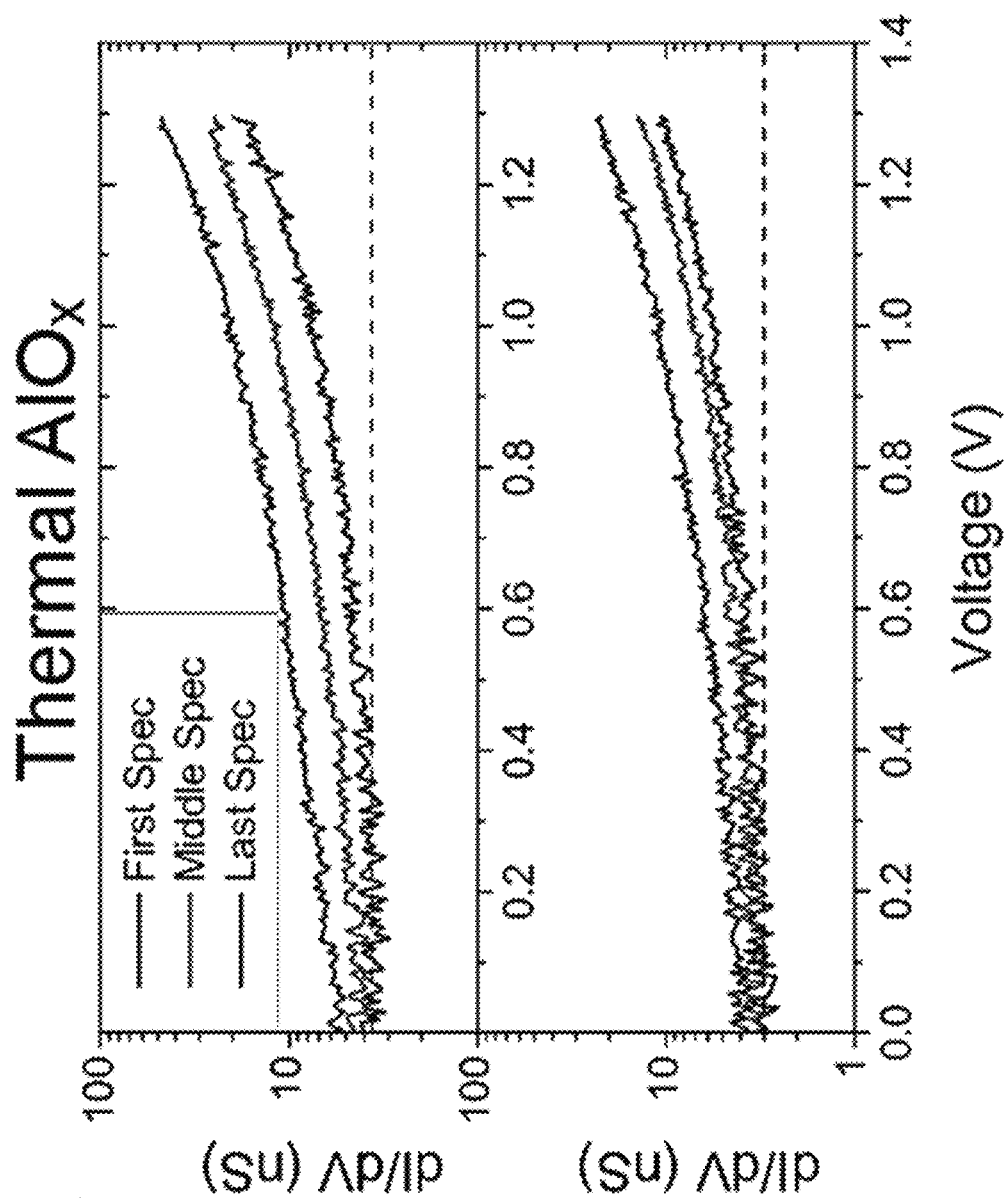
FIGS. 8A-8D show STS results to illustrate the type of breakdown behavior observed. The types of dielectric breakdown behavior observed as the STM bias voltage is ramped up and down are shown in FIG. 8A for the thermal $AlO_x$, tunnel barrier, in FIG. 8B for the ALD $Al_2O_3$ tunnel barrier without an IL, and in FIG. 8C for the ALD tunnel barrier with an IL.

The behavior of these insulating films under intense dielectric stress (>10 MV/cm) can provide additional clues on the nature and significance of the Al—$Al_2O_3$ interface. Many of the thermal and ALD spectra broke down under the local STM-induced electric field as the STM bias was ramped up and down many times. Thermal $AlO_x$ is known to breakdown (BD) in a gradual, soft manner as disorder increases within the tunnel barrier through defect migration. Eventually the STS spectrum becomes linear/metallic. [9, 30, 32, 34-36] Interestingly, this soft BD effect was observed in all of the films, but at varying severity. FIGS. 8A-8D illustrate the commonly observed types of BD behavior observed for three types of films at atomically-scale thicknesses where the contribution of the IL is most significant. Thermal $AlO_x$ films broke down in a typical soft BD manner with a significant increase in the zero-voltage conductance and a spectral shape which becomes near-linear. The zero voltage conductance and the slope of the dI/dV spectra in the band gap regime is related to the tunnel barrier leakage current, which must be minimized in MIMTJ devices[37]. In most cases of BD, the thermal $AlO_x$ films had a significant increase in the zero voltage conductance (FIG. 8A top). The $2^{nd}$ most observed form of the thermal $AlO_x$ films saw mostly just an increase in the dI/dV slope in the band gap, indicative of a slightly less severe breakdown event. (FIG. 8A bottom). In either case, exposure to a high electric field gradually increased the defect density within the film which increased the conductance of the tunnel barrier.

Figure 8B:
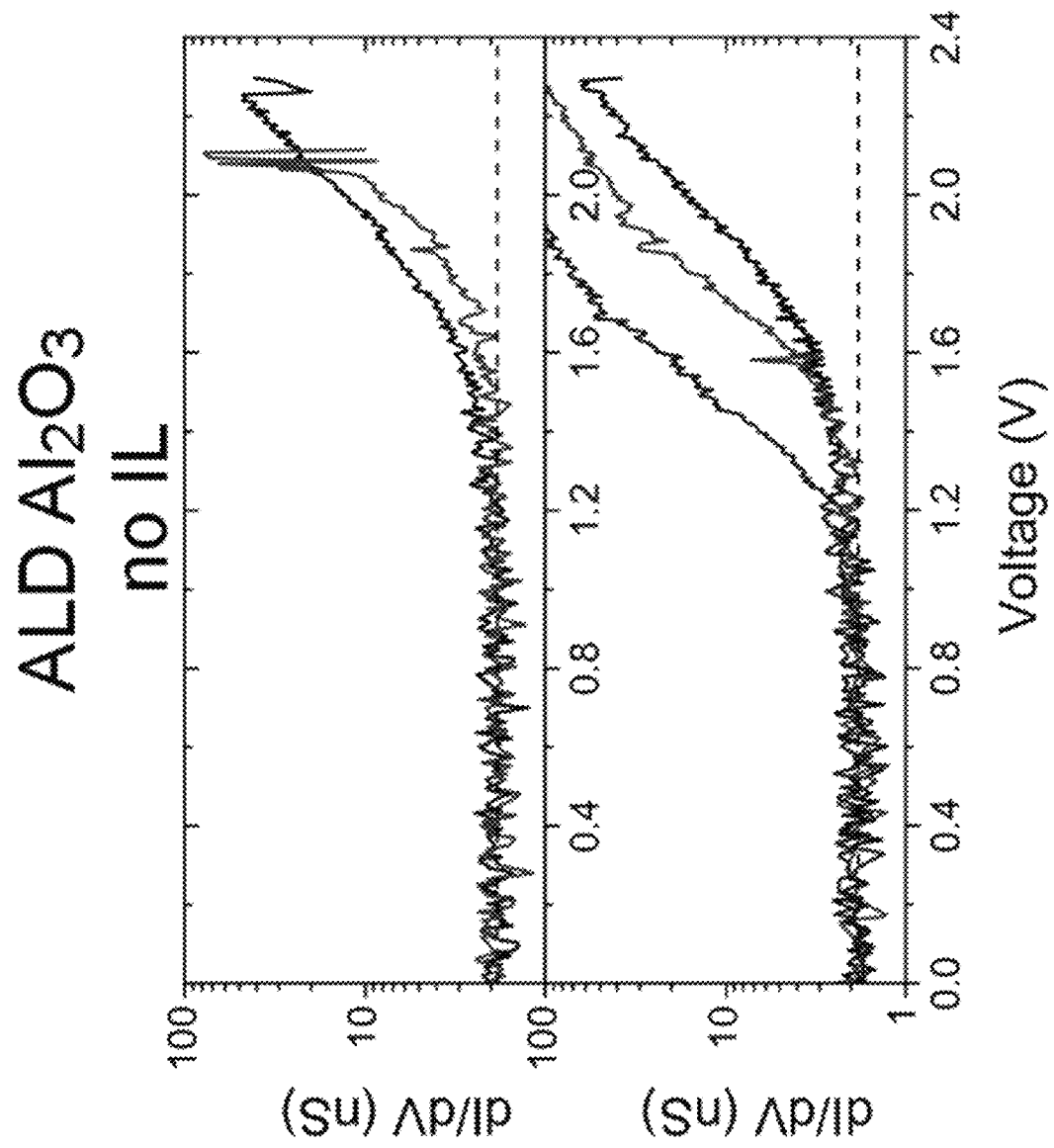
Figure 8C:
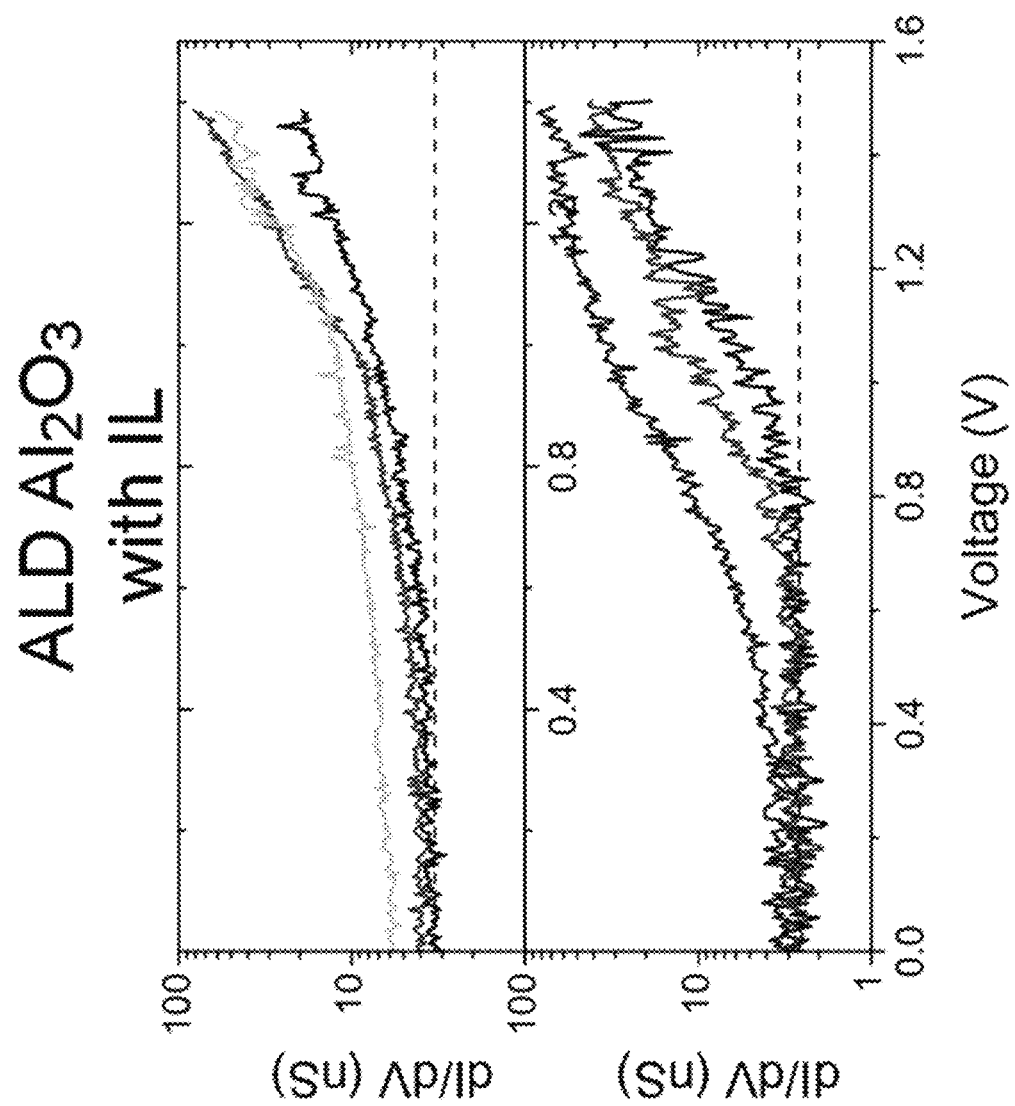

In contrast, ALD films without an IL displayed a very different form of BD. FIG. 8B, top shows a hard BD event defined as when there was a sudden, massive increase in tunneling current, up to the STM saturation current. Therein after, the spectra were metallic. This form of dielectric BD is typical of epitaxial $Al_2O_3$.[34] Rather than defect migration within the barrier (soft BD), hard BD represents the breaking of the $Al_2O_3$ bond. The presence of hard BD in these ALD $Al_2O_3$ tunnel barriers suggests a homogenous $Al_2O_3$ film without other stoichiometric forms of $AlO_x$. Some soft BD was also observed (FIG. 8B, bottom), but not severe enough to affect the leakage current through the tunnel barrier. FIG. 8C shows the breakdown behavior for ALD films with an IL. Both of these spectra (top) and (bottom) show soft BD behavior similar to the thermal $AlO_x$ case, although not quite as severe. This BD behavior further demonstrates that these tunnel barriers have an IL. The BD behavior of this composite IL-$Al_2O_3$ tunnel barrier suggests that the chemistry of the IL is primarily comprised of a thin layer of thermal AlOx. In addition, the thickness of this $AlO_x$ IL is evidently non-uniform. A small fraction of these tunnel barriers with an IL had hard BD events as well. In order to further optimize these ALD $Al_2O_3$ films, it is therefore prudent to quantify this non-uniformity of the Al—$Al_2O_3$ IL.

Figure 8D:
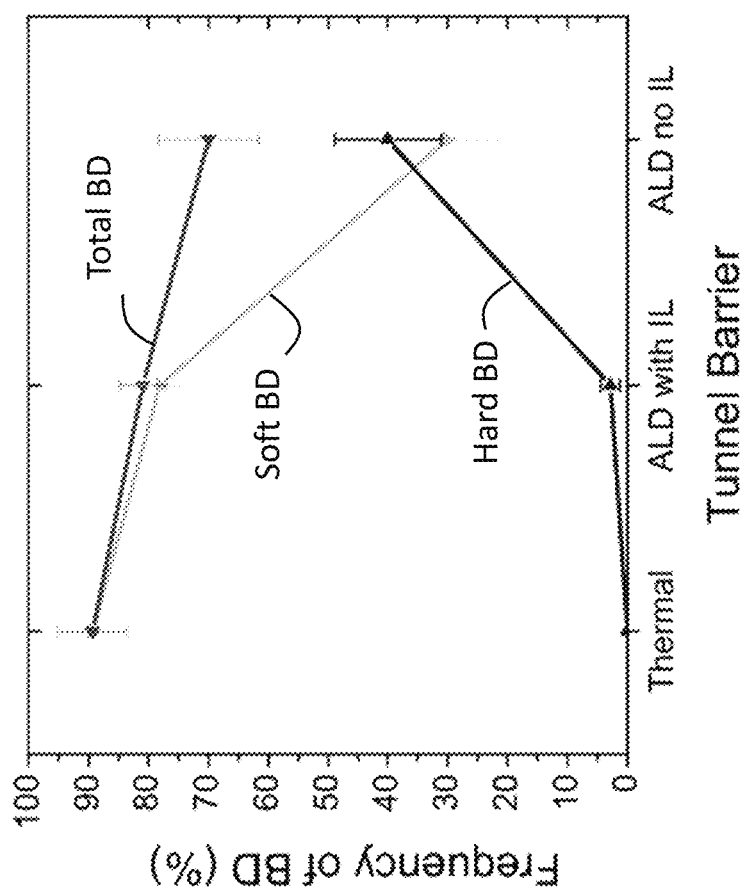

A simple statistical study was done to shed light into how often these BD events occur in the three types of different atomically-thin tunnel barriers. Numerous STS dI/dV spectra were taken over random positions on the sample surface separated by at least 100 nm and the frequency of the BD events for each type of tunnel barrier is shown in FIG. 8D. The thermal $AlO_x$ tunnel barrier had the largest number of soft BD events among the three, as expected for a defective film. In fact, no hard BD events were observed. The ALD $Al_2O_3$ sample with an IL had a decreased frequency of soft BD and total BD events compared to the thermal $AlO_x$ tunnel barrier. As the IL was reduced, hard BD events increased, soft BD events decreased, and the total number of BD events decreased. From FIGS. 8A-8D, one can observe that there is clearly an improved M-I interface in the "ALD no IL" films both in the thickness of the IL (frequency of BD) and the defect density (severity of soft BD) at the interface. However, some small IL may still be present as roughly 30% of the ALD film had STS spectra with minor soft BD.

Conclusions

In conclusion, exposure of the Al surface to trace oxygen or $H_2O$ led to a distorted Al surface and IL formation. By reducing the time the sample spent pre-heating for ALD at elevated temperatures, the extent of IL formation was reduced. This IL reduced the $Al_2O_3$ density during the first ALD cycle, or atomic-layer. This reduced $Al_2O_3$ density led to a lower tunnel barrier height and increased the disorder within the atomically-thin film. This defective interface also led to a slight reduction in the tunnel barrier quality as the film thickness was increased into the ultrathin thickness regime of 0.5-2 nm. Remarkably, ALD sample "without an IL" had consistent STS spectra and $E_b$ even as the thickness was pushed down to the atomically-thin limit of 1 ALD cycle. This $E_b$ consistency with thickness confirms that no significant IL is present and shows that an MIMTJ with a high-quality, atomically thin ALD $Al_2O_3$ tunnel barrier is possible. However, some disorder may remain at the Al—$Al_2O_3$ interface or within the ALD $Al_2O_3$ tunnel barrier. This disorder is evident by the number and severity of soft breakdown events observed in the 1 cycle ALD $Al_2O_3$ films "without an IL". This disorder may have been caused by either $H_2O$ dissociation into O and H during the first ALD $H_2O$ pulse or may be disorder within the ALD $Al_2O_3$ film itself. In either case, this disorder was very minor and did not measurably impair the tunneling properties such as $E_b$.

Example 3

Introduction

Magnetic Tunnel Junction (MTJs) are the building blocks for non-volatile magnetoresistive random access memory (MRAM) and are created by sandwiching an ultrathin insulator between two ferromagnetic layers[1-4]. MRAM has significant performance and power consumption advantages over standard dynamic random access memory or flash memory with fast read, write times and a memory state which is retained without power draw[2, 4, 5]. MTJs operate with a differing spin-polarized electron tunneling resistance for parallel and antiparallel magnetization of the ferromagnetic layers. This Tunneling Magneto Resistance (TMR) is critical to MTJ device performance and is particularly sensitive to the quality and thickness of the insulating layer. High TMR values are desirable for greater signal to noise ratio, lower power consumption, higher speed, and large design margin for device fabrication[6]. Current state of the art MTJs have TMR values of 10-70% for $AlO_x$ tunnel barriers[7, 8] and at least a factor of three higher for crystalline MgO tunnel barriers[5, 9, 10].

The recent progress in MTJs fabrication using ALD insulators uses ex situ deposition of 2-5 nm thick ALD tunnel barriers in order to reduce the leakage current which indeed decrease the spin tunneling[11-14]. The transport measurements for epitaxial MgO show barrier heights in the range of 0.4-0.9 eV[5, 15, 16] due to the presence of oxygen vacancy defects in MgO. This reported barrier height for epitaxial MgO is much lower compared to ultrathin ALD $Al_2O_3$ tunnel barrier height ~1.5 eV[17, 18]. The low barrier height on MgO and larger tunnel barrier thickness, indicates a poor quality tunnel barrier with a high density of defects.

While MTJs with MgO tunnel barriers have excellent TMR values, they require a complex sample fabrication process which is incompatible with many industry thermal budgets and results in poor uniformity across the wafer[20-24].

The $AlO_x$ tunnel barriers fabricated using thermal or plasma assisted aluminum oxidation are significantly more compatible with industry applications, however defects within tunnel barrier and poor interface between metal-insulator results in an asymmetric structure. The electronic states tunneling through amorphous $AlO_x$ cannot preserve their symmetry due to coupling with the evanescent states in the tunnel barrier resulting in incoherent tunneling which significantly reduces the spin tunneling current[1]. As a figure of merit for MTJs, high TMR exceeding 100% is desirable for many practical applications of spintronic devices. The quality of the tunnel barrier may also be characterized using scanning tunneling spectroscopy (STS) and dI/dV curves to find the barrier height, which for thermal $AlO_x$ tunnel barriers is 0.82-1.20 eV at room temperature[25]. From these tunneling spectroscopy studies, it has been concluded that low-energy extended electron states in the very thin and disordered oxide layer causes a reduction in TMR[26].

In this Example, the in situ ALD $Al_2O_3$ process described in Examples 1 and 2 is adapted for MTJ devices by fabricating Fe/Al—$Al_2O_3$ bilayer structures with varying Al and $Al_2O_3$ thicknesses. In situ STS was used to examine the electron tunneling through the $Al_2O_3$ to quantify its quality as the Al layer was systematically reduced to determine if a defective interfacial layer (IL) formed. In tandem, ab initio Molecular Dynamics (AIMD) simulations were run to examine adapting the pre-ALD $H_2O$ pulse to produce OH groups directly on the Fe polycrystalline surface.

Methods

To create the metal-insulator structure for in situ STS, a trilayer of Nb (50 nm)/Fe (20 nm)/Al (x nm) was DC magnetron sputtered onto a Si/Au (50 nm) substrate at a deposition rate of 1.0 nm/s, 1.7 nm/s, and 0.5 nm/s. The Al thickness was varied in the range of 0-7 nm. After sputtering, the samples were transferred in situ to the ALD chamber under high vacuum where a pre-ALD $H_2O$ pulse hydroxylated the surface and a layer of $Al_2O_3$ was grown using the optimized ALD conditions discussed in Example 2, above. After ALD, the samples were in situ transferred under high vacuum to the STS chamber which had a pressure of about $1 \times 10^{-9}$ Torr. dI/dV spectra were taken over 100-200 random locations on the sample's surface using a mechanically-cleaved Pt—Ir tip with a voltage modulation of 30 mV at 5 kHz and a set point of 2 V, 200 pA. The tunnel barrier height was estimated by the intersection of two bisquare-method linear fits to ln(dI/dV) and the ALD coverage was defined as the percentage of locations which had dI/dV spectra consistent with ALD $Al_2O_3$ using the methods described in Examples 1 and 2, above. AIMD simulations for $H_2O$ molecules on the Fe (100), Fe (110), and Fe (111) surface were run under a constant volume and temperature ensemble as implemented in VASP code[30]. The Fe slabs were constructed using experimentally determined lattice parameters[31] and were adjusted in size to accommodate thermal expansion. A "water pool" was added to the top site of each Fe surface to simulate the pre-ALD $H_2O$ pulse. Additional details for the simulation procedure can be found in Examples 1 and 2, above.

Results and Discussion

Figure 10A:
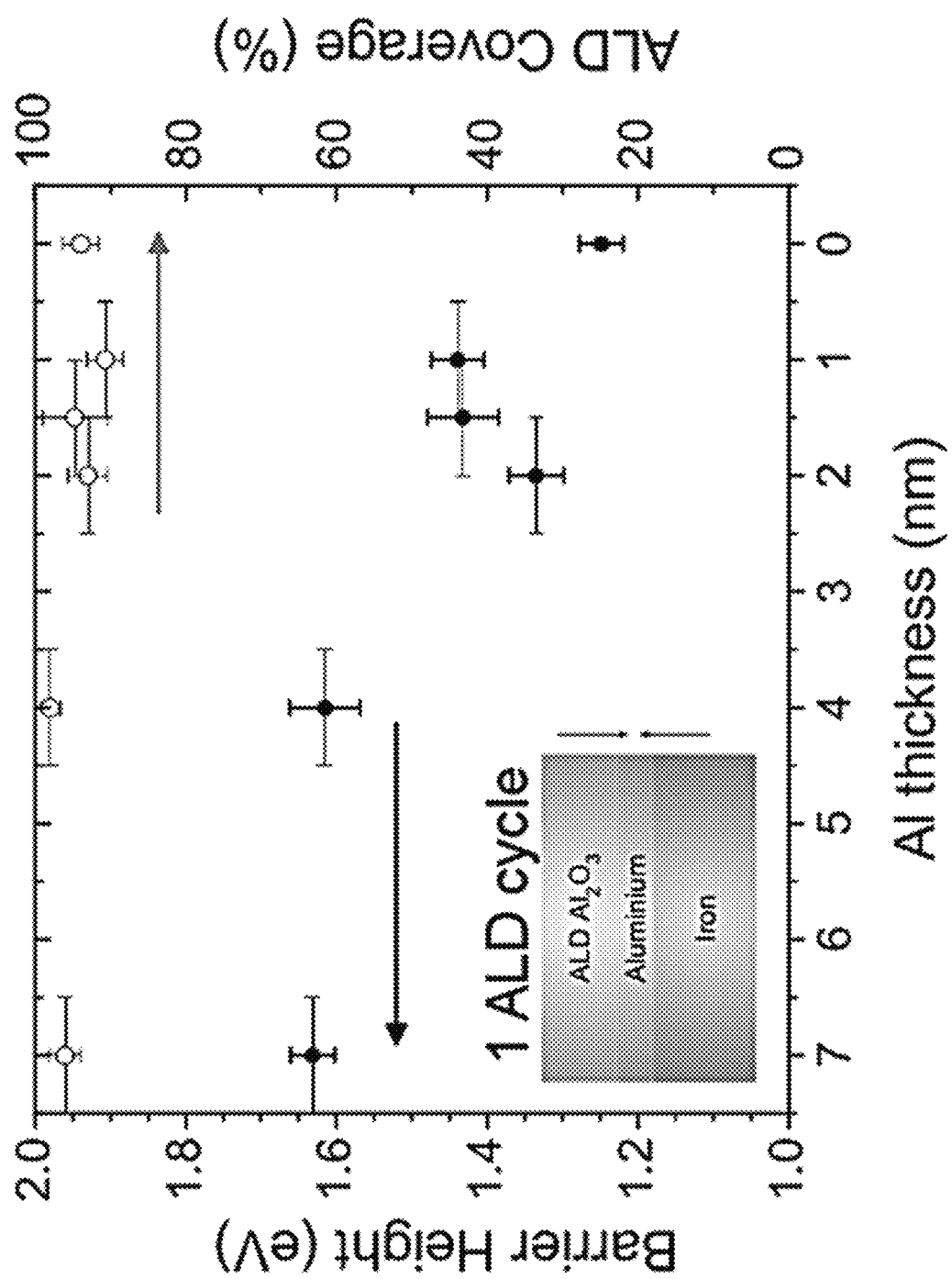
FIGS. 10A-10B show STS results for ALD growth of $Al_2O_3$ on iron (Fe) as a function of Al wetting layer thickness (FIG. 10A) and as a function of ALD cycle using a 1 nm Al wetting layer (FIG. 10B).

Spin-polarized electron scattering in the ALD $Al_2O_3$ MTJ will be strongly dependent on the aluminum thickness. Therefore, the first step towards adapting this in situ ALD $Al_2O_3$ process for MTJ devices is to reduce the thickness of the Al layer on Fe and to examine the resulting ALD $Al_2O_3$ quality. As shown in FIG. 10A, 1 cycle of ALD $Al_2O_3$ was grown on the Fe/Al structure (see the insert schematic) with various Al thicknesses. After $Al_2O_3$ deposition, in situ STS measured the barrier height, $E_b$, and ALD coverage on the surface. One cycle of ALD was chosen for its sensitivity to any issues with IL growth or poor ALD nucleation. The ALD $Al_2O_3$ $E_b$ value is identical to the case without the Fe layer when the Aluminum layer is greater than about 4 nm in thickness. However, when the Al thickness is reduced below 4 nm, the $E_b$ value decreases significantly from ~1.63 eV (7 nm Al) to ~1.44 eV (1 nm Al).

Figure 10B:
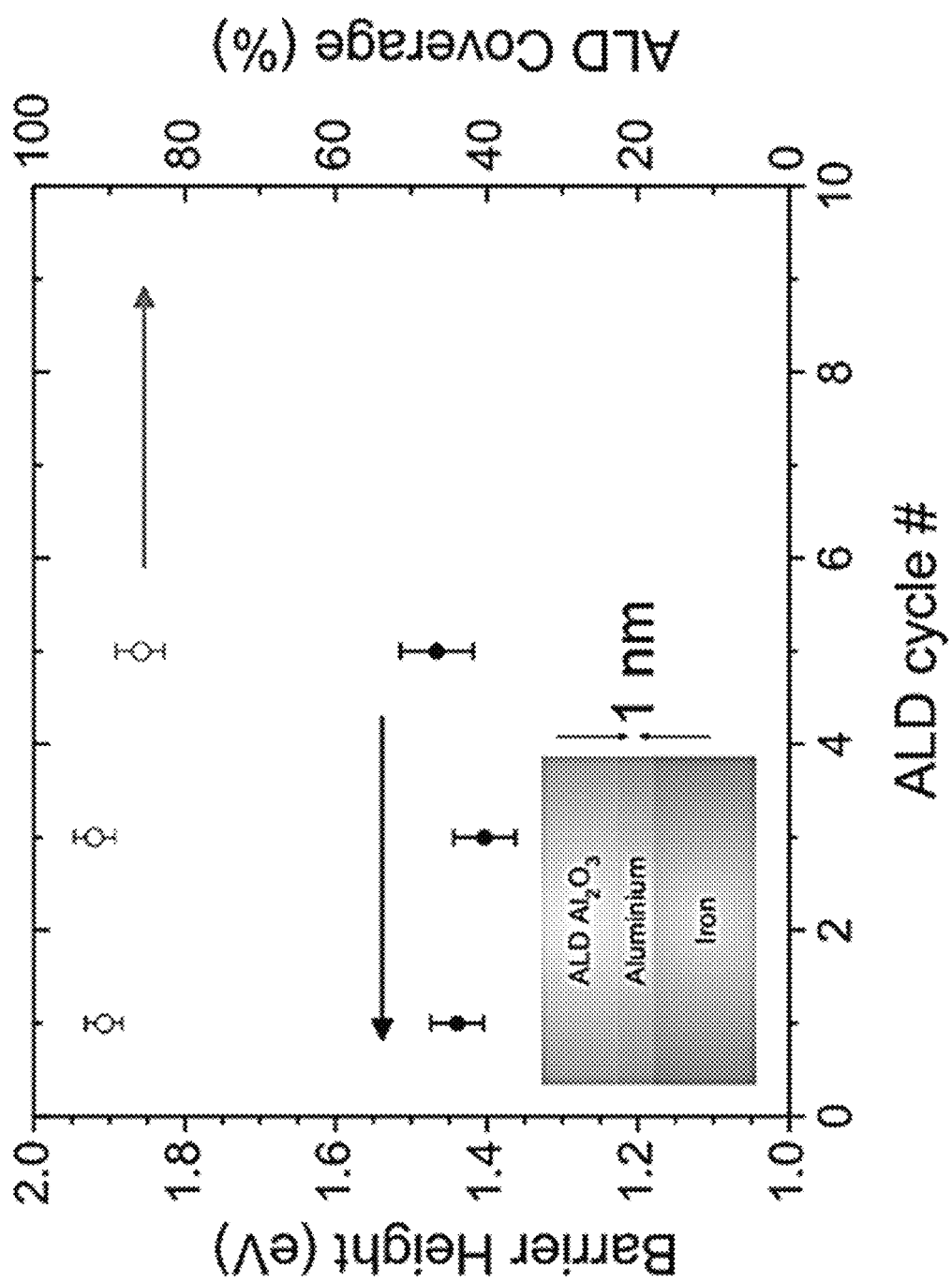

To eliminate the possibility that this $E_b$ reduction is due to the development of an $FeO_x$ IL, the ALD cycle number was varied with the Al thickness held constant at 1 nm. The resulting $E_b$ and ALD coverage is shown in FIG. 10B. If an $FeO_x$ IL formed, $E_b$ should increase with $Al_2O_3$ thickness. Instead, a constant $E_b$ and ALD coverage was observed as a function of $Al_2O_3$ thickness which indicates that the ALD $Al_2O_3$ density was reduced without inducing an IL. This reduction in $E_b$ may be due to a rough topography which can impair the hydroxylation of the aluminum surface with the $H_2O$ pulse.

This rough surface may be due to the formation of an Al—Fe intermetallic layer. AIMD simulations have shown that the thickness of the Al—Fe intermetallic layer depends strongly on the Fe orientation; Fe(111) being the most severe with an intermetallic layer thickness of around 0.5 nm[32]. However, these simulations were run at room temperature for simulated e-beam evaporation. Aluminum deposited by magnetron sputtering will have additional kinetic energy which may extend this intermetallic layer thickness into the 1 nm range. This Al—Fe intermetallic may significantly increase the surface roughness. Overall though, while some ALD $Al_2O_3$ quality was lost going from 7 nm to 1 nm Al on Fe, the resulting ALD $Al_2O_3$ tunnel barrier is still of excellent quality and is quite promising for MTJ devices.

What is particularly interesting about the results of FIGS. 10A and 10B is that it they reveal that ALD $Al_2O_3$ can still be grown in the absence of Al (the wetting layer) on Fe. In fact, the $E_b$ value for ALD $Al_2O_3$ grown directly on Fe is quite high, with a value of ~1.25 eV. Achieving ALD $Al_2O_3$ growth directly on Fe is a game changer as it precludes spin-current scattering though a thin Al layer. To further examine the ALD growth of $Al_2O_3$ directly on Fe for MTJs, AIMD simulations were run to simulate the pre-ALD $H_2O$ pulse on different orientations of Fe (data not shown). It is found that a hydroxylated Fe surface can be achieved with a pre-ALD $H_2O$ pulse. However, the effectiveness in generating adsorbed hydroxyl groups ($OH_{ads}$) without dissociation into oxygen does depend upon the Fe surface orientation. The Fe(110) and Fe(100) surfaces both result in $OH_{ads}$ creation without much oxygen formation whereas the Fe (111) surface leads to a high amount of oxygen. IL formation from the pre-ALD $H_2O$ pulse is therefore likely on the Fe (111) surface and this explains the reduced $E_b$ when in situ ALD $Al_2O_3$ is grown on Fe instead of Al. Therefore, in embodiments of the present methods, the tunnel barrier layers are formed on (i.e., directly on) a single-crystalline Fe(100) surface, a single-crystalline Fe(110) surface, or a polycrystalline Fe(100)/Fe(110) surface.

Figure 11A:
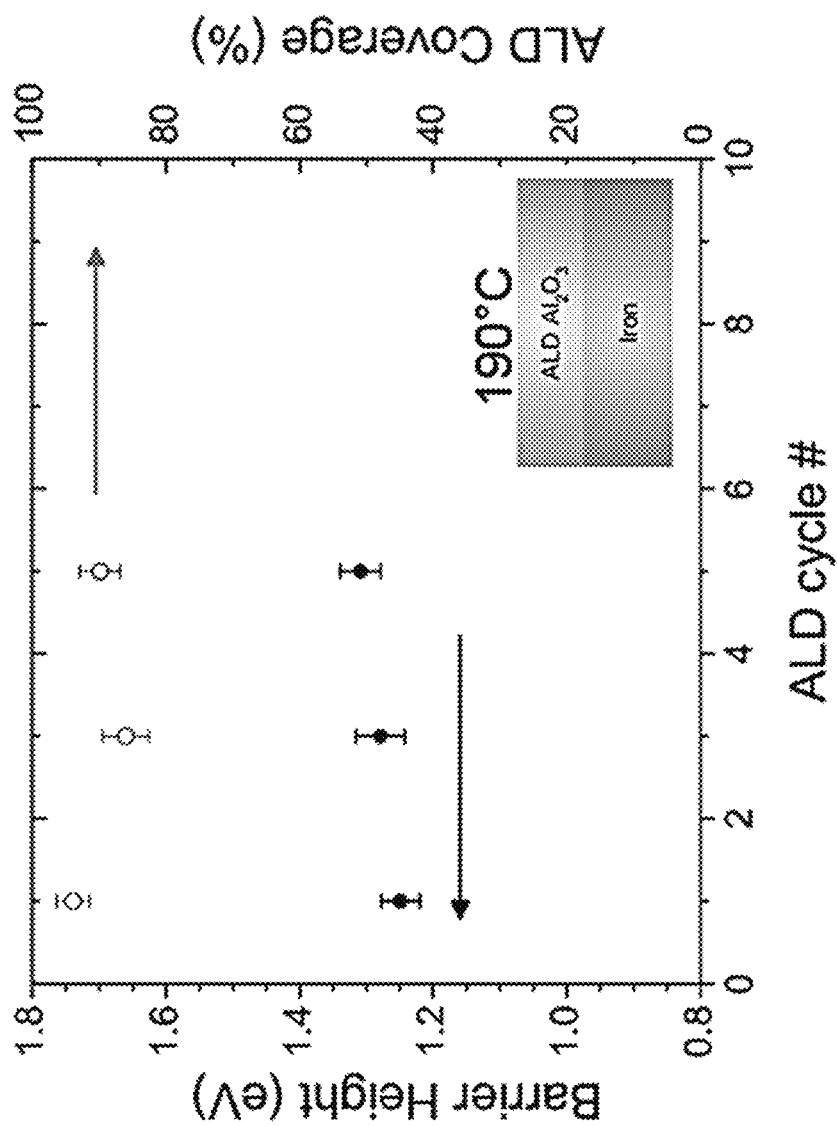
FIGS. 11A-11B show STS results for ALD growth of $Al_2O_3$ on iron (Fe) as a function of ALD cycle using a pulse temperature of 190° C. and no Al wetting layer (FIG. 11A) and as a function of pulse temperature using 1 ALD cycle and no Al wetting layer.

To examine what degree IL formation occurs when in situ ALD $Al_2O_3$ is grown on Fe, ALD $Al_2O_3$ films were grown on Fe with varying cycle numbers. As shown in FIG. 11A, STS reveals a high, nearly constant, coverage of ALD on the Fe surface with a monotonically increasing (though still approximately constant) $E_b$ as a function of ALD cycle number. These results are consistent with the absence of an interfacial layer.

Up to this point, the previously optimized ALD growth conditions ($H_2O$ pulse length and heating time (which affects pulse temperature)) for growing ALD on Fe have been used. Therefore, heating times were adjusted to determine the effect on ALD growth on Fe. Using the heating curve found empirically in Example 2, above, and the initial temperature (of the sample prior to heating) and heating power used for previous samples, three samples were fabricated and analyzed with different heating times.

Figure 11B:
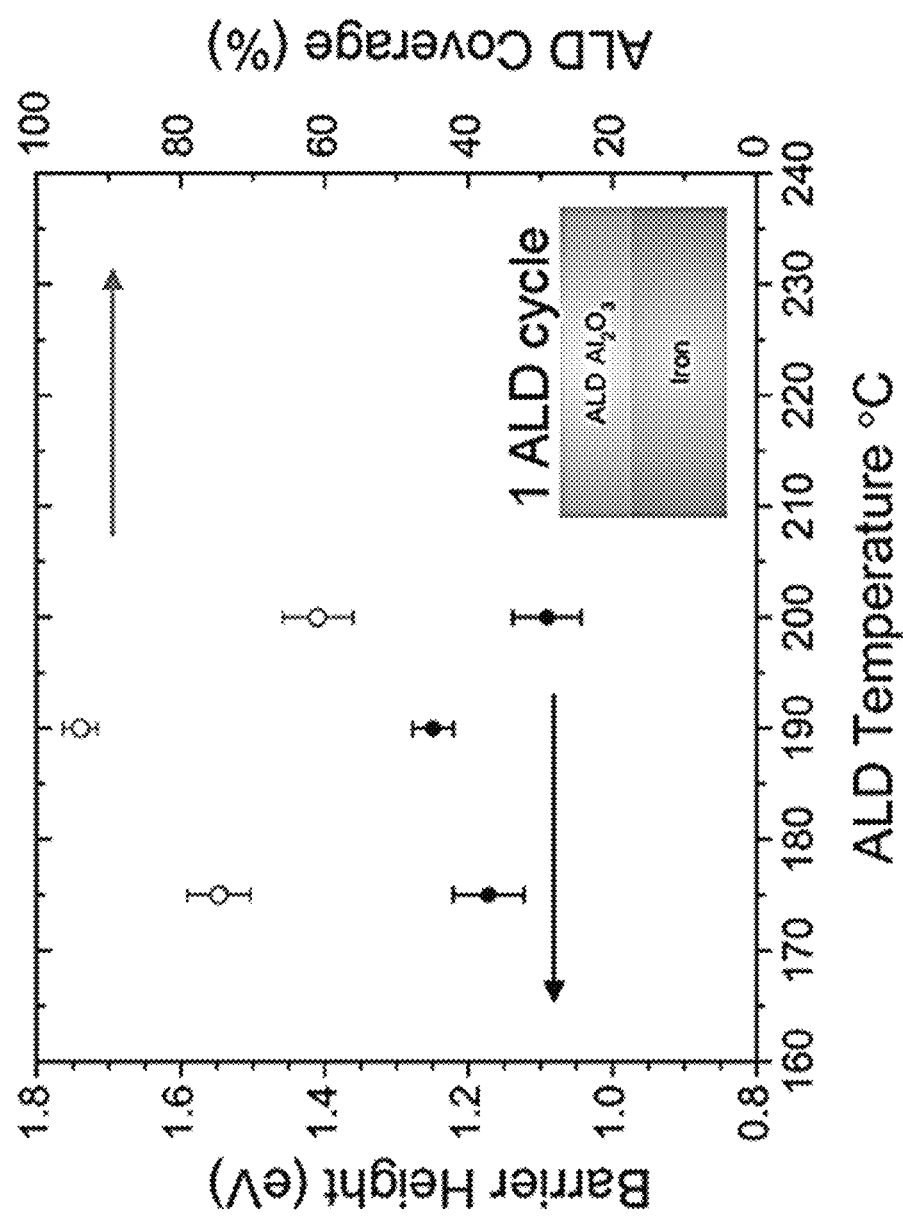

Each sample was fabricated with the same makeup as the previous samples (i.e. Nb/Fe/1 cycle of ALD); the three heating times chosen were 13, 15, and 17 minutes with pulse temperatures of 175, 189, and 200° C. respectively. As shown in FIG. 11B, 15 minutes (189° C.) gave the optimal ALD results, with an $E_b$ of 1.249±0.029 eV and ALD coverage of 93.9±2.4%. At 13 minutes of heating (175° C.), fewer OH groups formed on the surface frustrating the ALD process. When the heating time was 17 minutes (200° C.), it is possible that there is more FeOx formation due to the dissociation of OH and $H_2O$ molecules into 0 atoms as described in Examples 1 and 2, above. Thus, the previously optimized ALD growth conditions for ALD $Al_2O_3$ growth on Al were also optimal for ALD $Al_2O_3$ growth on Fe.

Figure 12:
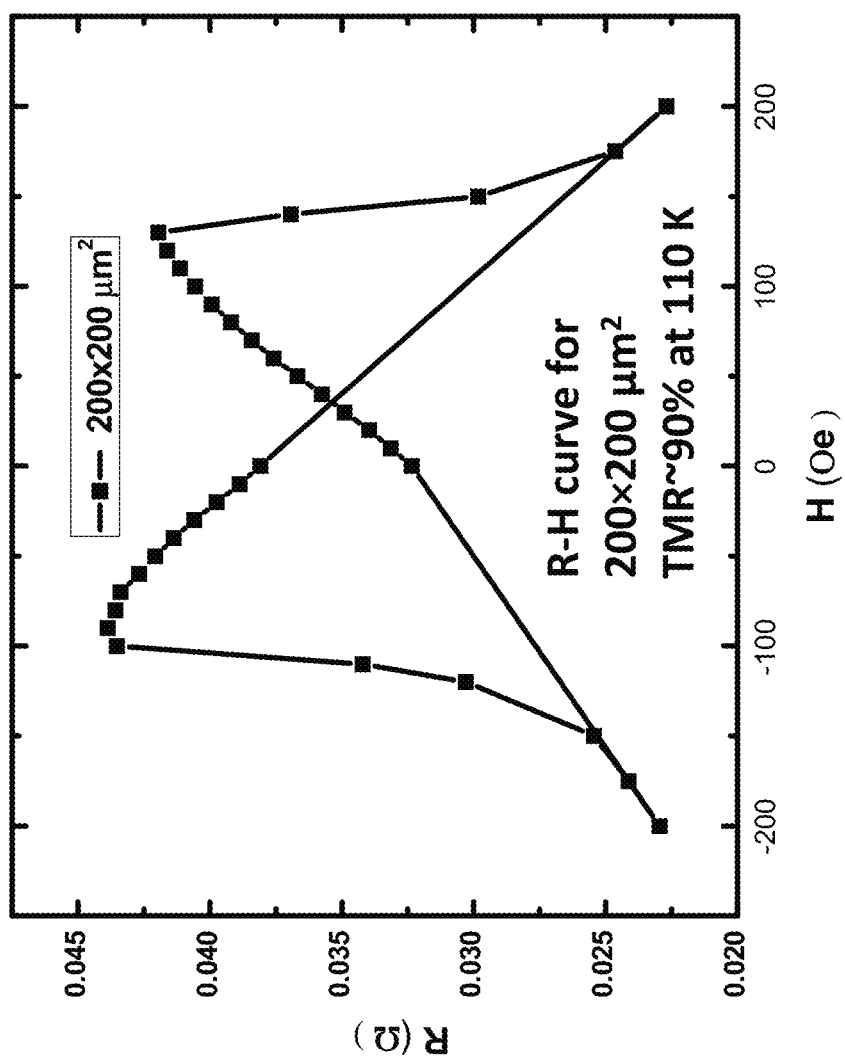
FIG. 12 shows the results of a tunneling magnetoresistance (TMR) measurement conducted on a Fe/ALD-$Al_2O_3$/Fe MTJ according to an illustrative embodiment.

Finally, TMR measurements on the Fe/ALD-$Al_2O_3$/Fe MJTs are shown in FIG. 12, revealing a TMR of up to 90% at 110 K.

Conclusions

In conclusion, this Example reports the first success in growth of atomically thin (0.12-0.6 nm in thickness), low-defect $Al_2O_3$ tunnel barriers through atomic layer deposition directly on ferromagnetic Fe electrode. In situ STS studies reveal high tunnel barrier height up to 1.25 eV can be obtained on 0.12 nm thick ALD $Al_2O_3$ tunnel barriers directly on ferromagnetic Fe electrodes. This value is more than twice of that of the thermal $AlO_x$ tunnel barriers. This indicates a significantly lower defect concentration can be obtained in the ALD grown tunnel barriers, in addition to an order of magnitude reduction in the tunnel barrier thickness. Although an Al wetting layer may provide a slightly better nucleation surface for the ALD $Al_2O_3$ tunnel barriers as reflected in up to ~15% improvement in the tunnel barrier height, it has been found that the wetting layer is not necessary. This observation is supported by the density function simulation of the hydroxylation of Fe with a $H_2O$ pulse before ALD $Al_2O_3$ tunnel barrier growth proceeds. Therefore, this work removes a fundamental roadblock towards achieving MTJs with atomically thin, defect-free dielectric tunnel barriers.

Example 4

This Example shows that high quality $Al_2O_3$ tunnel barriers may be formed using the present methods even on rough surfaces, such as surfaces which exhibit a roughness similar to that of pre-processed circuits.

Experimental

To create structures on the substrate and simulate surface non-uniformity/roughness, e.g., from additional layers of devices stacked on one another, Nb (~150 nm) was DC magnetron sputtered onto a Si wafer and then etched into a pattern using reactive ion etching (RIE). Afterwards an insulating spacer layer of $SiO_2$ (~200 nm) was deposited followed by a layer of Au (~50 nm), both via electron beam. This Au layer serves as an electrical contact for mounting the sample on the STM stage so that the sample can be held at various bias voltages. To monitor how the RMS roughness (i.e. the standard deviation of the surface height) changed as more layers were added on, the samples were analyzed using a Witech Alpha300 atomic force microscope (AFM) system. These AFM scans were done under contact mode over a 5×5 μm² area on top of the Nb structure.

Once this substrate was prepared, it was placed in the in situ ALD deposition and sputtering system using in the Examples, above. First, Nb (~50 nm) was deposited, followed by a deposition of Fe (~20 nm) to simulate the bottom half of an MTJ. Wetting layers of Al, having thicknesses from 0 nm to 7 nm were used. Then the sample was transferred in situ to the ALD chamber, where it was heated via blackbody radiation from the chamber walls (which were heated via thermal wraps external to the chamber) for ~15 minutes. Once the sample had reached ~190° C. a pulse of deionized water was let into the chamber, followed by a vacuum purge cycle, then a pulse of trimethylaluminum (TMA) entered the chamber, again followed by a vacuum purge.

As discussed above, pulsing a small amount of deionized water onto the surface at these temperatures saturates the sample surface with OH groups needed for the TMA to bond to the surface. As the TMA interacts with the surface, it consumes nearly all the adsorbed OH forming amorphous $Al_2O_3$. When this process occurs one time it is referred to as one ALD cycle and produces ~1.1-1.2 Å/cycle. This ALD process is self-limiting since once the adsorbed OH has been exhausted no further $Al_2O_3$ is able to form.

Lastly, the sample was transferred from the ALD chamber to the sputtering chamber where it was allowed to cool before it was transferred into the UHV STM chamber for analysis. Using a RHK UHV350 system and a camera to assure that the tip approached the area on the substrate where the Nb structures were located; STM dI/dV spectroscopy was carried out on the structured areas of the sample. dI/dV spectrum data was analyzed as described above. Through collecting multiple spectra (~100 at different locations on the Nb structure) the average barrier height and the ALD coverage were calculated.

Results

Figure 13:
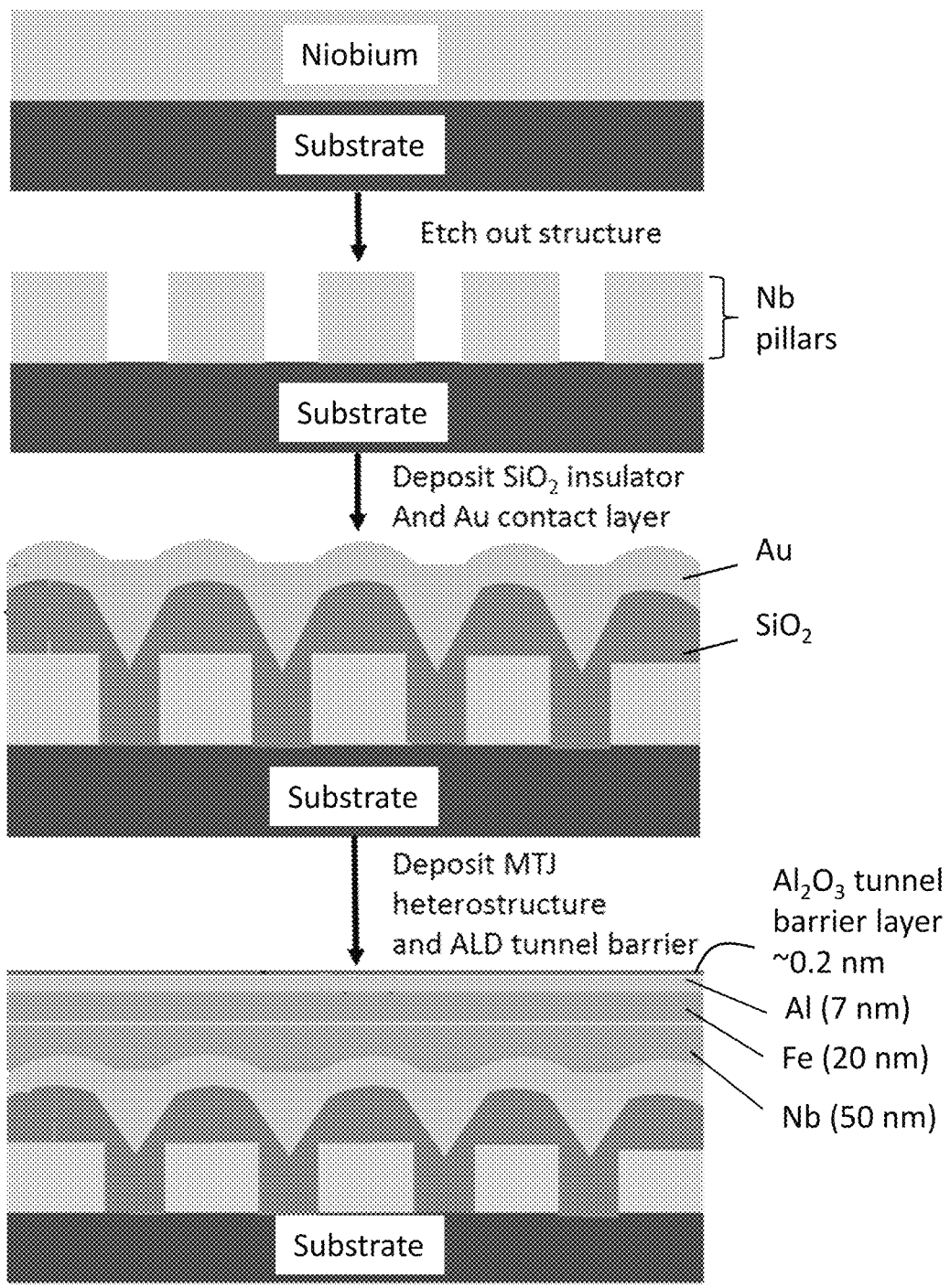
FIG. 13 is a schematic illustration of the formation of a metal (Nb/Fe/Al)-insulator ($Al_2O_3$) multilayer structure fabricated on a surface having features to simulate the rough surface of a pre-processed circuit.

FIG. 13 is a schematic showing formation of the multilayer structure studied in this Example. Etching the Nb layer into pillars simulates an underlying integrated circuit, which would normally have an insulating spacer layer (normally several hundred nanometers thick) layered on top of it to isolate this circuit from the ones above it. After the substrate was fully prepared, a $Nb/Fe/Al/Al_2O_3$ MI layer was fabricated on top of the $Au/SiO_2$ spacer layer for analysis. The Al layer was the wetting layer formed on the metal Nb/Fe layer.

Figure 14:
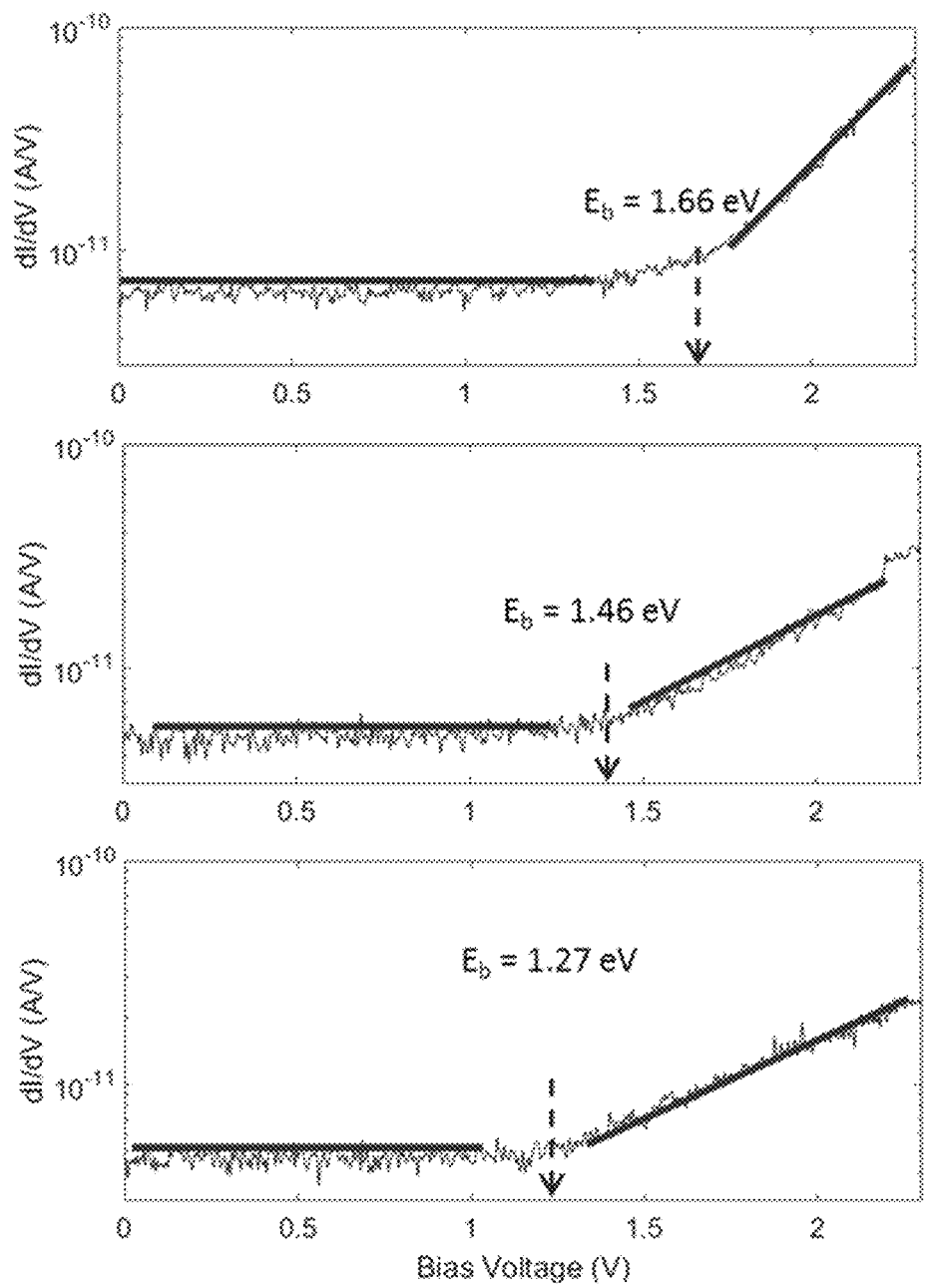
FIG. 14 shows representative dI/dV spectra for metal-insulator multilayer structures formed on a flat Si surface (top), a surface such as that shown in the bottom panel of FIG. 13 (middle), and a surface such as that shown in the bottom panel of FIG. 13 but which includes additional roughness due to the presence of unremoved photoresist material (bottom).

To get a sense of what condition the surface was in before fabricating the MI layer, the roughness was measured before and after the deposition of the spacer layer (data not shown). Roughness measurements for the Nb structure produced an RMS roughness of (~1.6 nm while the same measurement after depositing the spacer $SiO_2$/Au layer resulted in a roughness of ~2.3 nm, meaning that some small amount of roughness is introduced during deposition of this spacer layer. In an industry setting, this added roughness could be reduced through mechanical polishing or similar techniques. Lastly, the photoresist used to define the Nb structures could not be removed from one of the samples due to a processing error. This sample was used as a worst-case scenario for surface roughness, providing an extreme value of ~15.1 nm. By fabricating an MI layer on this surface, ALD-growth on an extremely rough surface could be investigated.

dI/dV spectra were taken over a region having many winding pieces so as to more accurately represent an integrated circuit having a high density of features. As a baseline of comparison, previous STM data measured from a sample made up of Nb/Fe/Al (7 nm)/$Al_2O_3$ (1 cycle) was used which had been fabricated on a flat Si substrate. This control sample represents the optimal conditions of tunnel barrier layer fabrication. A representative spectrum of the control sample is shown in the top panel of FIG. 14 with a relatively high $E_b$ of 1.66 eV. A similar representative dI/dV spectrum for the tunnel barrier layer fabricated on the raised Nb structure (i.e., bottom panel of FIG. 13) is shown in FIG. 14 (middle panel) with an $E_b$~1.46 eV. For the extra-rough, "worst-case scenario" substrate, spectra with lower $E_b$ values were seen, such as that shown in FIG. 14 (bottom panel), with an $E_b$ value of ~1.27 eV. The complied results are shown in Table 1 below. The "highly rough structured Nb" corresponds to the "worst-case scenario" substrate.

TABLE 1

Complied Results.

|  | Flat Si substrate | Structured Nb | Highly Rough Structured Nb |
|---|---|---|---|
| Barrier Height (eV) | 1.631 ± 0.029 | 1.507 ± 0.033 | 1.407 ± 0.034 |
| ALD Coverage (%) | 96.0 ± 2.0 | 93.0 ± 2.6 | 84.0 ± 3.7 |

CONCLUSIONS

Although the tunnel barrier quality does decrease for rougher surfaces (most likely due to the introduction of defects caused by the roughened surface which affects OH nucleation and therefore $Al_2O_3$ nucleation), it is remarkable that even on rough surfaces, high quality $Al_2O_3$ barriers may be formed using the present methods.

REFERENCES FOR EXAMPLE 1

[1] L. A. Abelson and G. L. Kerber, "Superconductor integrated circuit fabrication technology," *Proceedings of the IEEE*, vol. 92, pp. 1517-1533, 2004.

[2] A. W. Kleinsasser, R. E. Miller, and W. H. Mallison, "Dependence of critical current density on oxygen exposure in Nb—AlO/sub x/-Nb tunnel junctions," *Applied Superconductivity, IEEE Transactions on*, vol. 5, pp. 26-30, 1995.

[3] B. Seeber, *Handbook of applied superconductivity* vol. 2: CRC press, 1998.

[4] R. McDermott, "Materials origins of decoherence in superconducting qubits," *Applied Superconductivity, IEEE Transactions on*, vol. 19, pp. 2-13, 2009.

[5] S. M. George, "Atomic Layer Deposition: An Overview," *Chemical Reviews*, vol. 110, pp. 111-131, 2010 Jan. 13 2009.

[6] V. Miikkulainen, M. Leskelä, M. Ritala, and R. L. Puurunen, "Crystallinity of inorganic films grown by atomic layer deposition: Overview and general trends," *Journal of Applied Physics*, vol. 113, p. 021301, 2013.

[7] C. Rigetti, J. M. Gambetta, S. Poletto, B. Plourde, J. M. Chow, A. Córcoles, et al., "Superconducting qubit in a waveguide cavity with a coherence time approaching 0.1 ms," *Physical Review B*, vol. 86, p. 100506, 2012.

[8] M. Khalil, M. Stoutimore, S. Gladchenko, A. Holder, C. Musgrave, A. Kozen, et al., "Evidence for hydrogen two-level systems in atomic layer deposition oxides," *Applied Physics Letters*, vol. 103, p. 162601, 2013.

[9] K. Kukli, M. Ritala, T. Pilvi, T. Aaltonen, J. Aarik, M. Lautala, et al., "Atomic layer deposition rate, phase composition and performance of HfO2 films on noble metal and alkoxylated silicon substrates," *Materials Science and Engineering B*, vol. 118, pp. 112-116, 2005.

[10] M. Groner, J. Elam, F. Fabreguette, and S. M. George, "Electrical characterization of thin Al 2 O 3 films grown by atomic layer deposition on silicon and various metal substrates," *Thin Solid Films*, vol. 413, pp. 186-197, 2002.

[11] A. J. Elliot, G. Malek, L. Wille, R. Lu, S. Han, J. Z. Wu, et al., "Probing the Nucleation of in Atomic Layer Deposition on Aluminum for Ultrathin Tunneling Barriers in Josephson Junctions," *Applied Superconductivity, IEEE Transactions on*, vol. 23, pp. 1101405-1101405, 2013.

[12] R. Lu, A. J. Elliot, L. Wille, B. Mao, S. Han, J. Z. Wu, et al., "Fabrication of Josephson Junctions Using In Situ Magnetron Sputtering and Atomic Layer Deposition," *Applied Superconductivity, IEEE Transactions on*, vol. 23, pp. 1100705-1100705, 2013.

[13] X. Kang, L. Ying, H. Wang, G. Zhang, W. Peng, X. Kong, et al., "Measurements of tunneling barrier thicknesses for Nb/Al—AlOx/Nb tunnel junctions," *Physica C: Superconductivity*, vol. 503, pp. 29-32, 2014.

[14] G. Kresse and J. Hafner, "<i>Ab initio</i> molecular-dynamics simulation of the liquid-metal-amorphous-semiconductor transition in germanium," *Physical Review B*, vol. 49, pp. 14251-14269, May 15, 1994.

[15] G. Kresse and J. Hafner, "Ab-initio molecular dynamics for liquid metals," *Physical Review B*, vol. 47, pp. 558-561, 1993.

[16] J. Hafner, "Ab-initio simulations of materials using VASP: Density-functional theory and beyond," *Journal of Computational Chemistry*, vol. 29, pp. 2044-2078, 2008.

[17] M. Dion, H. Rydberg, E. Schröder, D. C. Langreth, and B. I. Lundqvist, "Van der Waals Density Functional for General Geometries," *Physical Review Letters*, vol. 92, p. 246401, 2004.

[18] A. J. Elliot, G. A. Malek, R. Lu, S. Han, H. Yu, S. Zhao, et al., "Integrating atomic layer deposition and ultra-high vacuum physical vapor deposition for in situ fabrication of tunnel junctions," *Review of Scientific Instruments*, vol. 85, p. 073904, 2014.

[19] E. Tan, P. Mather, A. Perrella, J. Read, and R. Buhrman, "Oxygen stoichiometry and instability in aluminum oxide tunnel barrier layers," *Physical Review B*, vol. 71, p. 161401, 2005.

[20] P. Mather, A. Perrella, E. Tan, J. Read, and R. Buhrman, "Tunneling spectroscopy studies of treated aluminum oxide tunnel barrier layers," *Applied Physics Letters*, vol. 86, pp. 242504-242504, 2005.

[21] J. M. Martinis, "Superconducting phase qubits," *Quantum Information Processing*, vol. 8, pp. 81-103, 2009.

[22] X. J. Kang, L. L. Ying, H. Wang, G. F. Zhang, W. Peng, X. Y. Kong, et al., "Measurements of tunneling barrier thicknesses for Nb/Al-AlO$_x$/Nb tunnel junctions," *Physica C-Superconductivity and Its Applications*, vol. 503, pp. 29-32, Aug. 15, 2014.

[23] J.-G. J. Zhu and C. Park, "Magnetic tunnel junctions," *Materials Today*, vol. 9, pp. 36-45, 2006.

[24] C. Dietrich, H.-G. Boyen, and B. Koslowski, "Characterization of ultrathin insulating Al2O3 films grown on Nb (110)/sapphire (0001) by tunneling spectroscopy and microscopy," *Journal of applied physics*, vol. 94, pp. 1478-1484, 2003.

[25] N. Magtoto, C. Niu, B. Ekstrom, S. Addepalli, and J. Kelber, "Dielectric breakdown of ultrathin aluminum oxide films induced by scanning tunneling microscopy," *Applied Physics Letters*, vol. 77, pp. 2228-2230, 2000.

[26] W. Rippard, A. Perrella, F. Albert, and R. Buhrman, "Ultrathin aluminum oxide tunnel barriers," *Physical review letters*, vol. 88, p. 046805, 2002.

[27] A. Perrella, W. Rippard, P. Mather, M. Plisch, and R. Buhrman, "Scanning tunneling spectroscopy and ballistic electron emission microscopy studies of aluminum-oxide surfaces," *Physical Review B*, vol. 65, p. 201403, 2002.

[28] P. Mather, "ELECTRONIC STRUCTURE OF OXIDE TUNNEL BARRIERS AND GAAS—FERROMAGNET INTERFACES," Doctor of Philosophy, Cornell University, 2006.

[29] L.-C. Ku and C. Y. Clare, "Decoherence of a Josephson qubit due to coupling to two-level systems," *Physical Review B*, vol. 72, p. 024526, 2005.

[30] K. B. Cooper, M. Steffen, R. McDermott, R. W. Simmonds, S. Oh, D. A. Hite, et al., "Observation of Quantum Oscillations between a Josephson Phase Qubit and a Microscopic Resonator Using Fast Readout," *Physical Review Letters*, vol. 93, pp. 180401-4, 2004.

[31] R. W. Simmonds, K. M. Lang, D. A. Hite, S. Nam, D. P. Pappas, and J. M. Martinis, "Decoherence in Josephson Phase Qubits from Junction Resonators," *Physical Review Letters*, vol. 93, pp. 077003-4, 2004.

[32] Y. Yu, S.-L. Zhu, G. Sun, X. Wen, N. Dong, J. Chen, et al., "Quantum Jumps between Macroscopic Quantum States of a Superconducting Qubit Coupled to a Microscopic Two-Level System," *Physical Review Letters*, vol. 101, pp. 157001-4, 2008.

REFERENCES FOR EXAMPLE 2

[1] S. Long, X. Lian, C. Cagli, X. Cartoixà, R. Rurali, E. Miranda, et al., "Quantum-size effects in hafnium-oxide resistive switching," *Applied Physics Letters*, vol. 102, p. 183505, 2013.

[2] K. Stein, J. Kocis, G. Hueckel, E. Eld, T. Bartush, R. Groves, et al., "High reliability metal insulator metal capacitors for silicon germanium analog applications," in *Bipolar/BiCMOS Circuits and Technology Meeting, 1997. Proceedings of the*, 1997, pp. 191-194.

[3] J. A. Babcock, S. G. Balster, A. Pinto, C. Dirnecker, P. Steinmann, R. Jumpertz, et al., "Analog characteristics of metal-insulator-metal capacitors using PECVD nitride dielectrics," *IEEE Electron Device Letters*, vol. 22, pp. 230-232, 2001.

[4] L. S. Dorneles, D. M. Schaefer, M. Carara, and L. F. Schelp, "The use of Simmons' equation to quantify the insulating barrier parameters in Al/AlOx/Al tunnel junctions," *Applied Physics Letters*, vol. 82, pp. 2832-2834, 2003.

[5] A. W. Kleinsasser, R. E. Miller, and W. H. Mallison, "Dependence of critical current density on oxygen exposure in Nb—AlO/sub x/-Nb tunnel junctions," *Applied Superconductivity, IEEE Transactions on*, vol. 5, pp. 26-30, 1995.

[6] X. Kang, L. Ying, H. Wang, G. Zhang, W. Peng, X. Kong, et al., "Measurements of tunneling barrier thicknesses for Nb/Al—AlO$_x$/Nb tunnel junctions," *Physica C: Superconductivity*, vol. 503, pp. 29-32, 2014.

[7] R. McDermott, "Materials origins of decoherence in superconducting qubits," *Applied Superconductivity, IEEE Transactions on*, vol. 19, pp. 2-13, 2009.

[8] J. M. Martinis, K. Cooper, R. McDermott, M. Steffen, M. Ansmann, K. Osborn, et al., "Decoherence in Josephson qubits from dielectric loss," *Physical Review Letters*, vol. 95, p. 210503, 2005.

[9] E. Tan, P. Mather, A. Perrella, J. Read, and R. Buhrman, "Oxygen stoichiometry and instability in aluminum oxide tunnel barrier layers," *Physical Review B*, vol. 71, p. 161401, 2005.

[10] C. Rigetti, J. M. Gambetta, S. Poletto, B. Plourde, J. M. Chow, A. Córcoles, et al., "Superconducting qubit in a waveguide cavity with a coherence time approaching 0.1 ms," *Physical Review B*, vol. 86, p. 100506, 2012.

[11] V. Miikkulainen, M. Leskela, M. Ritala, and R. L. Puurunen, "Crystallinity of inorganic films grown by atomic layer deposition: Overview and general trends," *Journal of Applied Physics*, vol. 113, p. 021301, 2013.

[12] S. M. George, "Atomic Layer Deposition: An Overview," *Chemical Reviews*, vol. 110, pp. 111-131, 2010 Jan. 13, 2009.

[13] S. D. Elliott, "Atomic-scale simulation of ALD chemistry," *Semiconductor Science and Technology*, vol. 27, p. 074008, 2012.

[14] K. Kukli, M. Ritala, T. Pilvi, T. Aaltonen, J. Aarik, M. Lautala, et al., "Atomic layer deposition rate, phase composition and performance of HfO2 films on noble metal and alkoxylated silicon substrates," *Materials Science and Engineering B*, vol. 118, pp. 112-116, 2005.

[15] M. Groner, J. Elam, F. Fabreguette, and S. M. George, "Electrical characterization of thin Al 2 O 3 films grown by atomic layer deposition on silicon and various metal substrates," *Thin Solid Films*, vol. 413, pp. 186-197, 2002.

[16] A. J. Elliot, G. Malek, L. Wille, R. Lu, S. Han, J. Z. Wu, et al., "Probing the Nucleation of in Atomic Layer Deposition on Aluminum for Ultrathin Tunneling Barriers in Josephson Junctions," *Applied Superconductivity, IEEE Transactions on*, vol. 23, pp. 1101405-1101405, 2013.

[17] G. Henkelman and H. Jónsson, "Improved tangent estimate in the nudged elastic band method for finding minimum energy paths and saddle points," *The Journal of Chemical Physics*, vol. 113, pp. 9978-9985, 2000.

[18] J. Hafner, "Ab-initio simulations of materials using VASP: Density-functional theory and beyond," *Journal of Computational Chemistry*, vol. 29, pp. 2044-2078, 2008.

[19] G. Paolo, B. Stefano, B. Nicola, C. Matteo, C. Roberto, C. Carlo, et al., "QUANTUM ESPRESSO: a modular and open-source software project for quantum simulations of materials," *Journal of Physics: Condensed Matter*, vol. 21, p. 395502, 2009.

[20] N. Li, R. Sakidja, and W.-Y. Ching, "Ab initio study on the adsorption mechanism of oxygen on Cr2AlC (0 0 0 1) surface," *Applied Surface Science*, vol. 315, pp. 45-54, 2014.

[21] C. C. Dharmawardhana, R. Sakidja, S. Aryal, and W. Y. Ching, "In search of zero thermal expansion anisotropy in Mo5Si3 by strategic alloying," *Journal of Alloys and Compounds*, vol. 620, pp. 427-433, 2015.

[22] Q. Liu, Y. Gong, J. S. Wilt, R. Sakidja, and J. Wu, "Synchronous growth of AB-stacked bilayer graphene on Cu by simply controlling hydrogen pressure in CVD process," *Carbon*, vol. 93, pp. 199-206, 2015.

[23] A. J. Elliot, G. A. Malek, R. Lu, S. Han, H. Yu, S. Zhao, et al., "Integrating atomic layer deposition and ultra-high vacuum physical vapor deposition for in situ fabrication of tunnel junctions," *Review of Scientific Instruments*, vol. 85, p. 073904, 2014.

[24] S. Gieraltowska, L. Wachnicki, B. S. Witkowski, R. Mroczynski, P. Dluzewski, and M. Godlewski, "Characterization of dielectric layers grown at low temperature by atomic layer deposition," *Thin Solid Films*, vol. 577, pp. 97-102, 2015.

[25] C. Lanthony, J. M. Ducéré, M. D. Rouhani, A. Hemeryck, A. Estève, and C. Rossi, "On the early stage of aluminum oxidation: An extraction mechanism via oxygen cooperation," *The Journal of Chemical Physics*, vol. 137, p. 094707, 2012.

[26] T. Weckman and K. Laasonen, "First principles study of the atomic layer deposition of alumina by TMA-H 2 O-process," *Physical Chemistry Chemical Physics*, vol. 17, pp. 17322-17334, 2015.

[27] M. D. Halls and K. Raghavachari, "Atomic Layer Deposition Growth Reactions of Al2O3 on Si(100)−2×1," *The Journal of Physical Chemistry B*, vol. 108, pp. 4058-4062, 2004 Apr. 1, 2004.

[28] A. C. Dillon, A. W. Ott, J. D. Way, and S. M. George, "Surface chemistry of Al 2 O 3 deposition using Al(CH 3) 3 and H 2O in a binary reaction sequence," *Surface Science*, vol. 322, pp. 230-242, 1995.

[29] R. M. Feenstra, J. Lee, M. Kang, G. Meyer, and K. Rieder, "Band gap of the Ge (111) c (2×8) surface by scanning tunneling spectroscopy," *Physical Review B*, vol. 73, p. 035310, 2006.

[30] P. Mather, A. Perrella, E. Tan, J. Read, and R. Buhrman, "Tunneling spectroscopy studies of treated aluminum oxide tunnel barrier layers," *Applied Physics Letters*, vol. 86, pp. 242504-242504, 2005.

[31] J.-G. Zhu and C. Park, "Magnetic tunnel junctions," *Materials Today*, vol. 9, pp. 36-45, November 2006.

[32] P. Mather, "ELECTRONIC STRUCTURE OF OXIDE TUNNEL BARRIERS AND GAAS—FERROMAGNET INTERFACES," Doctor of Philosophy, Cornell University, 2006.

[33] K. Horikiri, M. Morizumi, and K. Shiiki, "Estimation of oxidation states of AlO x barriers in a tunneling junction by inelastic electron tunneling spectroscopy," *Thin Solid Films*, vol. 517, pp. 5576-5579, 2009.

[34] N. Magtoto, C. Niu, B. Ekstrom, S. Addepalli, and J. Kelber, "Dielectric breakdown of ultrathin aluminum oxide films induced by scanning tunneling microscopy," *Applied Physics Letters*, vol. 77, pp. 2228-2230, 2000.

[35] W. Rippard, A. Perrella, F. Albert, and R. Buhrman, "Ultrathin aluminum oxide tunnel barriers," *Physical review letters*, vol. 88, p. 046805, 2002.

[36] A. Perrella, W. Rippard, P. Mather, M. Plisch, and R. Buhrman, "Scanning tunneling spectroscopy and ballistic electron emission microscopy studies of aluminum-oxide surfaces," *Physical Review B*, vol. 65, p. 201403, 2002.

[37] C. Dietrich, H.-G. Boyen, and B. Koslowski, "Characterization of ultrathin insulating Al2O3 films grown on Nb (110)/sapphire (0001) by tunneling spectroscopy and microscopy," *Journal of applied physics*, vol. 94, pp. 1478-1484, 2003.

REFERENCES FOR EXAMPLE 3

1. J.-G. J. Zhu and C. Park, "Magnetic tunnel junctions", *Materials Today* 9 (11), 36-45 (2006).
2. C. Chappert, A. Fert and F. N. Van Dau, "The emergence of spin electronics in data storage", *Nature materials* 6 (11), 813 (2007).
3. I. utić, J. Fabian and S. D. Sarma, "Spintronics: Fundamentals and applications", *Reviews of modern physics* 76 (2), 323 (2004).
4. A. Hirohata and K. Takanashi, "Future perspectives for spintronic devices", *Journal of Physics D: Applied Physics* 47 (19), 193001 (2014).
5. S. Yuasa, T. Nagahama, A. Fukushima, Y. Suzuki and K. Ando, "Giant room-temperature magnetoresistance in single-crystal Fe/MgO/Fe magnetic tunnel junctions", *Nature materials* 3 (12), 868-871 (2004).
6. D. Wang, C. Nordman, J. M. Daughton, Z. Qian and J. Fink, "70% TMR at room temperature for SDT sandwich junctions with CoFeB as free and reference layers", *Magnetics, IEEE Transactions on* 40 (4), 2269-2271 (2004).
7. T. Miyazaki and N. Tezuka, "Giant magnetic tunneling effect in Fe/Al$_2$O$_3$/Fe junction", *Journal of Magnetism and Magnetic Materials* 139 (3), L231-L234 (1995).
8. J. S. Moodera, L. R. Kinder, T. M. Wong and R. Meservey, "Large magnetoresistance at room temperature in ferromagnetic thin film tunnel junctions", *Physical review letters* 74 (16), 3273 (1995).
9. S. S. Parkin, C. Kaiser, A. Panchula, P. M. Rice, B. Hughes, M. Samant and S.-H. Yang, "Giant tunnelling magnetoresistance at room temperature with MgO (100) tunnel barriers", *Nature materials* 3 (12), 862-867 (2004).
10. S. Yuasa, Y. Suzuki, T. Katayama and K. Ando, "Characterization of growth and crystallization processes in CoFeB/MgO/CoFeB magnetic tunnel junction structure by reflective high-energy electron diffraction", *Applied Physics Letters* 87 (24), 242503 (2005).
11. X. Liu and J. Shi, "Magnetic tunnel junctions with Al2O3 tunnel barriers prepared by atomic layer deposition", *Applied Physics Letters* 102 (20), 202401 (2013).
12. S. Fabretti, R. Zierold, K. Nielsch, C. Voigt, C. Ronning, P. Peretzki, M. Seibt and A. Thomas, "Temperature and bias-voltage dependence of atomic-layer-deposited HfO2-based magnetic tunnel junctions", *Applied Physics Letters* 105 (13), 132405 (2014).
13. R. Mantovan, S. Vangelista, B. Kutrzeba-Kotowska, A. Lamperti, N. Manca, L. Pellegrino and M. Fanciulli, "Fe 3-δO 4/MgO/Co magnetic tunnel junctions synthesized by full in situ atomic layer and chemical vapour deposition", *Journal of Physics D: Applied Physics* 47 (10), 102002 (2014).
14. R. Mantovan, S. Vangelista, B. Kutrzeba-Kotowska, S. Cocco, A. Lamperti, G. Tallarida, D. Mameli and M. Fanciulli, "Synthesis of magnetic tunnel junctions with full in situ atomic layer and chemical vapor deposition processes", *Thin solid films* 520 (14), 4820-4822 (2012).
15. S. Mitani, T. Moriyama and K. Takanashi, "Fe/MgO/FeCo (100) epitaxial magnetic tunnel junctions prepared by using in situ plasma oxidation", *Journal of Applied Physics* 93 (10), 8041-8043 (2003).
16. T. Kiyomura, Y. Maruo and M. Gomi, "Electrical properties of MgO insulating layers in spin-dependent tunneling junctions using Fe 3 O 4", *Journal of Applied Physics* 88 (8), 4768-4771 (2000).
17. J. S. Wilt, R. Sakidja, R. Goul and J. Z. Wu, "The effect of an interfacial layer on electron tunneling through atomically-thin Al2O3 tunnel barriers", *ACS Applied Materials & Interfaces* (2017).
18. J. Wilt, Y. Gong, M. Gong, F. Su, H. Xu, R. Sakidja, A. Elliot, R. Lu, S. Zhao and S. Han, "Atomically Thin Al 2 O 3 Films for Tunnel Junctions", *Physical Review Applied* 7 (6), 064022 (2017).
19. J. Acharya, J. Wilt, B. Liu and J. Wu, "Probing the Dielectric Properties of Ultrathin Al/Al$_2$O$_3$/Al Trilayers Fabricated Using in Situ Sputtering and Atomic Layer Deposition", *ACS Applied Materials & Interfaces* 10 (3), 3112-3120 (2018).
20. K. Komagaki, M. Hattori, K. Noma, H. Kanai, K. Kobayashi, Y. Uehara, M. Tsunoda and M. Takahashi, "Influence of diffused boron into MgO barrier on pinhole creation in CoFeB/MgO/CoFeB magnetic tunnel junctions", *IEEE Transactions on Magnetics* 45 (10), 3453-3456 (2009).
21. Z. Bai, L. Shen, Q. Wu, M. Zeng, J.-S. Wang, G. Han and Y. P. Feng, "Boron diffusion induced symmetry reduction and scattering in CoFeB/MgO/CoFeB magnetic tunnel junctions", *Physical Review B* 87 (1), 014114 (2013).
22. A. K. Rumaiz, J. C. Woicik, W. G. Wang, J. Jordan-Sweet, G. H. Jaffari, C. Ni, J. Q. Xiao and C. L. Chien, "Effects of annealing on the local structure of Fe and Co in CoFeB/MgO/CoFeB tunnel junctions: An extended x-ray-absorption fine structure study", *Applied Physics Letters* 96 (11), 112502 (2010).
23. Y. Jang, C. Nam, K.-S. Lee, B. Cho, Y. Cho, K.-S. Kim and K. Kim, "Variation in the properties of the interface in a Co Fe B/Mg O/Co Fe B tunnel junction during thermal annealing", *Applied Physics Letters* 91 (10), 102104 (2007).
24. Y. Ke, K. Xia and H. Guo, "Oxygen-vacancy-induced diffusive scattering in Fe/MgO/Fe magnetic tunnel junctions", *Physical review letters* 105 (23), 236801 (2010).
25. P. G. Mather, A. C. Perrella, E. Tan, J. C. Read and R. A. Buhrman, "Tunneling spectroscopy studies of treated aluminum oxide tunnel barrier layers", *Applied Physics Letters* 86 (24), 242504 (2005).
26. W. H. Rippard, A. C. Perrella, F. J. Albert and R. A. Buhrman, "Ultrathin Aluminum Oxide Tunnel Barriers", *Physical Review Letters* 88 (4), 046805 (2002).
27. A. J. Elliot, G. Malek, L. Wille, R. Lu, S. Han, J. Z. Wu, J. Talvacchio and R. M. Lewis, "Probing the Nucleation of in Atomic Layer Deposition on Aluminum for Ultrathin Tunneling Barriers in Josephson Junctions", *Applied Superconductivity, IEEE Transactions on* 23 (3), 1101405-1101405 (2013).
28. A. J. Elliot, G. A. Malek, R. Lu, S. Han, H. Yu, S. Zhao and J. Z. Wu, "Integrating atomic layer deposition and ultra-high vacuum physical vapor deposition for in situ fabrication of tunnel junctions", *Review of Scientific Instruments* 85 (7), 073904 (2014).
29. S. Yuasa and D. D. Djayaprawira, "Giant tunnel magnetoresistance in magnetic tunnel junctions with a crystalline MgO (0 0 1) barrier", *Journal of Physics D: Applied Physics* 40 (21), R337 (2007).
30. J. Hafner, "Ab-initio simulations of materials using VASP: Density-functional theory and beyond", *Journal of Computational Chemistry* 29 (13), 2044-2078 (2008).
31. H. K. Mao, W. A. Bassett and T. Takahashi, "Effect of Pressure on Crystal Structure and Lattice Parameters of Iron up to 300 kbar", *Journal of Applied Physics* 38 (1), 272-276 (1967).
32. P. Süle, D. Kaptás, L. Bujdosó, Z. E. Horváth, A. Nakanishi and J. Balogh, "Chemical mixing at "Al on Fe" and "Fe on Al" interfaces", *Journal of Applied Physics* 118 (13), 135305 (2015).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention.

The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for forming a tunnel barrier layer for a multilayer structure, the method comprising:
   (a) exposing a surface of a material, the surface free of oxygen, to an initial water pulse for a pulse time and at a pulse temperature, the pulse time and pulse temperature selected to maximize hydroxylation of the surface; and
   (b) exposing the hydroxylated surface to alternating, separated pulses of precursors under conditions to induce reactions between the hydroxylated surface and the precursors to form a tunnel barrier layer on the surface of the material via atomic layer deposition (ALD), the tunnel barrier layer having an average thickness of no more than 1 nm and being formed without an intervening interfacial layer between the tunnel barrier layer and the surface of the material.

2. The method of claim 1, wherein the material is a wetting layer.

3. The method of claim 2, wherein the wetting layer has an average thickness of at least 5 nm.

4. The method of claim 2, wherein the wetting layer is formed directly on a layer of a metal, a layer of a ferromagnetic material, or a layer of a semiconductor and the method further comprises forming another layer of the metal, another layer of the ferromagnetic material, or another layer of the semiconductor directly on the tunnel barrier layer.

5. The method of claim 1, wherein the material is a ferromagnetic material and the method further comprises forming another layer of the ferromagnetic material directly on the tunnel barrier layer.

6. The method of claim 5, wherein the ferromagnetic material is Fe having a single-crystalline Fe(100) surface, a single-crystalline Fe(110) surface, or a polycrystalline Fe(100)/Fe(110) surface.

7. The method of claim 1, wherein the pulse time and the pulse temperature are selected to provide an ALD coverage of at least about 85% after 1 ALD cycle.

8. The method of claim 1, wherein the pulse time is selected to provide no more than a monolayer of adsorbed water on the surface.

9. The method of claim 8, wherein the pulse time is in the range of from about 1 second to about 3 seconds.

10. The method of claim 1, wherein the pulse temperature is in the range of from about 150° C. to about 190° C.

11. The method of claim 1, wherein the tunnel barrier layer has an average thickness corresponding to one ALD cycle.

12. The method of claim 1, wherein steps (a) and (b) are carried out in an ALD chamber which has been preheated prior to carrying out steps (a) and (b).

13. The method of claim 1, further comprising, prior to step (a), dynamically heating the surface at a heating rate and for a heating time to achieve the selected pulse temperature.

14. The method of claim 13, wherein the heating time is no greater than about 30 minutes.

15. The method of claim 1, wherein the tunnel barrier layer is composed of $Al_2O_3$ or MgO and is characterized by an average tunnel barrier height $E_b$ of at least 1.2 eV.

16. The method of claim 1, wherein the tunnel barrier layer is characterized by an average tunnel barrier height $E_b$ which is the same over an average thickness range of from 0.12 to 1 nm.

17. The method of claim 1, wherein the pulse time is in the range of from about 1 second to about 3 seconds and the pulse temperature is in the range of from about 150° C. to about 190° C.

18. The method of claim 17, further comprising, prior to step (a), dynamically heating the surface at a heating rate and for a heating time of no greater than about 30 minutes to achieve the selected pulse temperature.

* * * * *

UNITED STATES PATENT AND TRADEMARK OFFICE
CERTIFICATE OF CORRECTION

PATENT NO. : 10,593,871 B2  
APPLICATION NO. : 15/985979  
DATED : March 17, 2020  
INVENTOR(S) : Judy Z. Wu et al.

Page 1 of 1

It is certified that error appears in the above-identified patent and that said Letters Patent is hereby corrected as shown below:

In the Specification

Column 3, Lines 16-17:
Delete the phrase "a few A thick" and replace with --a few Å thick--.

Column 10, Line 23:
Delete the phrase "chosen over I-V or (dI/dV)/(IN) fit methods" and replace with --chosen over I-V or (dI/dV)/(I/V) fit methods--.

Column 11, Line 60:
Delete the phrase "dissociation into 0 and Wads could lead" and replace with --dissociation into O and $H^+_{ads}$ could lead--.

Column 13, Line 64:
Delete the phrase "$G_n = (R_nA)^{-1} \partial J_c$," and replace with --$G_n = (R_nA)^{-1} \propto J_c$,--.

Signed and Sealed this  
Sixteenth Day of June, 2020

Andrei Iancu  
*Director of the United States Patent and Trademark Office*